US009324126B2

(12) United States Patent
Howard

(10) Patent No.: US 9,324,126 B2
(45) Date of Patent: Apr. 26, 2016

(54) AUTOMATED LATENCY MANAGEMENT AND CROSS-COMMUNICATION EXCHANGE CONVERSION

(71) Applicant: Massively Parallel Technologies, Inc., Boulder, CO (US)

(72) Inventor: Kevin D. Howard, Tempe, AZ (US)

(73) Assignee: Massively Parallel Technologies, Inc., Boulder, CO (US)

( * ) Notice: Subject to any disclaimer, the term of this patent is extended or adjusted under 35 U.S.C. 154(b) by 138 days.

(21) Appl. No.: 14/155,325

(22) Filed: Jan. 14, 2014

(65) Prior Publication Data

US 2014/0125683 A1    May 8, 2014

Related U.S. Application Data

(63) Continuation-in-part of application No. 13/490,345, filed on Jun. 6, 2012, now Pat. No. 8,762,946, which is a continuation-in-part of application No. 13/425,136, filed on Mar. 20, 2012, now Pat. No. 8,959,494.

(60) Provisional application No. 61/752,292, filed on Jan. 14, 2013.

(51) Int. Cl.
*G06F 9/44* (2006.01)
*G06F 12/00* (2006.01)
(Continued)

(52) U.S. Cl.
CPC ............. *G06T 1/20* (2013.01); *G06F 9/5016* (2013.01); *G06F 9/54* (2013.01); *G06F 13/1663* (2013.01); *G06F 9/444* (2013.01); *G06F 17/5045* (2013.01)

(58) Field of Classification Search
CPC ..... G06F 8/34; G06F 17/142; G06F 17/5022; G06F 17/504; G06F 17/5045; G06F 13/1663; G06F 13/4221; G06F 8/35; G06F 8/20; G06F 12/1072; G06F 15/17381; G06F 15/17337; G06F 15/16; G06F 15/7867
See application file for complete search history.

(56) References Cited

U.S. PATENT DOCUMENTS 5,430,873 A    7/1995    Abe et al.
5,471,592 A    11/1995   Gove et al.
(Continued)

FOREIGN PATENT DOCUMENTS

WO    2007104158 A1    9/2007

OTHER PUBLICATIONS

David Garlan et al., An Introduction to Software Architecture, Jan. 1994, [Retrieved on Dec. 9, 2015]. Retrieved from the Internet: <URL: https://www.cs.cmu.edu/afs/cs/project/able/ftp/intro_softarch/intro_softarch.pdf> 42 Pages (1-39).*
(Continued)

*Primary Examiner* — Thuy Dao
*Assistant Examiner* — Anibal Rivera
(74) *Attorney, Agent, or Firm* — Lathrop & Gage LLP

(57) ABSTRACT

A system and method for communication in a parallel computing system is applied to a system having multiple processing units, each processing unit including processor(s), memory, and a network interface, where the network interface is adapted to support virtual connections. The memory has at least a portion of a parallel processing application program and a parallel processing operating system. The system has a network fabric between processing units. The method involves identifying need for communication by the first processing unit with a group of processing units, creating virtual connections between the processing units, and transferring data between the first processing units.

3 Claims, 43 Drawing Sheets

(51) Int. Cl.
| | |
|---|---|
| G06F 9/46 | (2006.01) |
| G06T 1/20 | (2006.01) |
| G06F 9/50 | (2006.01) |
| G06F 13/16 | (2006.01) |
| G06F 9/54 | (2006.01) |
| G06F 17/50 | (2006.01) |

(56) References Cited

U.S. PATENT DOCUMENTS

| | | | |
|---|---|---|---|
| 5,583,990 A * | 12/1996 | Birrittella | G06F 15/17337 710/52 |
| 5,774,370 A | 6/1998 | Giomi | |
| 5,784,706 A * | 7/1998 | Oberlin | G06F 12/1072 711/202 |
| 5,892,923 A * | 4/1999 | Yasuda | G06F 15/17381 370/392 |
| 6,201,492 B1 | 3/2001 | Amar et al. | |
| 6,718,533 B1 | 4/2004 | Schneider et al. | |
| 7,162,710 B1 | 1/2007 | Edwards et al. | |
| 7,617,484 B1 | 11/2009 | Fienbilt et al. | |
| 8,527,966 B2 | 9/2013 | Hosokawa et al. | |
| 8,762,946 B2 | 6/2014 | Howard | |
| 2003/0079188 A1 | 4/2003 | McConaghy et al. | |
| 2003/0140332 A1 | 7/2003 | Norton et al. | |
| 2001/0149968 | 8/2003 | Imai | |
| 2003/0216901 A1 | 11/2003 | Schaumont et al. | |
| 2004/0015775 A1 | 1/2004 | Simske et al. | |
| 2005/0223361 A1 | 10/2005 | Belbute | |
| 2006/0015858 A1 | 1/2006 | Tanimoto et al. | |
| 2006/0020949 A1 | 1/2006 | Hoshino et al. | |
| 2006/0095716 A1 * | 5/2006 | Ramesh | G06F 9/30181 712/24 |
| 2006/0136850 A1 | 6/2006 | Corbell, Jr. et al. | |
| 2006/0155526 A1 | 7/2006 | Castillo et al. | |
| 2007/0143578 A1 * | 6/2007 | Horton | G06F 15/16 712/11 |
| 2007/0245303 A1 * | 10/2007 | Demharter | G06F 17/5045 717/109 |
| 2007/0294578 A1 | 12/2007 | Qiao et al. | |
| 2008/0071801 A1 | 3/2008 | Lucco et al. | |
| 2008/0162834 A1 | 7/2008 | Brokenshire et al. | |
| 2008/0263505 A1 | 10/2008 | StClair et al. | |
| 2008/0263506 A1 | 10/2008 | Broadfoot et al. | |
| 2008/0307267 A1 | 12/2008 | Chandrasekaran | |
| 2009/0044171 A1 * | 2/2009 | Avadhanula | G06F 8/20 717/105 |
| 2009/0070552 A1 * | 3/2009 | Kanstein | G06F 15/7867 712/29 |
| 2009/0077483 A9 | 3/2009 | Howard et al. | |
| 2009/0083741 A1 * | 3/2009 | Krishnan | G06F 9/5016 718/102 |
| 2009/0119484 A1 | 5/2009 | Mohl et al. | |
| 2009/0241106 A1 | 9/2009 | Andersen | |
| 2009/0265696 A1 | 10/2009 | Grice | |
| 2010/0153658 A1 * | 6/2010 | Duncan | G06F 13/1663 711/145 |
| 2010/0153908 A1 | 6/2010 | Sarkar et al. | |
| 2011/0067009 A1 | 3/2011 | Hosokawa et al. | |
| 2011/0161926 A1 * | 6/2011 | Cruise | G06F 8/35 717/113 |
| 2011/0283095 A1 | 11/2011 | Hall et al. | |
| 2012/0066664 A1 | 3/2012 | Howard | |
| 2012/0101929 A1 | 4/2012 | Howard | |
| 2013/0254743 A1 | 9/2013 | Howard | |
| 2013/0290935 A1 | 10/2013 | Hosokawa et al. | |
| 2013/0311968 A1 | 11/2013 | Sharma | |
| 2013/0332777 A1 | 12/2013 | Howard | |
| 2013/0332903 A1 | 12/2013 | Howard | |
| 2014/0109049 A1 | 4/2014 | Kaulgud et al. | |

OTHER PUBLICATIONS

Matthew Hause et al., Building Bridges Between Systems and Software with SysML and UML, 2008, [Retrieved on Dec. 9, 2015]. Retrieved from the internet: <URL: http://www.omgsysml.org/Building_SE-SW_Bridges%20.pdf> 15 Pages (1-15).*
U.S. Appl. No. 13/425,136 Notice of Allowance issued Oct. 8, 2014, 49 pages.
U.S. Appl. No. 14/312,639 Notice of Allowance issued Sep. 12, 2014, 11 pages.
PCT Patent Application PCT/US2013/044818 International Search Report and Written Opinion dated Sep. 13, 2013, 9 pages.
PCT Patent Application PCT/US2013/033125 International Search Report and Written Opinion dated Jun. 27, 2013, 9 pages.
PCT Patent Application PCT/US2013/044573 International Search Report and Written Opinion dated Jul. 22, 2013, 8 pages.
U.S. Appl. No. 13/490,345 select File History dated Aug. 30, 2013 to Feb. 3, 2014, 44 pages.
U.S. Appl. No. 13/425,136 Office Action dated Jun. 17, 2014, 33 pages.
PCT Patent Application PCT/US2014/011546 International Search Report and Written Opinion dated May 30, 2014, 9 pages.

* cited by examiner

| # | Data Intent 950 | # Dimensions | Old 952 Communication Patterns | New 954 Communication Patterns |
|---|---|---|---|---|
| 1 | Parallel I/O | 1 or more | Scatter/gather | Howard All-to-All |
| 2 | Transpose | 2 or more | All-to-all | Howard All-to-All |
| 3 | 1 | 1 or more | MPT Scatter/gather | MPT Scatter/gather |
| 4 | Field-like | 1 | Left-right | Howard All-to-All |
| 5 | Field-like | 2 or more | All-to-all | Howard All-to-All |
| 6 | Particle-like | 1 | Left-right | Howard All-to-All |
| 7 | Particle-like | 2 or more | Next-n-neighbors | Howard All-to-All |
| 8 | Object-like | 1 | Left-right with strides | Howard All-to-All |
| 9 | Object-like | 2 or more | Next-n-neighbors with strides | Howard All-to-All |
| 10 | N-ary Tree | - | Red-black | MPT Scatter/gather |
| 11 | Search-like | 2 or more | MPT Scatter/gather | MPT Scatter/gather |

Fig. 73

AUTOMATED LATENCY MANAGEMENT AND CROSS-COMMUNICATION EXCHANGE CONVERSION

RELATED APPLICATIONS

The present document claims priority to U.S. Provisional Patent Application 61/752,292, filed 14 Jan. 2013, the contents of which are incorporated herein by reference.

The present document is also a continuation-in-part of U.S. patent application Ser. No. 13/490,345, filed Jun. 6, 2012 which is a continuation-in-part of U.S. patent application Ser. No. 13/425,136, filed 20 Mar. 2012, the contents of which are incorporated herein by reference.

FIELD

The present document relates to the field of communications within a parallel computing system.

BACKGROUND

There are many computing problems that are amenable to parallel processing. In parallel processing on a parallel computing system an overall problem is typically divided into multiple sub-problems, or processes, each of which is then assigned to run on a particular processor of a number of processors, since the processors can then execute in parallel, rather than in serial, the overall problem is solved more quickly than with a single processor. Applications that have been run on parallel processing computer systems include cryptanalysis, weather forecasting, and many kinds of simulations.

In many parallel processing applications, a process running on one processor will need results from another processes running on another processor. For example, if a logic simulation of a microprocessor system is divided into a process simulating a RALU, another simulating a control unit, a third simulating a first level cache of a memory system, and a fourth simulating upper level memory, from time to time the process simulating the RALU may need to receive data from, and send data to, the process simulating the first level cache, and, when the simulated cache scores a "miss", the cache process will need to communicate with the process simulating the upper level memory.

It has been found that rapid, reliable, communications between processors within a parallel computing system is essential to successful execution.

A massively-parallel computer system is one in which there are large numbers of processors, each of which has at least some program and data memory associated with it, typically operating in a multiple-instruction, multiple-data (MIMD), processing model.

In provisional patent application Ser. No. 13/425,136, a parallel computing system is described that is adapted to communicate with "scatter-gather" and "all to all" operations. In the scatter-gather operation, a message is sent from a first processor of the system to other processors of the system; the message either includes data being sent to those processors, or includes a request for the other processors to return specific data to the first processor.

Traditionally, the all-to-all communication exchange uses the binomial-tree multicast model. FIG. 69 illustrates an example of a binomial-tree multicast all-to-all exchange, showing the first of four tree broadcast interactions. Each processing element performs an iteration of the exchange. If "n" is the total number of processing units then it takes "$nlog_2n$" (see: FIG. 1) communication steps to complete. As can be seen in FIG. 69, each communication step consists of a pair of processing units in communication.

It is noted that pair-wise communication is considered safe, as loop-back and other checks, including parity or other checksum checks combined with acknowledgment packets, can be performed on the data to insure that it arrived unchanged, and a retry can be initiated if corruption occurs. Unacknowledged broadcast communications are considered unsafe, since the sending processor may not recognize and correct communication errors.

SUMMARY

A system and method for communication in a parallel computing system is applied to a system having multiple processing units, each processing unit including processor(s), memory, and a network interface, where the network interface is adapted to support virtual connections. The memory has at least a portions of a parallel processing application program and a parallel processing operating system. The system has a network fabric between processing units. The method involves identifying need for communication by the first processing unit with a group of processing units, creating virtual connections between the processing units, and transferring data between the first processing units.

BRIEF DESCRIPTION OF THE DRAWINGS

FIG. 73 is a table indicating a correspondence between traditional data interchange in a parallel processing system, the Howard all-to-all exchange, and the Howard Scatter-Gather operation.

DETAILED DESCRIPTION OF THE EMBODIMENTS

Decomposition

Figure 1:
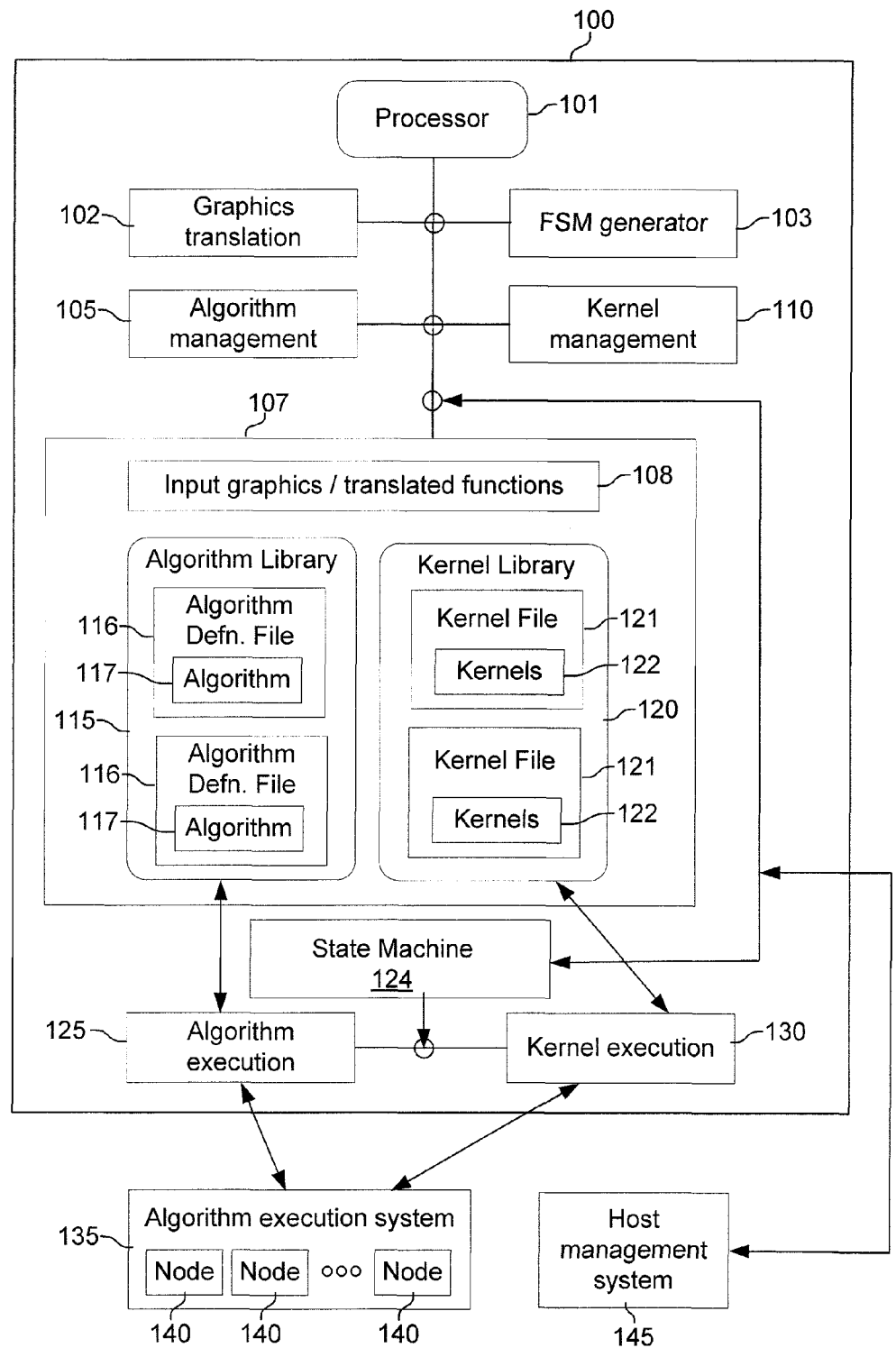
FIG. 1 is a system diagram showing an exemplary computing environment in which a system for decomposing functional data functions.

Traditional models for functional decomposition of algorithms are vague in their definition of lower decomposition levels. In the Yourdon structured model, control transformations decompose into state transition diagrams which represent the real-time aspects of the system. Although control transformations were used by Yourdon, Ward and Millor, and Hatley and Pirbhai to define real-time control transformation events, their definition of control transformation does not include any of the following types of software statements: goto, if-then-else, switch loops, and subroutine calls.

If the transformations decompose from the highest to the lower levels, but the complexity is not constrained by the developer as the functionality decomposes, as in the McCabe model, the amount of control is unconstrained, and it is not clear when the decomposition should end. Furthermore, since the unconstrained decomposition does not inherently simplify the design, it does not actually meet the criteria of mathematical functional decomposition.

To eliminate the above-noted shortcomings of previous decomposition methods, a simple graph, created in accordance with the multiprocessor functional decomposition (MPfd) model described herein, is constrained to a single control structure per decomposition level and exposes all transitions, preparing the graph for translation into a finite state machine (FSM).

Traditionally, FSMs have been used to create compilers and have also been used in sequential circuit design. Being able to use FSMs in general software design and thus in general programming offers huge benefits for general programming including increased software clarity and the ability better combine computer software with computer hardware.

Disclosed herein are a system and method for performing functional decomposition of a software design to generate a computer-executable finite state machine. Initially, the software design is received in a form wherein functions in the software design are repetitively decomposed into (1) data and control transformations. Included between the functions are control flow indicators which have transformation-selection conditions associated therewith. The data transformations and the control transformations are translated into states in the finite state machine. The transformation-selection conditions associated with the control transformations are translated into state transitions in the finite state machine.

Although functional decomposition has long been used to design software, the multiprocessor functional decomposition (MPfd) techniques and methods described herein extend beyond mere design. First, any design created using the presently described MPfd methods can, by definition, be translated directly into a finite state machine (FSM). Since field programmable gate arrays (FPGAs) and graphical processing units (GPUs) use FSMs in their programming, the MPfd is useful in creating not only CPU but GPU and FPGA codes as well. Second, incorrect MPfd structures can be automatically detected and corrected. Third, MPfd techniques incorporate the automatic selection of the pass-by-value or the pass-by-reference data movement model for moving data between functional elements. This allows the presently-described system to combine computer languages like "C" and "C++" with other computer languages like Fortran or Java. Fourth, MPfd elements are annotated with information concerning the use of any data, not just the data type. Using the MPfd model to automatically find task-level and non-task-level parallelism from design, instead of the user finding it within the code, allows separate compute threads to simultaneously process data.

Since a task in the present system is equivalent to one or more data transformations (or simply "transformations") and since a transformation is a state in the present finite state machine (FSM), showing which states can be executed in parallel is equivalent to indicating the task parallelism.

Definitions

For the purpose of this document, the following definitions are supplied to provide guidelines for interpretation of the terms below as used herein:

Function—a software routine, or more simply an algorithm that performs one or more transformations.

Control Kernel—A control kernel is a software routine or function that contains only the following types of computer-language constructs: subroutine calls, looping statements (for, while, do, etc.), decision statements (if-then-else, etc.), and branching statements (goto, jump, continue, exit, etc.).

Process Kernel—A process kernel is a software routine or function that does not contain the following types of computer-language constructs: subroutine calls, looping statements, decision statements, or branching statements. Information is passed to and from a process kernel via RAM.

State Machine—The state machine employed herein is a two-dimensional network which links together all associated control kernels into a single non-language construct that provides for the activation of process kernels in the correct order. The process kernels form the "states" of the state-machine while the activation of those states form the state transition. This eliminates the need for software linker-loaders.

State Machine Interpreter—for the purpose of the present document, a State Machine Interpreter is a method whereby the states and state transitions of a state machine are used as active software, rather than as documentation.

Node—A node is a processing element comprised of a processing core, or processor, memory and communication capability.

Data transformation—A data transformation is a task that accepts data as input and transforms the data to generate output data.

Control transformation—A control transformation evaluates conditions and sends and receives control to/from other control transformations and/or data transformations.

Control bubble—A control bubble is a graphical indicator of a control transformation. A control bubble symbol indicates a structure that performs only transitions and does not perform processing.

Process bubble—A process bubble is a graphical indicator of a data transformation.

Finite state machine—A finite state machine is an executable program constructed from the linear code blocks resulting from transformations, where the transformation-selection conditions are state transitions constructed from the control flow.

Computing Environment

FIG. 1 is an exemplary diagram of the computing environment in which the present system and method operates. As shown in FIG. 1, system 100 includes a processor 101 which executes tasks and programs including a kernel management module 110, an algorithm management module 105, state machine 124, a kernel execution module 130, and an algorithm execution module 125. System 100 further includes storage 107, in which is stored data including libraries 115/120 which respectively store algorithms 117 and kernels 122. Storage 107 may be RAM, or a combination of RAM and other storage such as a disk drive. Module 102 performs a translation of a graphical input functional decomposition diagram 700 (see, e.g., FIG. 7) to corresponding MPfd functions (ultimately, states in a state machine), and stores the translated functions in appropriate libraries in storage area 108. Module 103 generates appropriate FSMs from the translated functions.

System 100 is coupled to a host management system 145, which provides management of system functions, and issues system requests. Algorithm execution module 125 initiates execution of kernels invoked by algorithms that are executed. Algorithm execution system 135 may comprise any computing system with multiple computing nodes 140 which can execute kernels stored in system 100. Management system 145 can be any external client computer system which requests services from the present system 100. These services include requesting that kernels or algorithms psbe added/changed/deleted from a respective library within the current system. In addition, the external client system can request that a kernel/algorithm be executed. It should be noted that the present system is not limited to the specific file names, formats and instructions presented herein.

A kernel is an executable computer program or program segment that contains data transformation/data code, and no program execution control code, where execution control code is any code that can change which code is to be executed next. In the exemplary embodiment described herein, kernels 122 are stored in a kernel library file 121 in kernel library 120.

An algorithm is a state machine that comprises states (kernel invocations) and state transitions (the conditions needed to go from one state to another). References to the "system" in this section refer in general to system 100, and in applicable embodiments, to algorithm management module 105. Each algorithm 117 is kept in an algorithm definition file 116 in algorithm library 115 with a name (Algorithm_Title) that is the concatenation of the organization name, the category name, algorithm name, and user name with a '_' character between each of the names.

Algorithm Definition File with Task Parallelism Example:
StateNumber[(state1, . . . state n), state x, state y, state z)], KernelID(nodeInfo)(InputDatasets)(OutputDatasets)(Transitions)(Loops)

In the above example, the parallel tasks are executed at the same time as "StateNumber".

Functional Decomposition

A control transformation evaluates conditions and sends and receives control. One primary difference between the Yourdon model and the present MPfd model is in how control transformations are handled. MPfd allows a control transformation to contain non-event control items. Non-event control items are conditions that change the sequence of execution of a program (if-then-else, go to, function calls, function returns), and a condition is a regular conditional expression.

Variables used by a control transformation can only be used in a condition; they cannot be transformed into any other value. An Invoke instruction initiates system operation; variables and constants are used in conditions to transition to a control transformation; and a Return instruction gives control back to the control transformation with the name of the returning routine. A control transformation can have only one selection condition per transformation, and there can be, at most, one control transformation per decomposition level.

The MPfd model creates hierarchical finite state machines (HFSM) whose state transitions have conditions and whose states are data transformations and control transformations. Data transformations can always, eventually, be associated with linear code blocks, while control transformations contain only transitions with no associated code blocks.

Data transformations represent the parallelizable portion of the software design. In MPfd designs, there are three data transformation types: associated, unassociated, and ambiguous. These types are concerned with the relationship between an upper-level transformation and its immediate next-level decomposition.

Associated transformations are grouped together and share data and/or control. Unassociated transformations are grouped together but share no data or control. Unassociated transformations can be executed in parallel. This is called task-level parallelization. Ambiguous transformations can always be converted to either associated or unassociated forms.

A data transformation can contain three types of looping structures: pre-work, post-work and recursion. Pre-work means that the loop-ending condition is checked prior to performing the work and is denoted by a downward-pointing solid-loop symbol on a transformation. Post-work means that the loop-ending condition is checked after performing the work and is denoted by an upward-pointing solid-loop symbol on a transformation. Recursion means that the transformation calls itself and is denoted by a downward-pointing dashed-loop symbol on a transformation.

In the Yourdon model, only the control transformation decomposes into a finite state machine (FSM). In an MPfd design, the entire diagram of the current decomposition level is converted into an FSM.

The lowest level of transformation decomposition represents a linear code block. Decomposition ends when a data transformation cannot decompose into a set of data transformations grouped together with a control transformation or when the decomposition results in the same graph as the decomposed transformation.

Mathematics of Functional Decomposition $$y=f(a,b,c,\ldots)= g(h_1(h_2(a,b),c),h_3(d,h_4(e),f),h_n(a,b,c,\ldots)) \quad \text{Equation 1}$$

In the example of Equation 1 above, the "$h_x(\ )$" functions can also be decomposed, and this decomposition can continue. In standard decomposition, there is no specified last decomposition. In an MPfd, the decomposition continues until only a series of function calls depicting the structure of the function remains. A final decomposition then occurs when there are no function calls, and only a single data transformation remains. At that point, the decomposition has progressed to the kernel level, with the non-transformation functions equivalent to control kernels and the transformation-only functions equivalent to process kernels. By its nature, an MPfd forms a disjoint, fully reduced set of functions.

Function Dependencies

Transforming a function into its decomposed equivalent set of functions means hierarchically identifying functions within functions such that the equivalent functionality of the original function is maintained while the complexity of the component functions simplifies. This can be illustrated using the "$g(\ )$" function from Equation 1. The function $g(h_1(h_2(a, b), c), h_3(d, h_4(e)), \ldots h_n(a, b, c, d, e, f))$ uses the various "$h_x(\ )$" functions as its parameters. The "$h_x(\ )$" functions can, thus, be ordered by the "$g(\ )$" function in the same way as variables are ordered within a function. If some or all of the "$h_x(\ )$" functions were also decomposed, they would have the decomposed functions as additional parameters. Unfortunately, the standard decomposition diagram notation does not make this functional ordering fully visible; that is, usually, the ordering is bound in the mathematics of "$g(\ )$".

Figure 2:
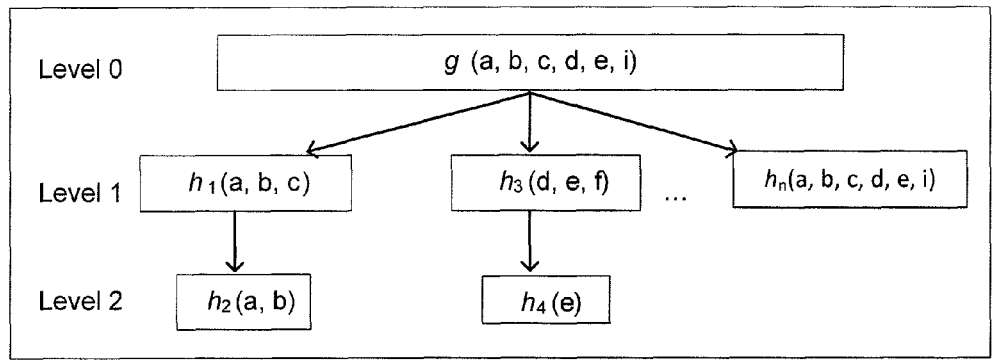
FIG. 2 is a prior art standard functional decomposition diagram.

The standard view of the functional ordering of decomposed functions "$g(\ )$" might give is shown in FIG. 2, which is a diagram showing a standard, prior art, functional decomposition. The function-order arrows (control flow indicators) on the standard functional decomposition diagram of FIG. 2 indicate the calling order of the functions. This calling order comes from a combination of the decomposition level (indicated by the level number shown on the diagram) and the parameter order of the functions as shown in FIG. 2. If the parameters used by some functions are different from those used by some other functions, those disjoint functions can be executed in parallel. The functions that share the same parameters are said to be joint and are executed serially.

In order to create different joint execution streams, in accordance with the present MPfd model, each function in a particular algorithm receives an execution-stream identifier. In the present exemplary embodiment, this execution-stream identifier is represented as a program thread. Graphically illustrated, this MPfd-type decomposition takes the form shown in the diagram of FIG. 3, which shows multiple threads from decomposition of a function with dissimilar parameters. By examining FIG. 3, it can be seen that thread 1 is used to coordinate the parallel execution of threads 2 and 3. In threads 2 and 3, the thread-sharing functions share variables and are linear to each other, but it is clear that threads 2 and 3 do not share data. Since there are no linear dependencies between thread 2 and thread 3 and no shared data, the two threads can be executed simultaneously.

Conditions for Transition

In a standard functional decomposition diagram, the function-order arrows contain no information other than indicating a general relationship. In the present system, a condition is added to the function-order arrows and this additional information can be used to identify additional parallelism. The MPfd control flow indicators each comprise a function-order arrow plus an associated condition. Adding function-calling or transition information to a function-order arrow is a way to graphically depict the circumstances under which a function is called; that is, it shows the underlying logical/mathematical rationale for transitioning to another function. For example, separate threads containing functions with the same parameters can be identified if their transition conditions are different, as shown on FIG. 4, which shows an example of functional decomposition with transition conditions and threads.

Figure 4:
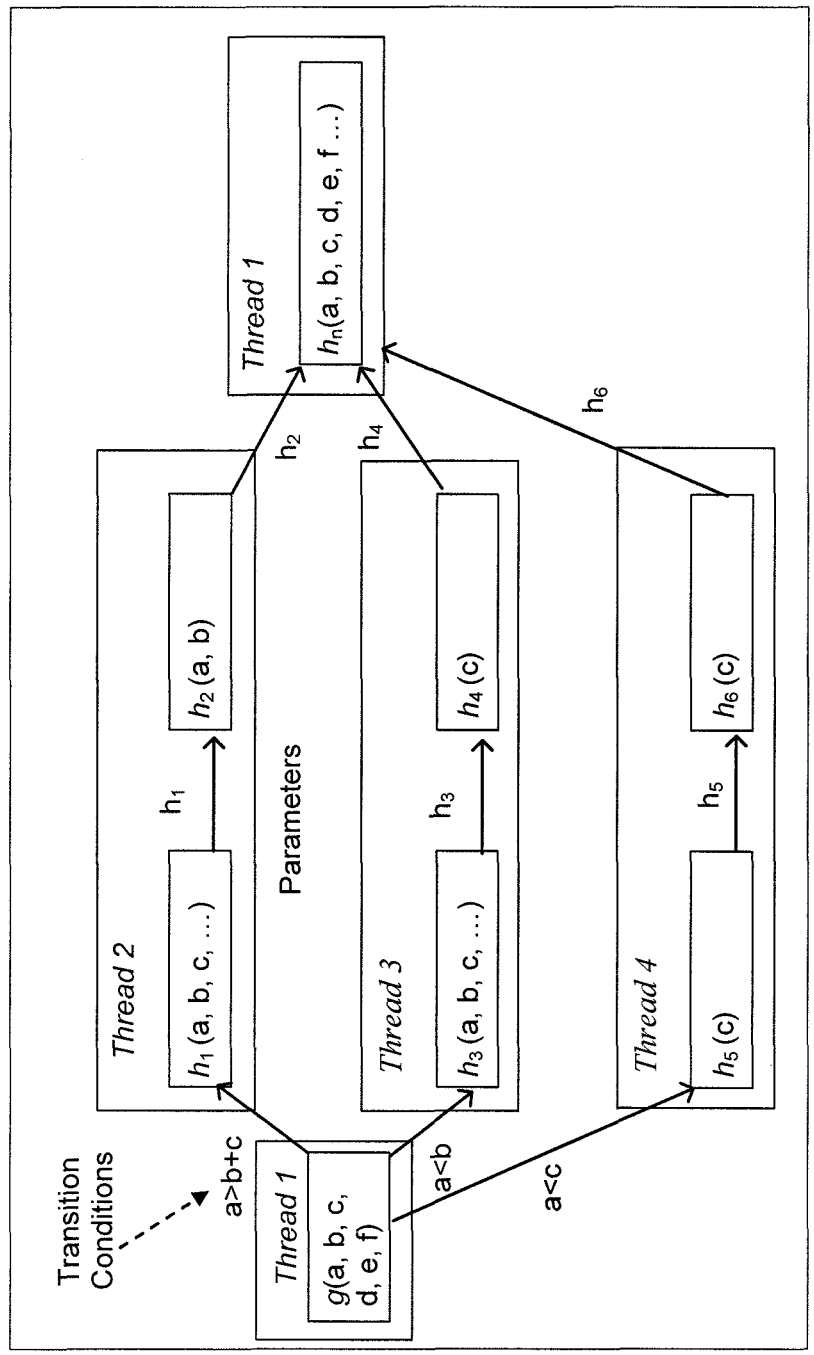
FIG. 4 shows an example of functional decomposition with transition conditions and threads.

When the various function-order arrows indicate the transition conditions, they can be thought of as state-transition vectors. If one ignores the variables, the called functions can be thought of as states. Note that the transitions shown in FIG. 4 are of two types: conditional from calculation, and conditional because a particular function has completed. Both types are necessary.

Multiple Threads as Nested Finite State Machines

Since parameters are a part of the function, they can be considered part of the state. Thus, the present functional decomposition with conditions and threads is functionally equivalent to a finite state machine. Furthermore, since each thread is separate from all other threads and each thread consists only of states and transitions, the threads act as their own state machines. Finally, since the threads are hierarchically formed, they depict nested finite-state machines.

Loops

As previously indicated, function transitions containing one of two types of transition conditions are required to externalize the control elements of functions, allowing them to be gathered together as threads. It is also clear that the transition is a separate entity type from the functions themselves. Loops or looping structures can be thought of as special, more generalized cases of function transition. Whereas a function transition contains only a condition, a looping structure contains a loop order, an initial loop-index value, a loop-index change calculation, and a loop-ending calculation.

Figure 5:
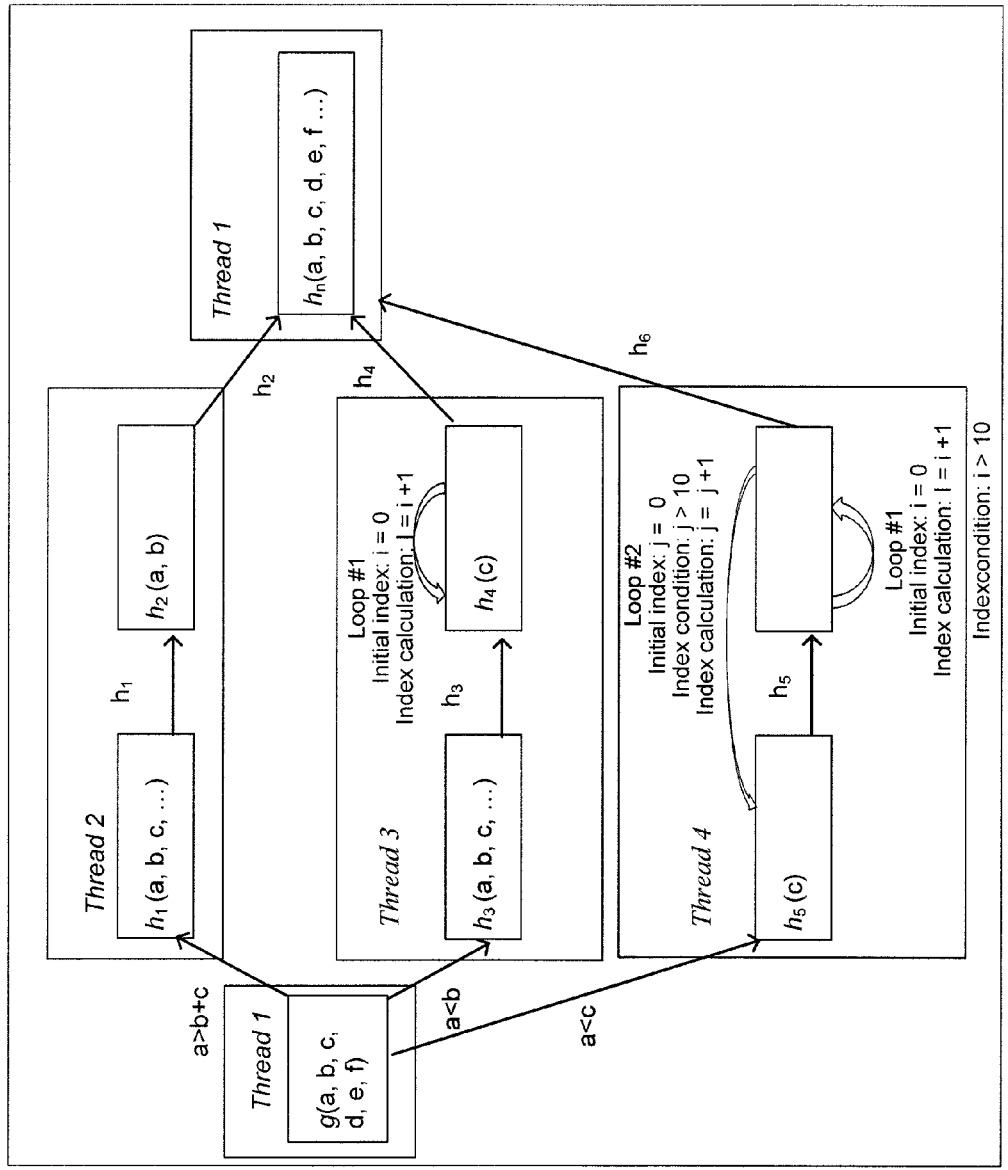
FIG. 5 shows an example of functional decomposition with conditions, threads and added loops.

FIG. 5 shows an exemplary functional decomposition with conditions, threads and added loops. The example in FIG. 5 shows three loops: a single loop for a specific function, an outer loop across functions, and an inner loop. The loop across functions can be used to loop at the thread level. An inner loop, indicated by having the lowest number in a multiple-loop system, is incremented first with subsequent numbers then incremented in successive order. It should be noted that it is not possible to loop between threads.

Functional Decomposition Graphical Model

At this point, the ideas of the prior sections are manually incorporated into a simple graphical model (e.g., a functional decomposition diagram 700, described below with respect to FIG. 7, et. seq.) that insures that all of the transitions are exposed. The functional decomposition diagram 700 is then input into graphics storage 108, and translated via graphics translation module 102 into corresponding functions in accordance with the MPfd decomposition methods described herein. The translated functions are stored in memory area 108.

It should be noted that a looping structure can be attached to any decomposition element. This looping structure initializes some data element (variable, array element, or matrix element), performs a calculation on the data element, tests the changed element value for the ending condition, and then transitions to the next functional decomposition element required if the condition is met. The data element used as the loop index is one of the function parameters, allowing the looping structure to interact with the functional element.

Highest Level of Decomposition

Figure 6:
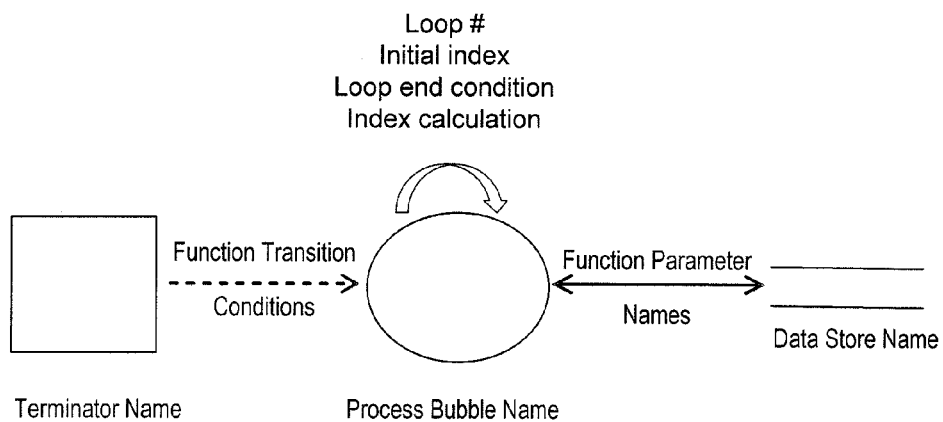
FIG. 6 is an example illustrating the highest level decomposition (level 0).

Level 0 of the MPfd consists of only three types of objects: (1) terminators, (2) a single-process bubble (or other indicator) corresponding to the un-decomposed function, and (3) data stores, along with function transitions, loops, and function parameters. The purpose of the highest level of decomposition is to place a function into a larger context. This is accomplished by allowing systems that are external to the function to transmit data and control to/from the function. A terminator represents a complete external system. FIG. 6 shows an example of the highest level (level-0) decomposition. The "Function Transition Conditions" of FIG. 6 correspond to the "Transition Conditions" shown in FIG. 4. The "Process Bubble Name" of FIG. 6 corresponds to function "g( )" of Equation 1 and FIGS. 2-5. The "Function Parameter Names" of FIG. 6 correspond to the parameters shown in Equation 1 and FIGS. 2-5.

Terminators

A terminator may be represented as a labeled square. The purpose of terminators is to be able to identify interfaces to outside systems. These interfaces do not correspond to any mathematical functions but instead represent access to data outside of the un-decomposed function. A terminator can be used to represent anything from another computer system to a display screen. Functionally, a terminator behaves similarly to a data store in that data can be sent from/to the terminator from/to the un-decomposed function. The difference between a terminator and a data store is that a terminator can transition from/to the un-decomposed function.

Process Bubble

A process bubble, adds data, changes data, deletes data, or moves data. Since a process-bubble manipulates data, all activities associated with sending and receiving data to various stores is allowed. Furthermore, since a data element can also serve as a signal, activities associated with various signals are also allowed. A process bubble, as employed in the MPfd model, is a graphical indicator of a data transformation, which is a task that accepts input data and transforms it to generate output data.

Exemplary Allowed Process Bubble Activities
1) send data to a data store using output dataflow
2) receive data from a data store using input dataflow
3) Send standard signals to control-bubbles
4) Receive standard signals from control-bubbles
5) Send standard signals to terminators
6) Receive standard signals from terminators
7) Send data to terminators
8) Receive data from terminators Single-Process Bubble The single-process bubble of the highest level of decomposition represents the un-decomposed function. Since the function is not decomposed, there can be only one level-0 process bubble. It is assumed that the level-0 process bubble will be decomposed into other functions.

Data Stores

A function typically transforms data. One way to graphically depict the transmission of data from/to the single-process bubble is via a terminator. Another way is with a data store. The displayed data stores can send/receive parameter data to/from the single-process bubble.

Control Bubble

A control bubble is a graphical indicator of a control transformation, which evaluates conditions and sends and receives control to/from other control transformations and/or data transformations. A control bubble symbol indicates a structure that performs only transitions that control the processing flow of a system, and which does not perform processing.

Conversion of MPFD to Finite State Machine

A primary goal of functional decomposition is the conversion of an MPfd into a finite state machine. This conversion is enabled by adhering to the following rules:
1) There can be only one control bubble at each decomposition level.
2) Only a control bubble can invoke a process bubble.
3) A process bubble can only transmit or receive data from a data store via a data flow.
4) A control bubble can only receive and use data as part of determining which process bubble is to be called.
5) A control bubble can use process bubbles that have completed to sequence to other process bubbles.
6) Data used by a control bubble must be from a process flow.
7) Process bubbles always return control to their calling control bubble.
8) A control bubble can receive/use/send control signals from/to control flows.
9) Process bubbles can decompose into simpler process bubbles and/or a single control bubble and process bubbles.

Figure 6A:
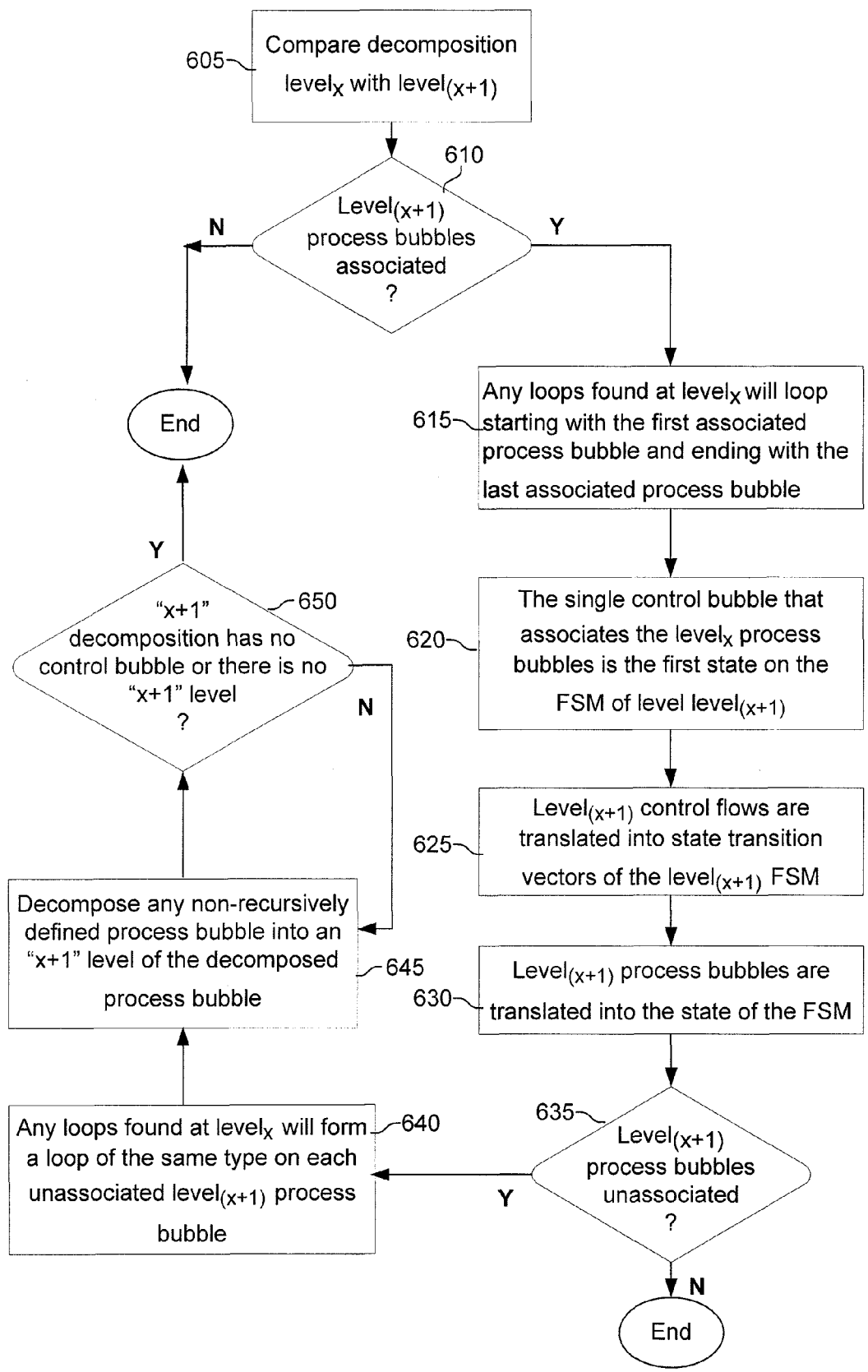
FIG. 6a is a flowchart showing an exemplary algorithm for converting an MPfd to a finite state machine.

An exemplary algorithm for converting an MPfd to a finite state machine is shown in FIG. 6A and described below.

Conversion Algorithm

Step 605: Compare decomposition $level_x$ with $level_{(x+1)}$ and determine if $level_{(x+1)}$ process bubbles are associated or un-associated. A functional decomposition element, herein represented by a bubble symbol, can decompose into two types: associated and unassociated. Association has to do with the next-level decomposition of the bubble. Depending on the association type, loops defined at a higher decomposition level behave differently when they are integrated into a lower decomposition level.

If an un-decomposed bubble labeled "A" is decomposed into bubbles labeled "1", "2", "3", and "C", then the un-decomposed bubble is said to reside at Level 1. Bubbles "1", "2", "3", and "C" are said to reside at Level 2. If a control-flow links together any level 2 bubbles, then those bubbles are said to be associated. If the control-flows do not link together the level 2 bubbles, those bubbles are said to be unassociated.

Step 610: If $level_{(x+1)}$ process bubbles are associated, then perform the following steps 615-630.

Step 615: Any loops found at $level_x$ start with the first associated process bubble and end with the last associated process bubble. That is, multiple states are in the loop. All loops are associated with the set of process bubbles. This step machine-analyzes the design and correctly interprets how the loops work. Using information from one decomposition level to next allows the system to change the algorithm definition file 116 such that the loops are executed correctly.

Step 620: The single control bubble that associates the levelx process bubbles will be the first state on the FSM of level(x+1).

Step 625: $Level_{(x+1)}$ control flows are translated into state transition vectors of the $level_{(x+1)}$ FSM.

Step 630: $Level_{(x+1)}$ process bubbles are translated into the state of the FSM.

Step 635: If $level_{(x+1)}$ process bubbles are un-associated, then perform the following.

Step 640: Any loops found at levelx will form a loop of the same type on each un-associated $level_{(x+1)}$ process bubble.

Step 645: Decompose any non-recursively defined process bubble into an "x+1" level of the decomposed process bubble. Decomposition levels are complete when an "x+1" decomposition has no control bubble (a group of un-associated process bubbles) or when there is no "x+1" level (step 650). All $level_{(x+1)}$ data stores are hidden within the states of the FSM. The various "x+1" levels are represented as nested states, that is, each state is also an FSM.

Figure 7:
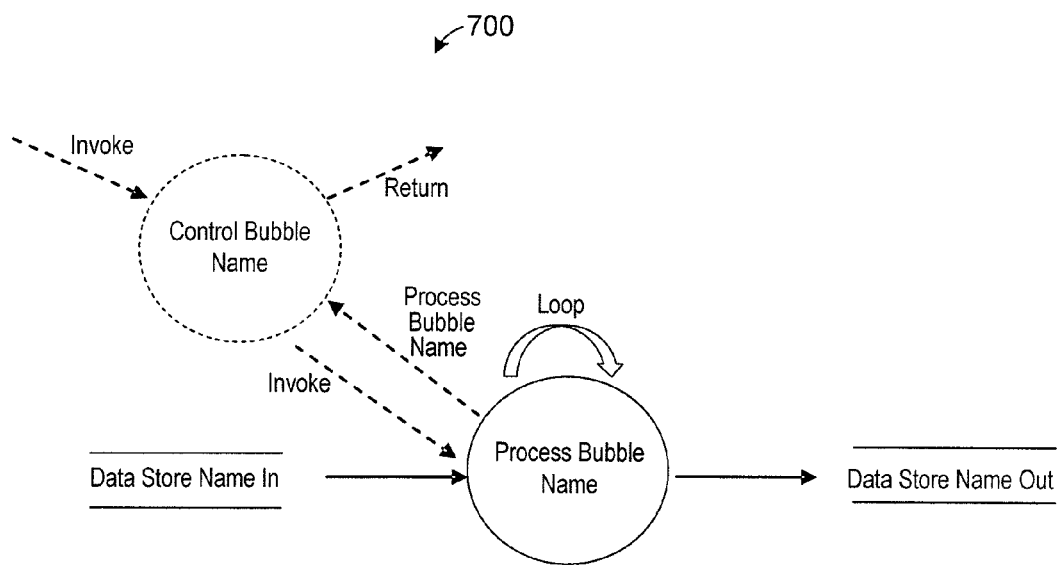
FIG. 7 shows an exemplary functional decomposition diagram.
Figure 8:
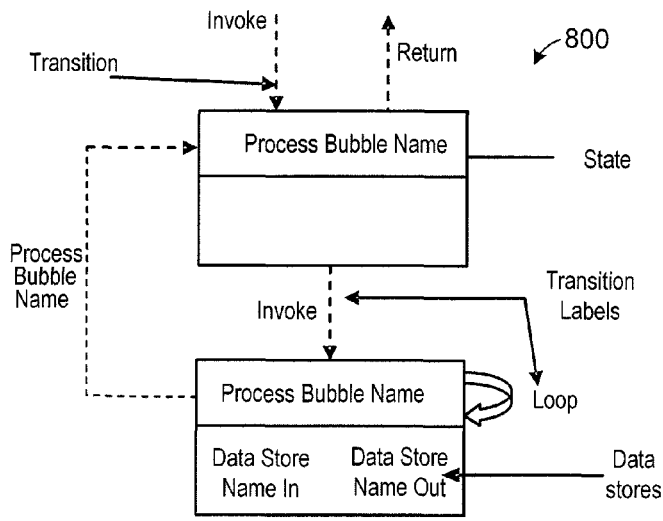
FIG. 8 shows a finite state machine view of the translation of a single-process bubble into its state machine equivalent.

FIG. 7 shows an exemplary functional decomposition diagram 700 and FIG. 8 shows a finite state machine view of the translation of a single-process bubble into its state machine equivalent. As used herein, the term "bubble" refers to a graphical element such as a solid or dashed line having the approximate form of a circle, ellipse, polygon, or the like. Notice that the control bubble is shown in the finite state machine view as the first state; only the control flows are seen, and these act as state transitions. The looping structure is captured as a looping state transition in the finite state machine 800. The process bubbles are translated into the states of the finite state machine. The data stores are captured as part of the states. Throughout this document, where applicable, both the functional decomposition and finite state machine view are shown in the Drawings.

Lower Level Decomposition

All decomposition levels below level 0 have one additional item: the control bubble. There is only one control bubble per function decomposition. The purpose of the control bubble symbol is to indicate a structure that performs only transitions and does not perform processing. This symbol has the effect of insuring that all non-looping control is fully exposed. Allowing only a single control bubble per function decomposition forces the complexity of the work to be expressed primarily through decomposition, insuring a structured decomposition with the minimum amount of complexity for each of the decompositions. The control bubble retains the name of the higher-level process bubble.

Figure 9:
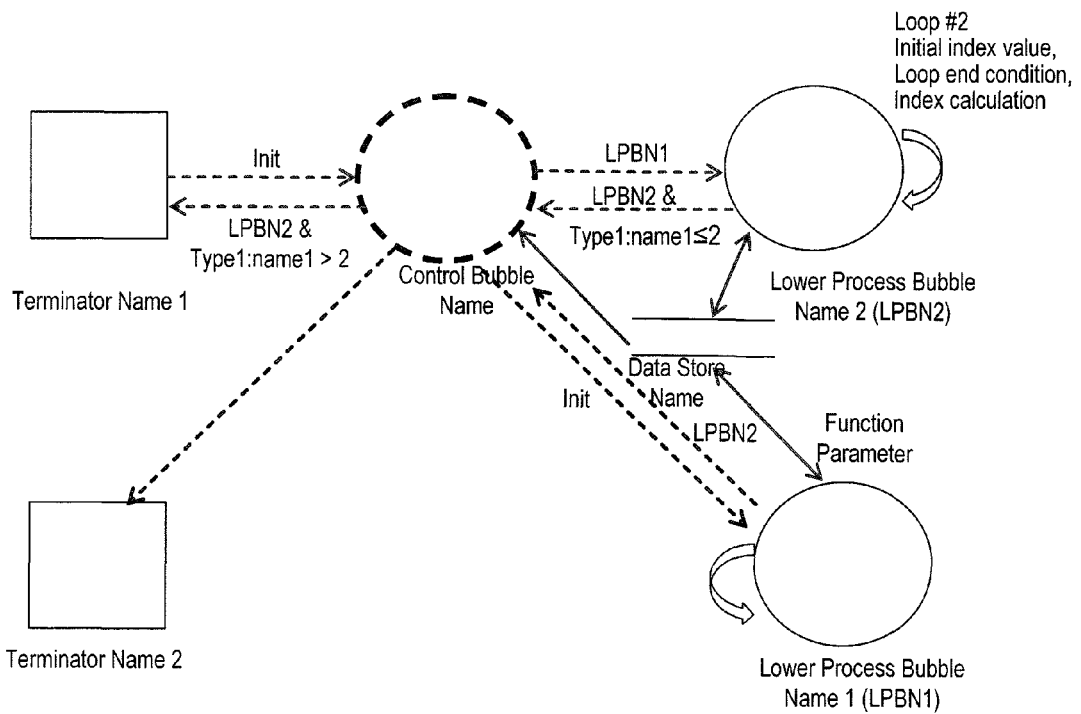
FIG. 9 shows an exemplary lower level decomposition diagram, functional decomposition view.
Figure 10:
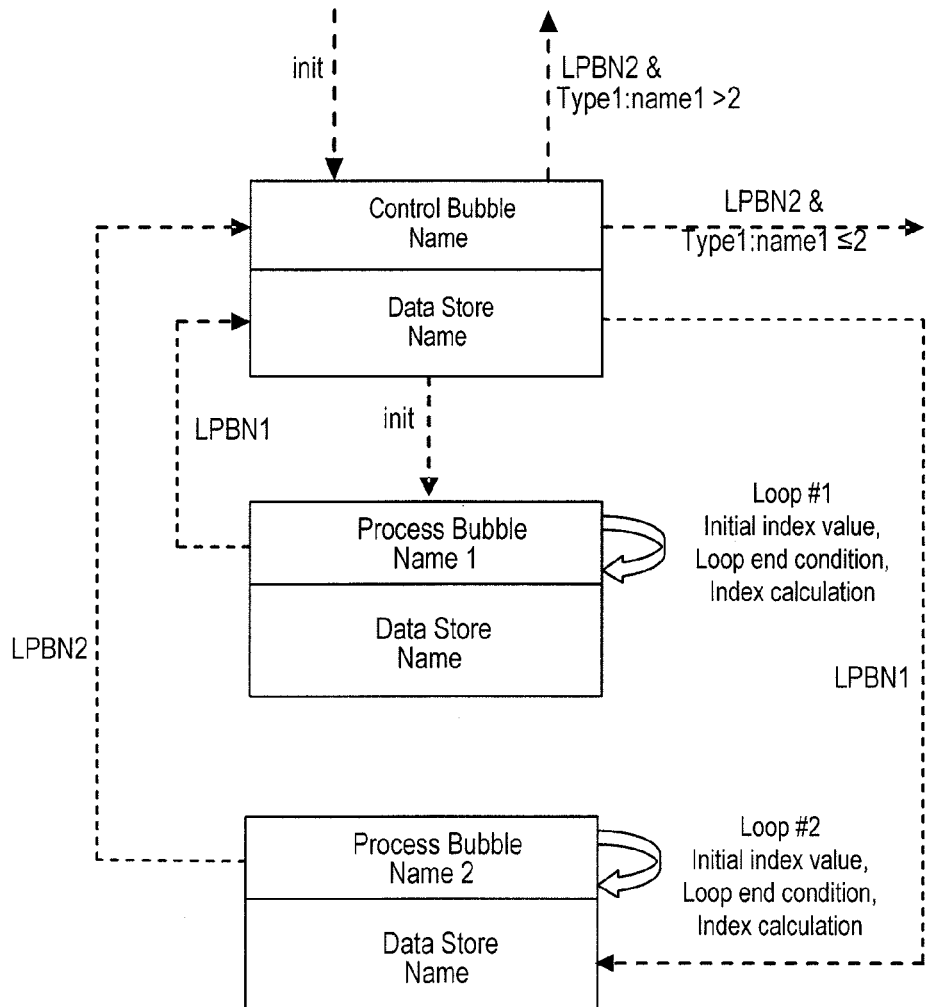
FIG. 10 shows an exemplary lower level decomposition diagram, finite state machine view.

FIGS. 9 and 10 respectively show functional decomposition and finite state machine views of an example of a lower level decomposition. The process bubbles cannot directly send information from one process bubble to another but can do so through a data store. If the data store has the same name, the finite state machine view assumes it will have the same memory addresses. Likewise, a process bubble cannot directly transition to another process bubble but can do so through a control bubble, which is always the initial state.

Multiple Loops

Figure 11:
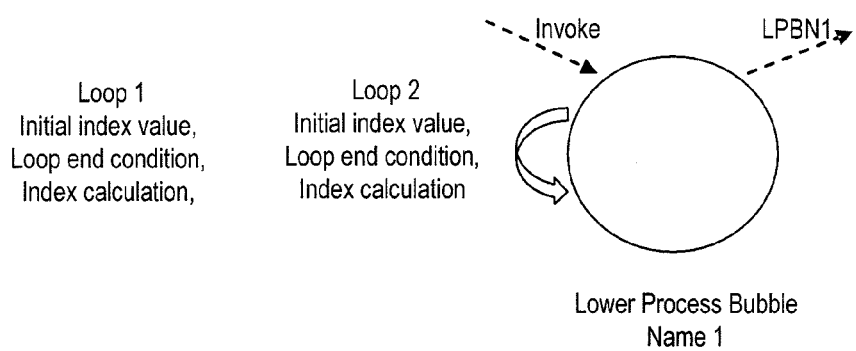
FIG. 11 shows multiple loops, functional decomposition view.
Figure 12:
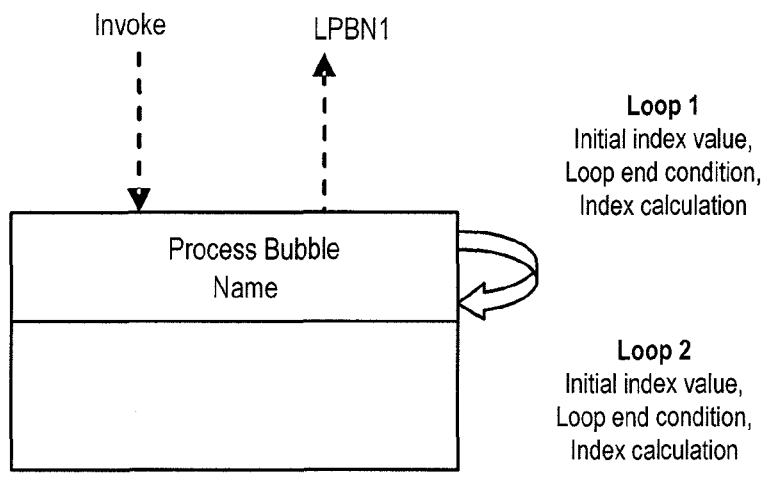
FIG. 12 shows an example of multiple loops, finite state machine view.
Figure 13:
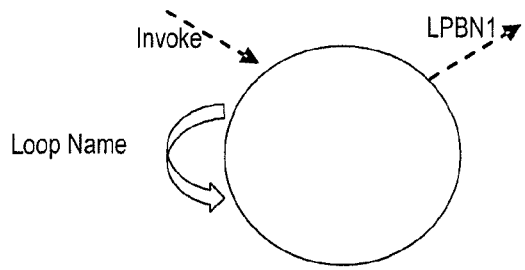
FIG. 13 shows an example of a loop with label, functional decomposition view.
Figure 14:
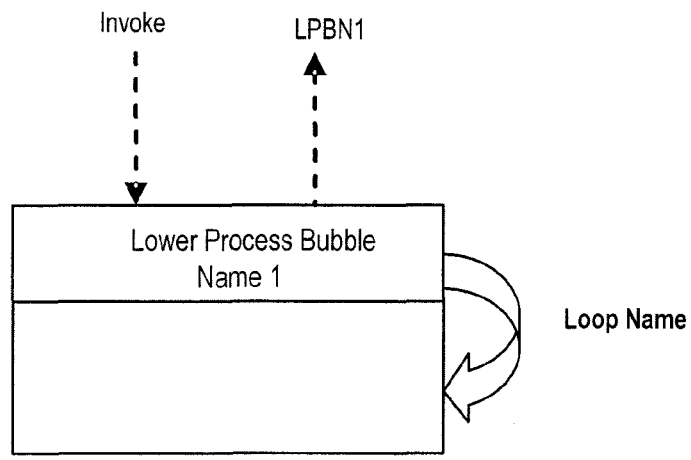
FIG. 14 shows an example of a loop with label, finite state machine view.

In order to denote multiple loops, each loop definition is defined separately. FIGS. 11 and 12 respectively show functional decomposition and finite state machine views of multiple loops. As shown in FIGS. 10 and 11, "LPBN1" represents "Lower Process Bubble Name 1":

Because multiple loop definitions can take up so much space on the diagram, a label representing a loop definition table can be used instead, changing the loop display to that shown in FIGS. 13 and 14, which respectively show functional decomposition and finite state machine views of an exemplary looping operation.

Selecting the loop name can cause the loop definition(s) to be displayed as shown in Table 1, below:

TABLE 1

| EXAMPLE LOOP LABEL DEFINITION Loop Name | | | |
|---|---|---|---|
| Loop 1 | Initial index value 1 | Index Calculation 1 | Loop End Condition 1 |
| Loop 2 | Initial index value 2 | Index Calculation 2 | Loop End Condition 2 |

All loops associated with a process bubble are considered nested loops: one loop is within another loop. The first loop defined is considered the inner-most loop, with each successive outer loop defined as surrounding the inner loop. Thus, the example given in FIG. 11 and Table 1 means that Loop 2 is inside of Loop 1; that is, Loop 1 is invoked after Loop 2. Parallel loops occur when two or more process bubbles, without any mutual dependency and occurring at the same decomposition level, each have a loop. The loops of these independent, loop-bearing process bubbles can occur in parallel.

Data Elements

Variables, Arrays, and Matrices

Variables, arrays, and matrices represent data elements of various orders. A variable is a single data element of a certain type and can be thought of as a zero-dimensional object. An array consists of multiple data elements arranged linearly and can be thought of as a single-dimensional object. A matrix consists of multiple data elements arranged into greater than one dimension and can be thought of as a higher-dimensional object. Transitions and loops can use these data objects in their conditions and calculations. This means that there must be a precise way to discuss all data objects.

Figure 15:
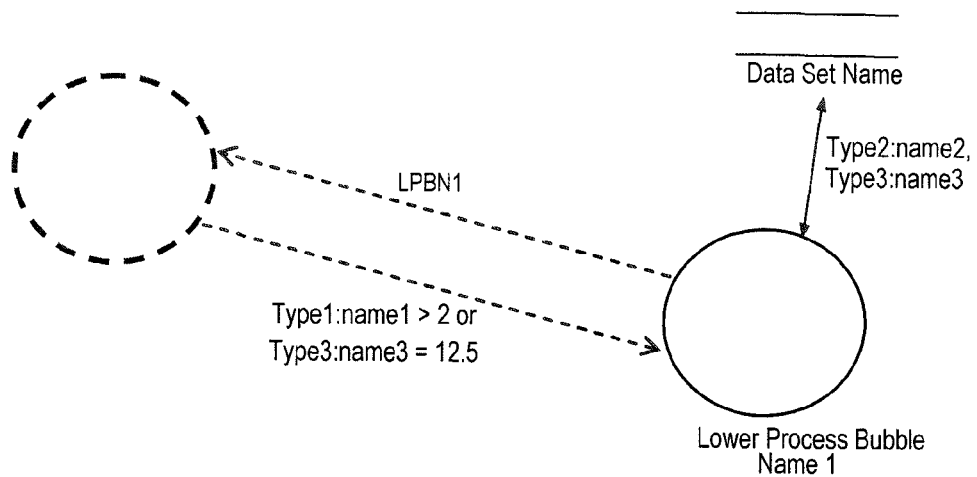
FIG. 15 shows an example of multiple data on lines and multiple conditions on transition.

As with the looping structures, there can be multiple data elements per input/output data line or transition. This means that the line or transition can be identified using a label that points to the appropriate definition, as shown in FIGS. 15 and 16, which respectively show functional decomposition and finite state machine views.

Figure 16:
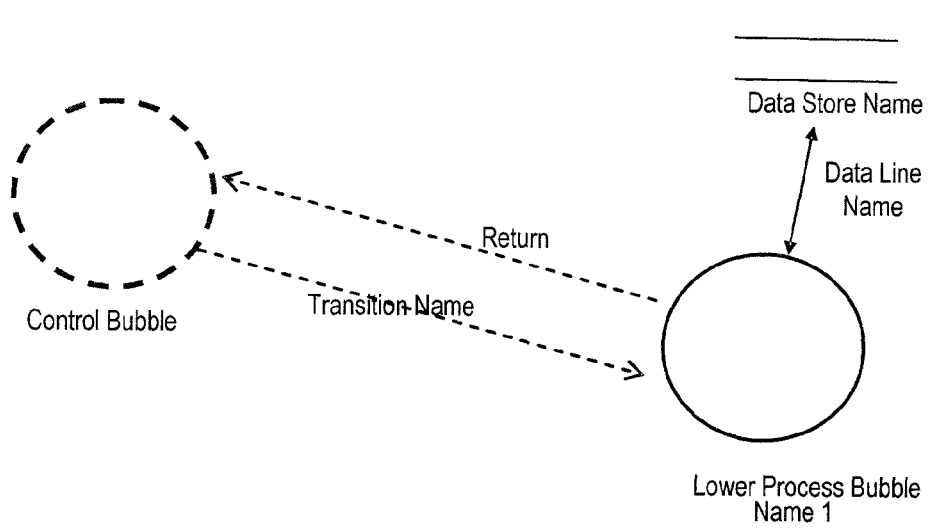
FIG. 16 shows an example of transition and data lines using labels.

Selection of the labeled transition in FIG. 16 would then display:

| TRANSITION NAME | |
|---|---|
| Condition 1 | Type1: name1 > 2 |
| Condition 2 | Type3: name3 = 12.5 |

Selection of the labeled data line in FIG. 16 would then display:

| DATA LINE NAME | |
|---|---|
| Data Element 1 | Type2: name2 |
| Data Element 2 | Type3: name3 |

Variables

A variable only requires a label and a type in order to identify it. The following composite label will fully identify a variable:

Type:variableName

Figure 17:
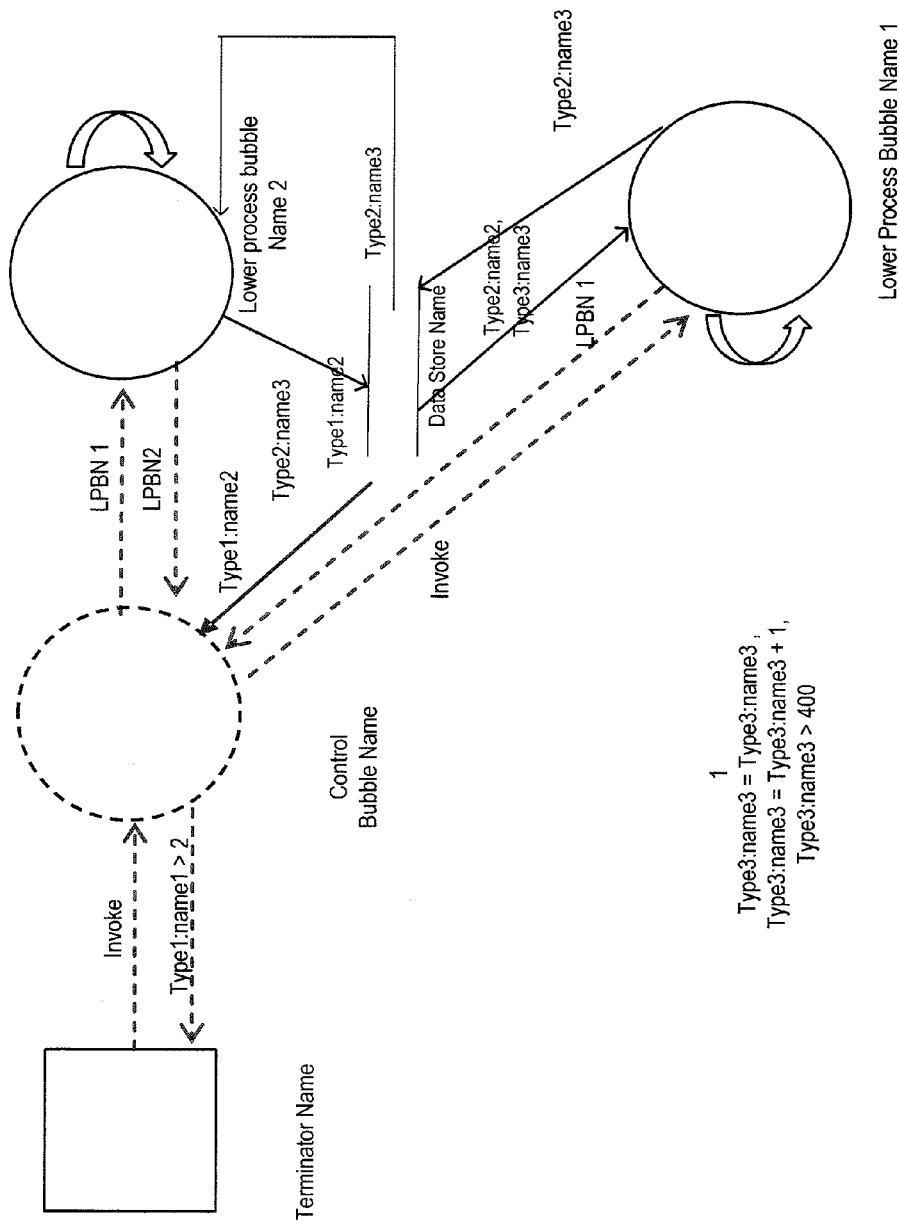
FIG. 17 is an exemplary lower level decomposition diagram with composite variable names, functional decomposition view.

The composite variable name changes the "Function Parameters Names" to a comma-separated list of composite variable names, as shown in FIG. 17, which is a functional decomposition view of an exemplary lower level decomposition with composite variable names.

Arrays

An array requires a composite consisting of a label, a type, and an array index or element number to identify it. The following composite label will fully identify an array:

Type:variableName:"index or element #"

If the symbol after the second colon is a Greek symbol, it represents an index; otherwise, it represents an array element. The first index represents a row in MPfd, the second index a column, and the third index the matrix depth. Designating multiple array elements does not designate a loop, only the movement of a certain number of variables.

Figure 18:
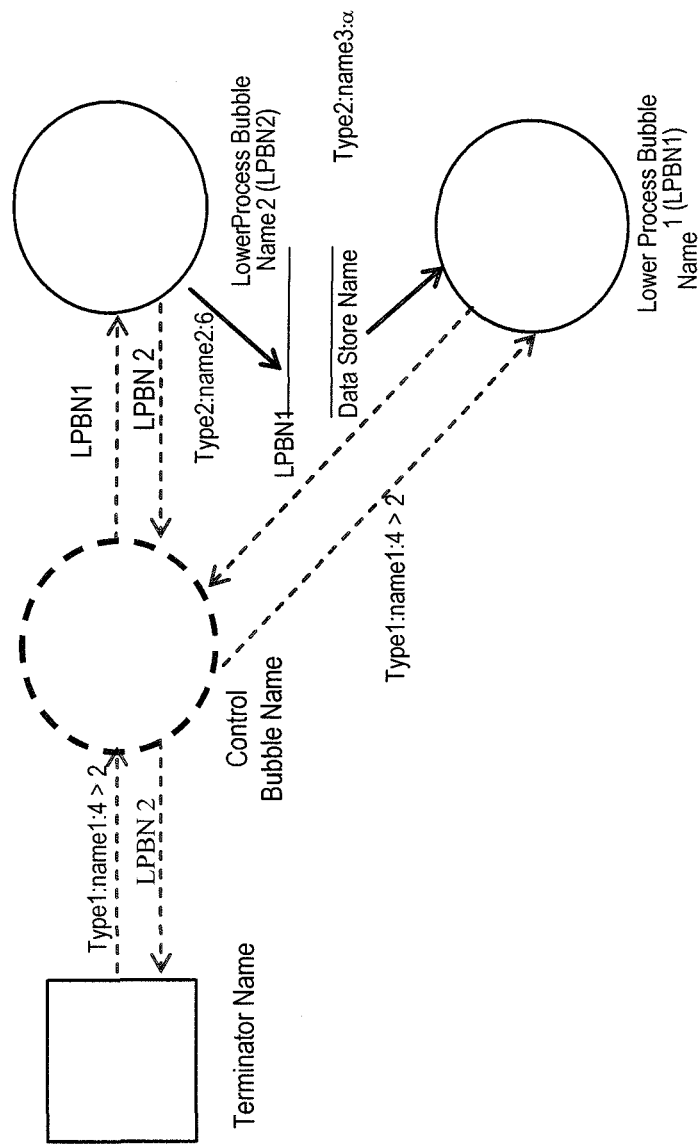
FIG. 18 is an exemplary lower level decomposition diagram without composite array names and dimensionality.
Figure 19:
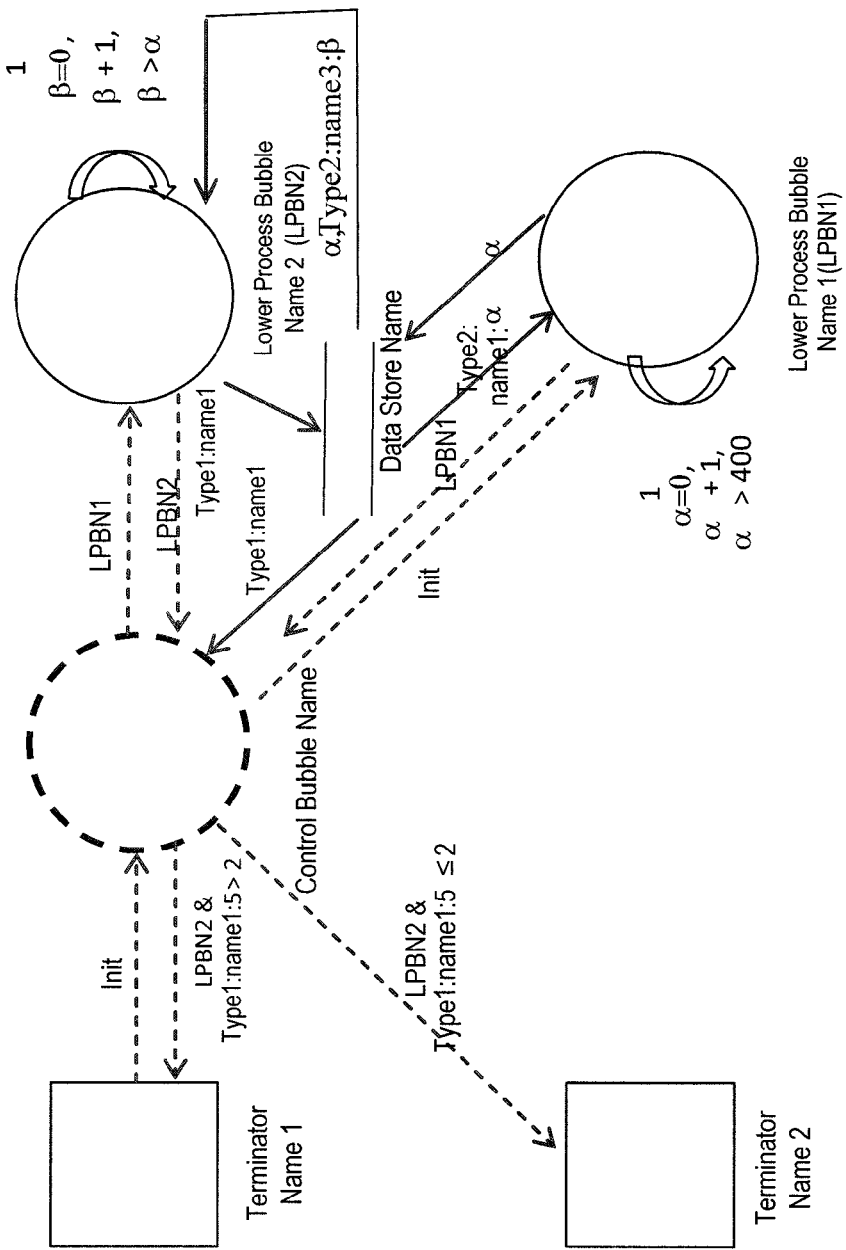
FIG. 19 is an exemplary lower level decomposition diagram with composite array names and dimensionality.

The composite array name changes the "Function Parameters Names" to a comma-separated list of composite array names, as shown in FIG. 18 (lower level decomposition diagram without composite array names and dimensionality) and FIG. 19 (lower level decomposition diagram with composite array names and dimensionality).

Matrices

A matrix requires a composite consisting of a label, a type, and multiple array element designations to identify it. The following composite label will fully identify an array:

Type:variableName a, b, . . . n

Each matrix element represents a matrix dimension. The first element represents the first dimension, the second element the second dimension, etc.

Figure 20:
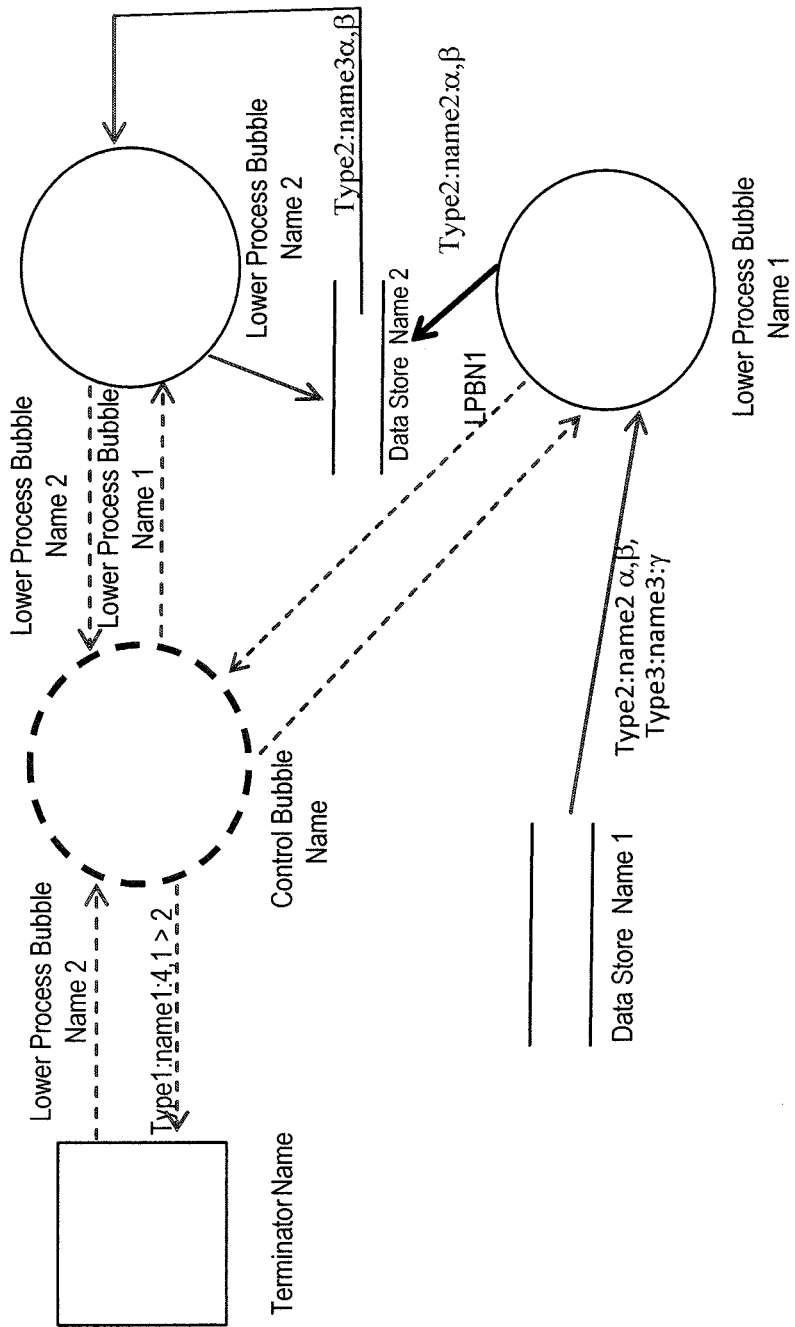
FIG. 20 is an exemplary lower level decomposition diagram with composite matrix names with multiple dimensions.

The composite matrix name changes the "Function Parameters Names" to a comma-separated list of composite matrix names, as shown in FIG. 20, which illustrates a lower level decomposition with composite matrix names with multiple dimensions.

Profiling to Determine Node Count

Determining how well a process bubble will scale requires knowing how much exposed work and how much exposed communication time is present. The work time can be obtained by measuring the execution time of the process bubble's attached code with data of a known size. The data comes from the test plans and procedures that are attached to every process bubble of every project designed using the MPfd model. The communication time comes from the a priori determination of actual communication time and actual latency time. As long as the following criteria is met, computational elements can be added to increase the processing performance of a process bubble, as shown in Equation 2:

Profile Parallel Target $$S_t/(M_t+E_t)>T \qquad \text{Equation 2}$$

Where: $S_t$=Single-node processing time
$M_t$=Multi-node processing time
$E_t$=Exposed communication time The target value T can be set by the present system. Profiling will continue until the condition is no longer met. The minimum, maximum, and median dataset sizes associated with a design bubble for an particular kernel or algorithm are used to calculate the number of processing units for any dataset size greater than the minimum and less than the maximum.

Automatic Selection of Data Movement Model

In computer science parlance, there are two ways to transmit data into a function: pass-by-value and pass-by-reference. Pass-by-value simply means that only the contents of some memory location are transmitted to the function. Sending the contents of a memory location is equivalent to having a constant as an input parameter. That is, all changes made to the value are kept internal to the function with none of those changes accessible outside of the function. This provides for the "encapsulation" of data, insuring that unwanted side effects do not occur between functions. Pass-by-reference allows a function to have multiple output parameters.

The following information is associated with a data element on an MPfd: composite name, input designation, and output designation. The input/output designations are a function of the directions of the lines associated with the composite name. The three possibilities are input, output, or both.

Pass by Value

In an MPfd, pass-by-value is another way of saying that a scalar data element (not an array or matrix) is only input into a function, never output from a function. A constant value must also be passed by value as there is no variable, hence no possibility of referencing a memory location. The input-only scalar data element or constant must use pass-by-value, insuring that the data use is encapsulated. Thus, whenever a scalar or constant input is used in an MPfd, it will signify the use of the pass-by-value method.

Pass by Reference

If the composite name in an MPfd refers to vector data (an array or matrix), particular data elements must be accessible. In computer programming, such access occurs as an offset to some base location. Thus, the base memory location must be transmitted to the function. Also, if the contents of a memory location must change (as is the case for output scalars), the memory location of the data element needs to be known. In both cases, a memory location is passed to the function, called referencing, and the contents of the memory location(s) accessed, called dereferencing. This allows the memory locations to be accessed and changed, with the changes visible to other functions simply using the same differencing method.

Functional Decomposition Data Transmission Model

Since it is possible for an MPfd to determine the data transmission model (pass-by-value or pass-by-reference) automatically from information generated as part of an MPfd, one of the most confusing aspects of modern computer programming can now be performed automatically, from design.

Automatic Detection of Parallel Algorithm Decomposition

There are two types of parallel processing indicators that can be included on MPfd design diagrams: structural and non-structural. Structural parallel indicators are determined by the design without any extra information. Task parallelism is an example of structural indication. Other types of parallelism detectable via structural indication include: transpose detection, parallel I/O detection, scatter detection, and gather detection.

Non-structural parallel indicators need more information than is usually given in design in order to determine the type of parallelism. Variable definitions in computer languages only support the following information: variable name, variable type, and number of dimensions. Parallelizing a code requires two other types of information: topology and data intent. Topology defines the computational behavior at the edges of a vector or matrix—examples include: Cartesian, toroidal, and spherical.

Data intent is the intended use of the data; examples include:
(1) particle-like usage—the data represents particles that move throughout a matrix and may interact,
(2) field-like usage—a force that affects to some degree data across a large section of the matrix simultaneously,
(3) search-like intent—data that interacts with a larger set of data, giving some result, and
(4) series expansions/contractions—calculation of the terms of a mathematical series.

The present MPfd method allows a designer to indicate the algorithm processing topology and the data intent, giving the design the information required to complete the parallel processing. The topology can be calculated by the present system 100 based upon the data intent. Alternatively, the topology information can be added to the vector or matrix information of the input data of a transformation by the designer.

Since an algorithm is defined as a functional decomposition element, it can be decomposed into multiple, simpler algorithms and/or kernels. As previously noted, a functional decomposition element, herein represented by a bubble symbol, can decompose into two types: associated and unassociated. Association has to do with the next-level decomposition of the bubble. Depending on the association type, loops defined at a higher decomposition level behave differently when they are integrated into a lower decomposition level.

Figure 21:
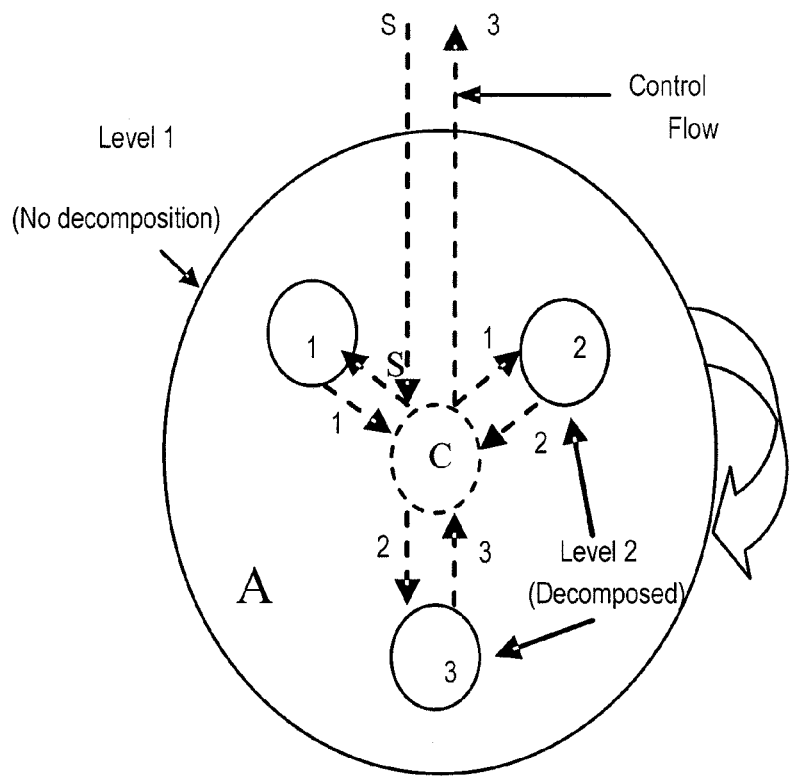
FIG. 21 shows an example of associated bubbles linked via control-flows.

If the un-decomposed bubble labeled "A" is decomposed into bubbles labeled "1", "2", "3", and "C" then the un-decomposed bubble is said to reside at Level 1. Bubbles "1", "2", "3", and "C" are said to reside at Level 2. If the control-flows link together the level 2 bubbles then those bubbles are said to be associated. FIG. 21 shows an example of associated level-2 bubbles linked via control-flows.

If a looping structure is added to Level 1 (Bubble A) then this is interpreted to have the following effect on Level 2: 1) the loop will start with the activation of the first process bubble and end with the last process-bubble ending, 2) the loop will continue to restart the first process bubble until the end-of-loop condition occurs, and 3) upon completion of the loop, control will be transferred back to the original level-1-defined control bubble or terminator. This is also shown in FIG. 21.

Figure 22:
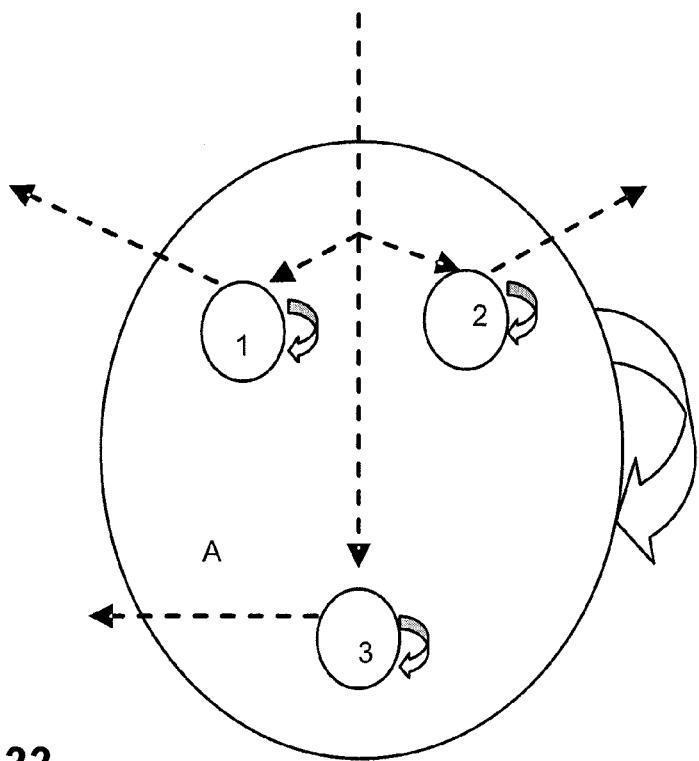
FIG. 22 shows an example of unassociated bubbles.

If the control-flows do not link together the level 2 bubbles, those bubbles are said to be unassociated. FIG. 22 shows an example of unassociated level-2 bubbles.

Figure 23:
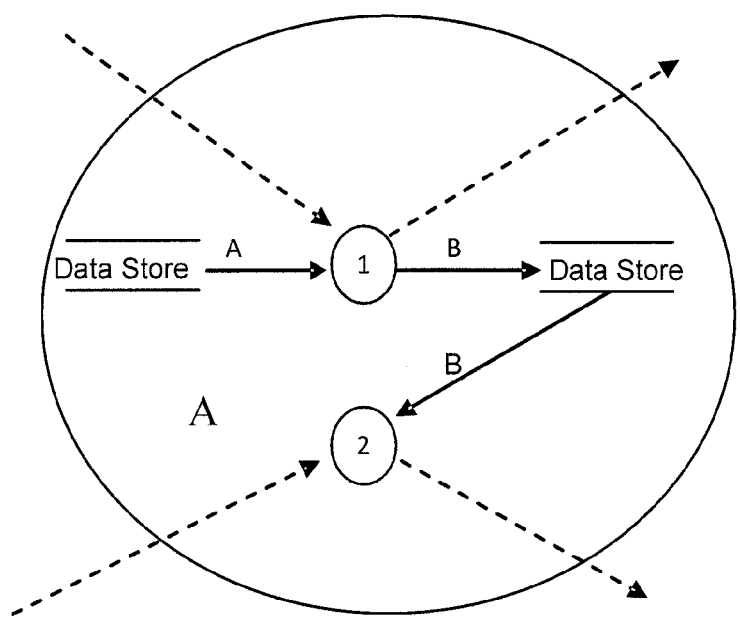
FIG. 23 shows an example of data associated bubble.

If a looping structure is added to Level 1 (Bubble A) then the looping structure is added to each of the unassociated level 2 bubbles. This is shown in FIG. 23. It is possible for level 2 bubbles to appear to be unassociated because no control-flow binds them but be associated instead via data. Data-associated level 2 bubbles are shown in FIG. 23.

Figure 24:
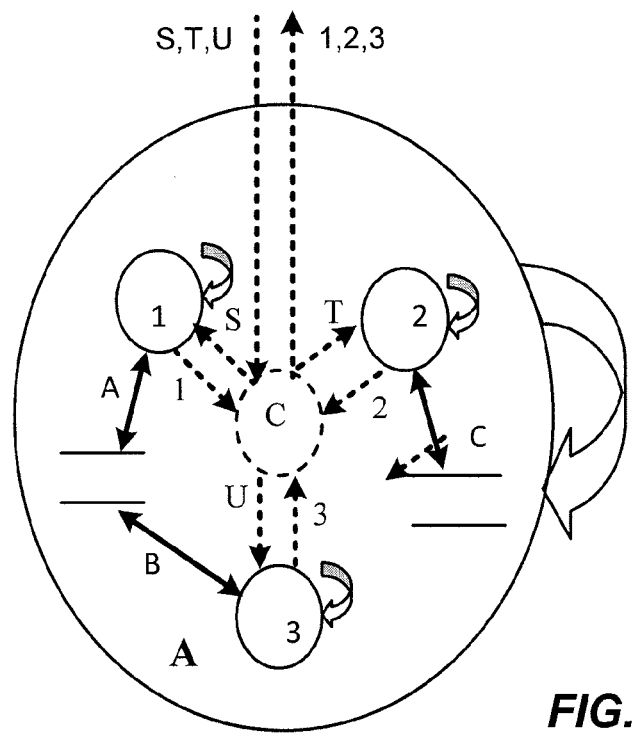
FIG. 24 shows an example of control linked, unassociated level-2 bubbles.

Similarly, it is possible to have level-2 bubbles which use the same control structure actually be unassociated as long as neither the control-flows nor the data associates them. This type of unassociated bubble structure is shown in FIG. 24.

Figure 25:
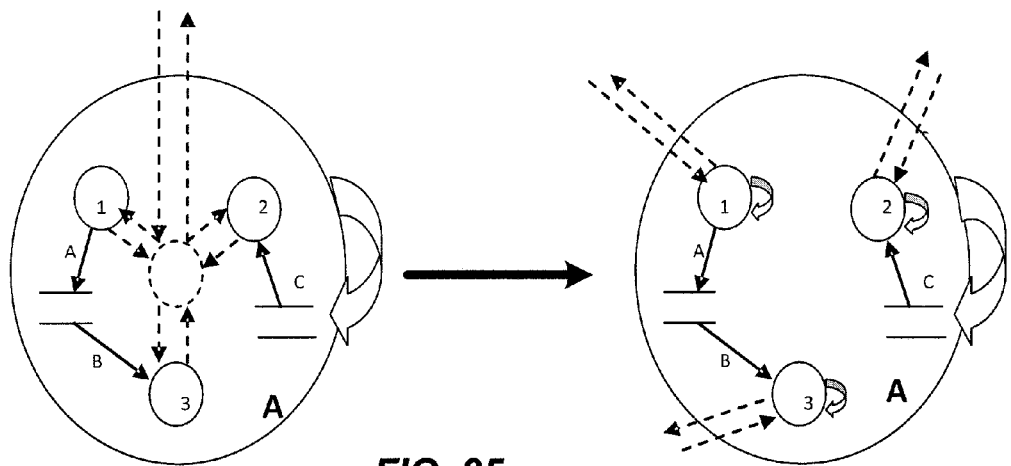
FIG. 25 shows an example of transformation to standard unassociated form.
Figure 26:
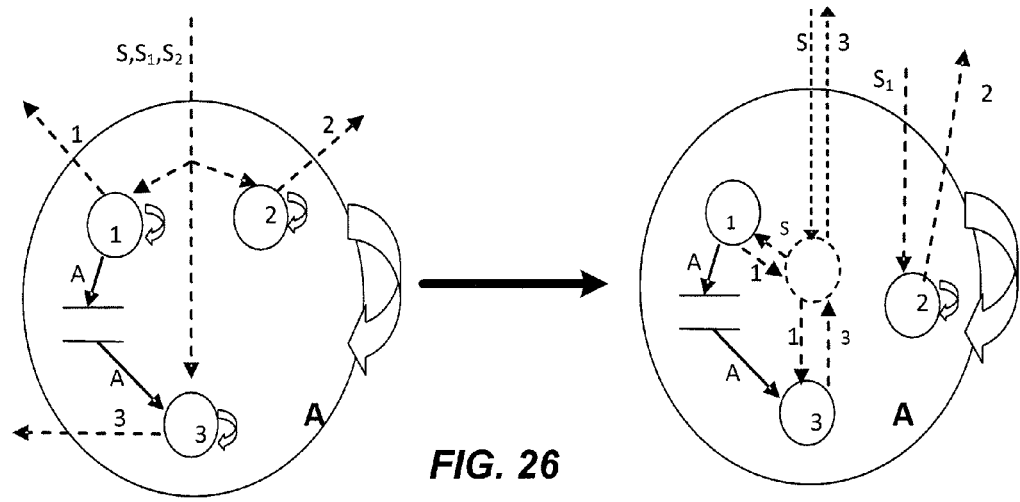
FIG. 26 shows an example of transformation to standard associated form.

If the decomposition is incorrect, it is sometimes possible to rearrange the decomposition based upon association. An example of this transformation to standard unassociated form is shown in FIG. 25. Similarly, it is sometimes possible to rearrange the decomposition based upon un-association, as shown in FIG. 26, which is an example showing transformation to standard associated form.

Unassociated Process Bubbles Indicating Task Parallelization

Figure 27:
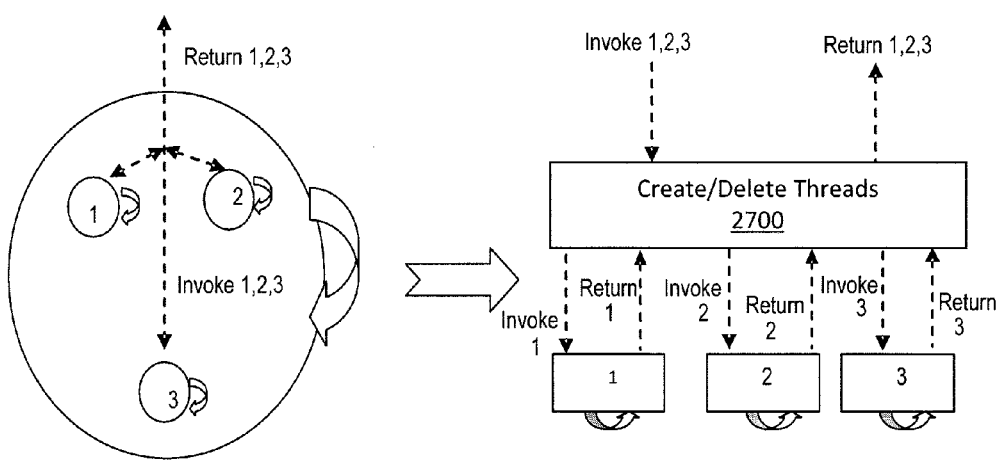
FIG. 27 shows an example of unassociated process bubbles to task parallel indicating finite state machine.

When process bubbles are grouped together but are not associated, this indicates that those processes can occur at the same time if the tasks are executed on parallel hardware. FIG. 27 shows unassociated process bubbles to task parallel indicating finite state machine. Block 2700 indicates a new state made by the system, creating task level parallelism.

Transpose Notation

Figure 28:
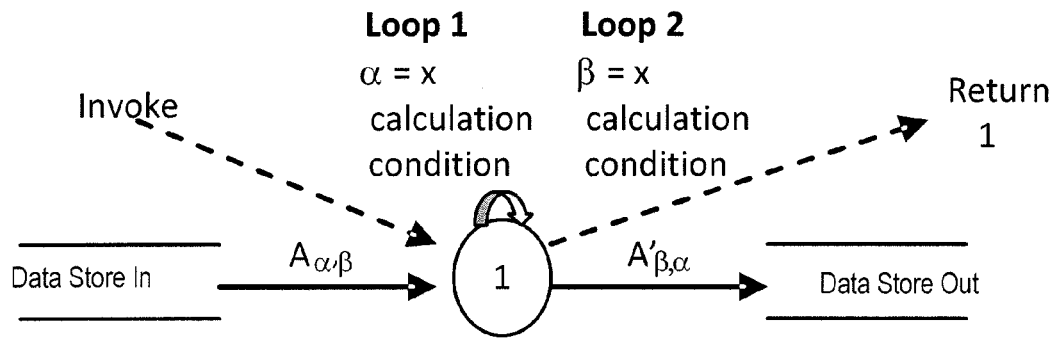
FIG. 28 shows an example of transpose notation, functional decomposition view.
Figure 29:
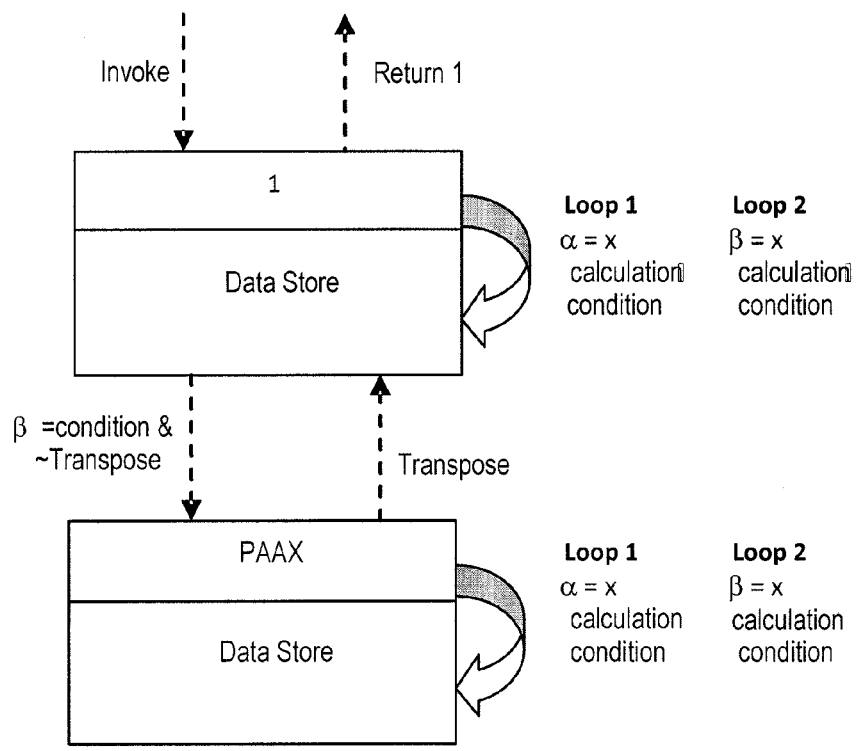
FIG. 29 shows an example of transpose notation, finite state machine view.

By telling the functional decomposition elements that a vector's or an array's data comes in and is processed then leaves, an opportunity to perform a scatter/gather operation (described below) is defined. The indices on an input vector or matrix are reversed on the output version of the same matrix, and the indices are found in the loop, as shown in FIG. 28, which shows a transpose notation in functional decomposition view. Note that the accent mark by the second "A" means that at least one element of array A has been changed. FIG. 29 shows a transpose notation in finite state machine view.

Scatter/Gather Notation

Figure 30:
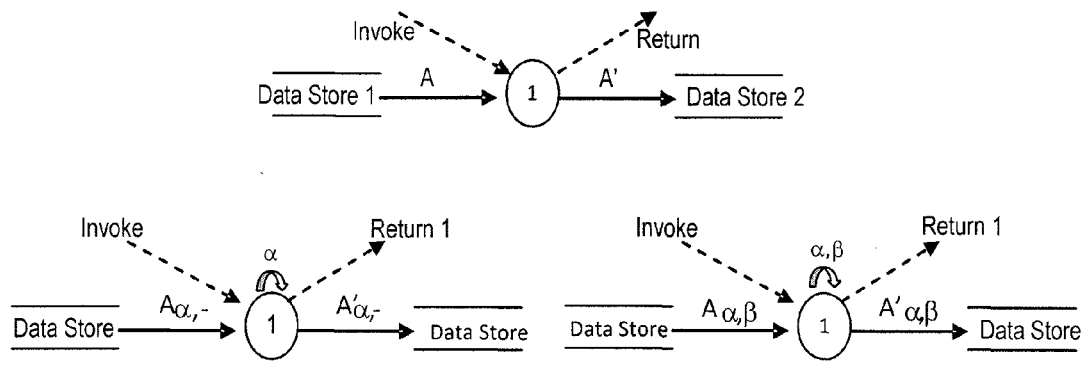
FIG. 30 shows an example of scatter/gather notation, functional decomposition view.
Figure 31:
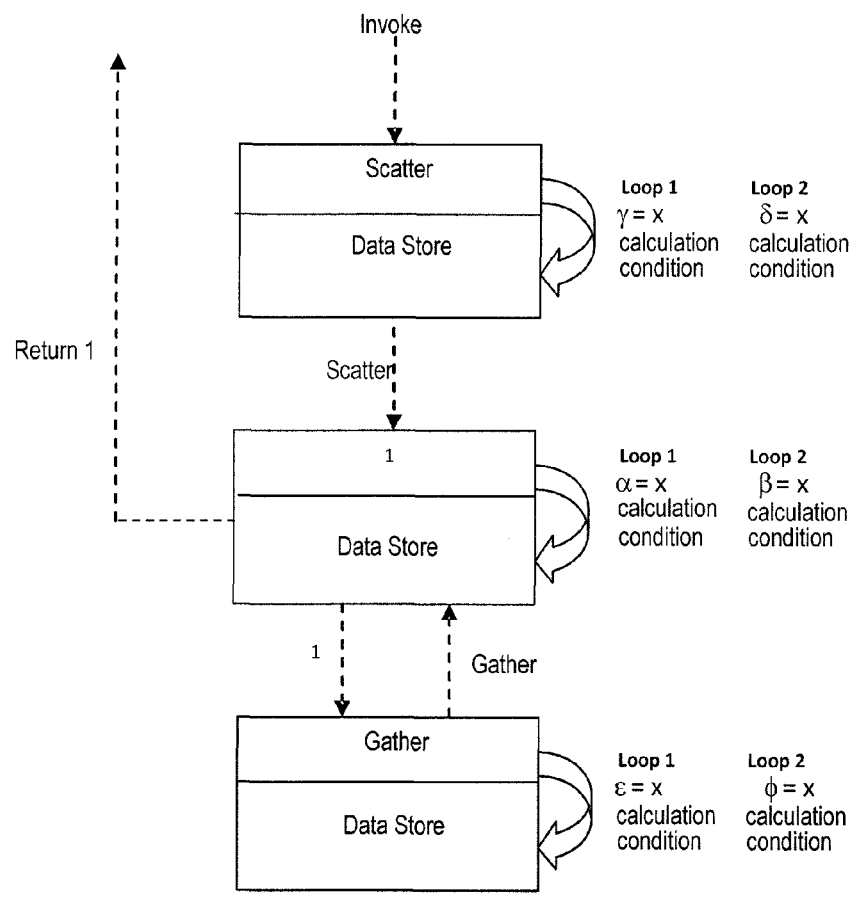
FIG. 31 shows an example of scatter/gather, finite state machine view.

A scatter/gather moves data to multiple nodes or gathers information from multiple nodes. The indices of the loops match the active indices of the data, and the order of the data indices does not change. FIG. 30 shows an example of scatter/gather notation, functional decomposition view, and FIG. 31 shows the corresponding finite state machine view. Note that if bubble 1 is the first activated process bubble then "A" is an input. if bubble 1 is the last process bubble then "A" is an output matrix.

Parallel Input/Output Indication

Figure 32:
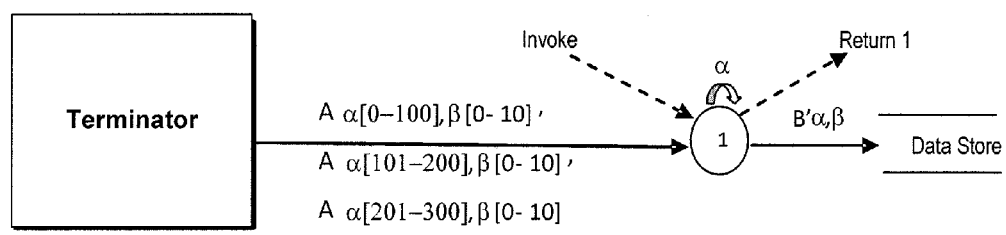
FIG. 32 shows an example of parallel i/o indication.

Parallel input and output is defined as being from/to a terminator block. Since a terminator block represents another system interfacing with the currently under-design system, obtaining data from this external system is considered input and transmitting data to this external system is considered output. Inputs and outputs to/from terminator blocks can designate that data for the same vector or matrix is being received or sent via separate, parallel data lines by adding the "[ ]" designator to the vector or matrix index. For example, the following are parallel input-data streams defined, as shown in FIG. 32:

$A_{\alpha[0-100],\beta[0-10]}$=2-dimensional array "A" with indexes $\alpha$ and $\beta$.

Elements 0 through 100 of index $\alpha$ and elements 0 through 10 of index $\beta$ are input.

$A_{\alpha[101-200],\beta[0-10]}$=2-dimensional array "A" with indexes $\alpha$ and $\beta$.

Elements 101 through 200 of index $\alpha$ and elements 0 through 10 of index $\beta$ are input.

$A_{\alpha[201-300],\beta[0-10]}$=2-dimensional array "A" with indexes $\alpha$ and $\beta$.

Accordingly, elements 200 through 300 of index $\alpha$ and elements 0 through 10 of index $\beta$ are input.

Figure 33:
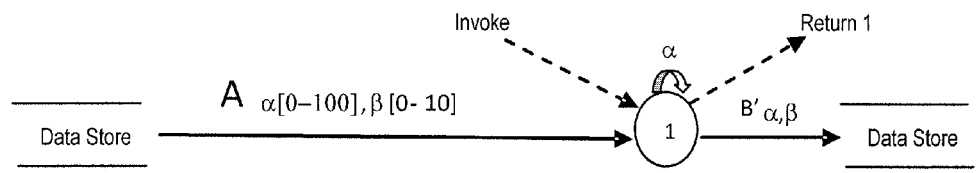
FIG. 33 shows an example of selecting particular matrix elements.

Output works analogously. If separate vector or matrix elements are input/output to/from a process bubble but not to/from a terminator, then a simple element selection is indicated. An example of selecting particular matrix elements is shown in FIG. 33, wherein process element "1" receives data elements from the "A" matrix rows 0 through 100 and columns 0 through 10.

Decomposition Completeness

Figure 34A:
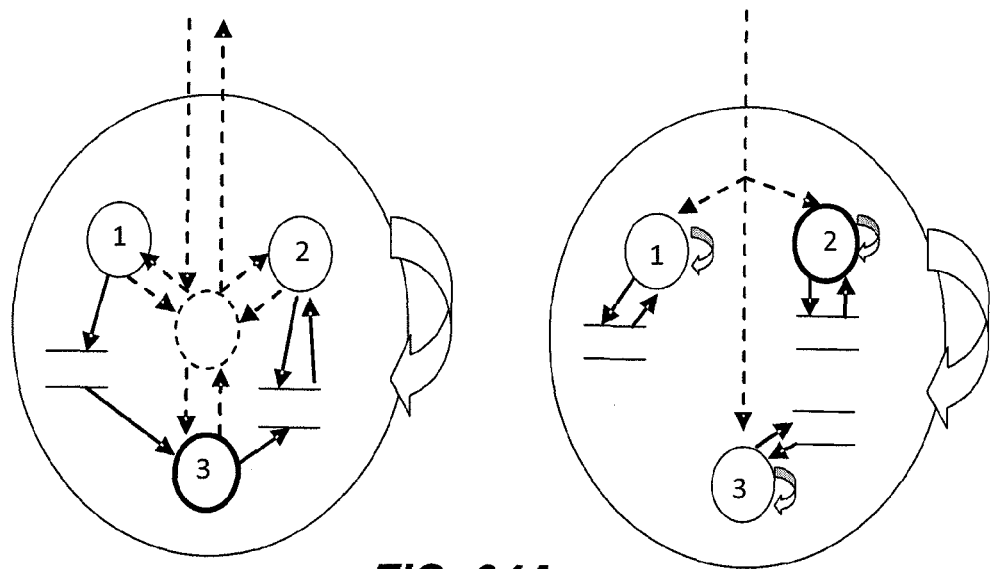
FIGS. 34a and 34b show examples of incomplete decomposition.
Figure 34B:
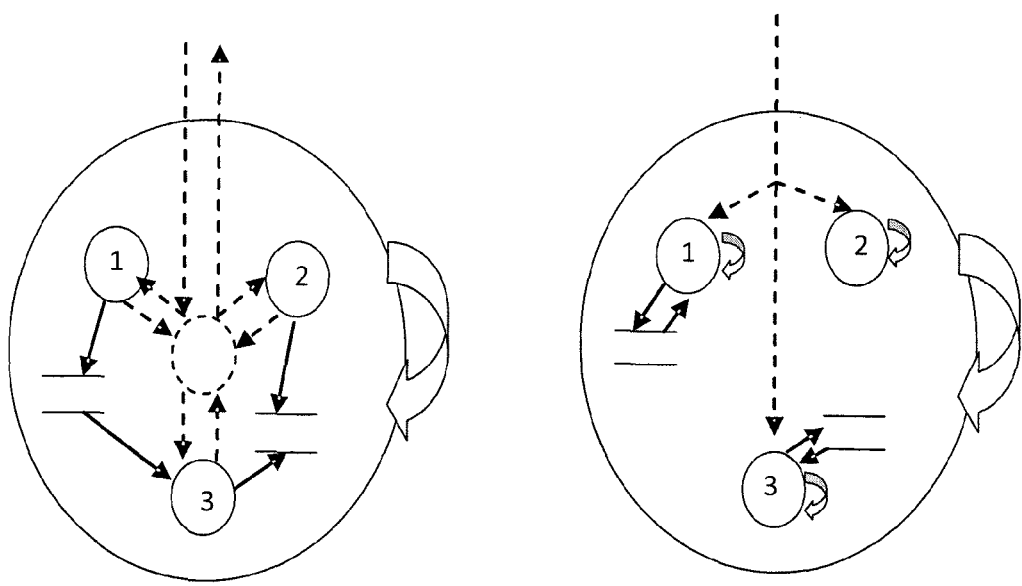

The present system can automatically determine if a functional decomposition is complete, as indicated in FIGS. 34A/34B, which illustrate examples of incomplete decomposition. One example of incomplete decomposition is shown in FIG. 34A. If there is at least one algorithm (bubble 3 in the left-hand diagram, or bubble 2 in the right-hand diagram) which does not decompose into only process and control kernels (the remaining bubbles in FIG. 34A) then the decomposition is incomplete. Another example of incomplete decomposition is shown in FIG. 34B. If there is a bubble that does not have at least one input and one output then the decomposition is considered incomplete.

Cross-Communication Notation

Data-type issues typically revolve around the concept of data primitive types: integer, real, double, complex, float, string, binary, etc. Groups of data entities are discussed via their dimensionality, as structures, or as structures containing data entities with various dimensionalities. Data primitives, data group structure, and dimensionality all represent a static view of the data. In an MPfd, this information is placed in a table that appears on data flows and data stores. Table 2, below, is an example of a table that provides this information.

TABLE 2

| Variable Name | Variable Description | Variable Type | # Dimensions | Dimension Sizes | Topology |
| --- | --- | --- | --- | --- | --- |

VARIABLE DESCRIPTION

The variable name gives a name to an object for the Decomposition Analysis graph. The description is a text description of the variable just named. The variable type is the data-primitive type. The number of dimensions describes the dimensionality of the variable: 0-dimension means a standard variable, 1-dimension a vector, and >1-dimension a matrix. The dimension size is required for >1-dimensional objects to indicate the number of variable objects that occur in each dimension. The topology explains how the >0-dimensional object treats its space.

The following are potential topologies: unconnected edges: Cartesian; connected edges: 1-dimension (ring), 2-dimensions (cylindrical, toroid, spherical), and 3-dimensions (hyper-cube). The topology information follows the variable.

In computer systems, data is rarely static; it is moved, transformed, combined, taken apart: data in computer systems is typically dynamic. The dynamic use of the data is an attribute that is not typically shown in standard representations of data for computer use. With the advent of parallel processing, the dynamic aspects of the data are needed for the selection of the proper parallel processing technique. Examples of the graphical depiction of possible dynamic data usage are shown below.

Monotonic Data Use

Concept: Linked calculations whose workload grows or shrinks after each calculation.

Use: Whenever the workload changes monotonically for each component calculation in a series of calculations.

Example Use: Arbitrary precision series expansion calculation of transcendental numbers.

Parallel Issue monotonically: Load balancing. Since the workload changes the last calculation has a workload that is very different from the first calculation. Since the computation time of a group of nodes working on a single problem is equal to computation time of the slowest node and, further, since the effect of naively placing the work in the same order as the calculation order is to concentrate the work onto a single node, this produces a non-optimal parallel solution.

Topology Effects: None

Action: Create a mesh to provide load balancing.

Action Example: The purpose of this mesh type is to provide load balancing when there is a monotonic change to the work load as a function of which data item is used. The profiler shall calculate the time it takes to process each element. Below shows a naive attempt to parallelize such a problem. Sixteen work elements are distributed over four computational nodes. The work increases or decreases monotonically with the work-element number. Below is a 1-dimensional example of a naive work distribution of a monotonic workload-changing problem.

TABLE 3

NAIVE WORK DISTRIBUTION OF A MONOTONIC WORKLOAD CHANGING PROBLEM

| | Node # | | | |
|---|---|---|---|---|
| | Node$_1$ | Node$_2$ | Node$_3$ | Node$_4$ |
| Work Elements | 1, 2, 3, 4 | 5, 6, 7, 8 | 9, 10, 11, 12 | 13, 14, 15, 16 |

The mesh shown in Table 3 decomposes the work elements by dividing the number of work elements by the number of nodes and assigning each work element to each node in a linear fashion.

Instead of linearly assigning work elements to nodes, the work elements can be alternated to balance the work. For monotonic workload changes, this means the first and last elements are paired, the second and second-to-last elements are paired, etc., as shown in Table 4:

TABLE 4

NON-NAIVE WORK 1-DIMENSIONAL DISTRIBUTION OF A MONOTONIC WORKLOAD CHANGING PROBLEM

| | Node # | | | |
|---|---|---|---|---|
| | Node$_1$ | Node$_2$ | Node$_3$ | Node$_4$ |
| Work Elements | 1, 16, 2, 15 | 3, 14, 4, 13 | 5, 12, 6, 11 | 7, 10, 8, 9 |

Figure 35:
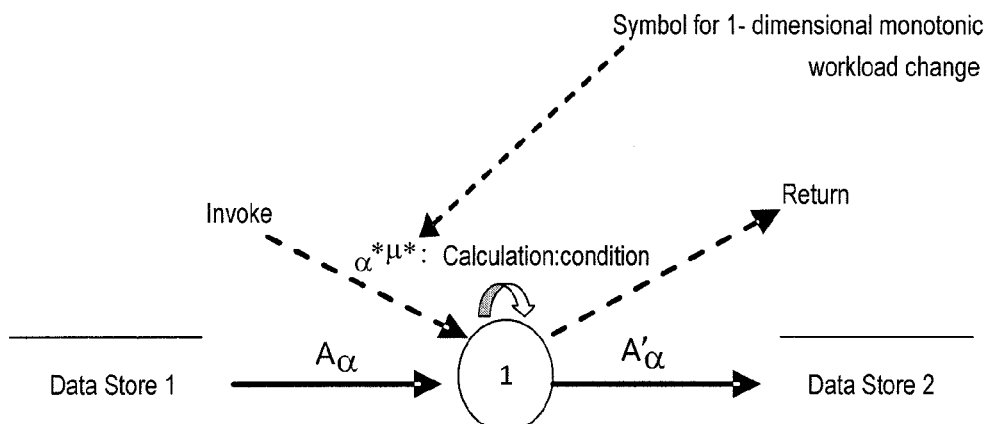
FIG. 35 shows an example of a 1-dimensional monotonic workload symbol, functional decomposition view.

FIG. 35 shows a 1-dimensional monotonic workload symbol in functional decomposition view. If a one-dimensional workload is monotonic, then that information is given to MPfd with the symbols shown in FIG. 35. The symbol $\alpha^{*u*}$ means that the work (represented as the work within a loop) changes monotonically and that this workload effect applies to vector "A". That is, $\alpha^{*\mu*}$ means that index alpha is intended to access the data monotonically. Thus the alpha is the loop index and the *mu* is the intended use of the data accessed using the alpha index.

Figure 36:
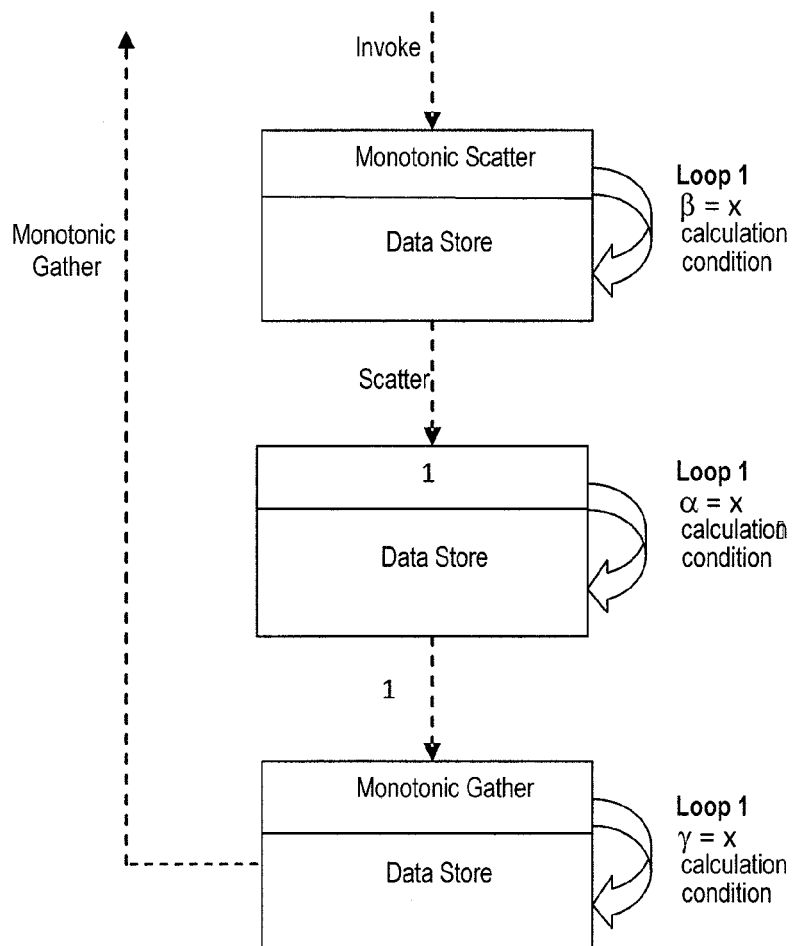
FIG. 36 shows an example of a 1-dimensional monotonic workload symbol, finite state machine view.

Note that, for brevity, the loop is defined by (index:calculation:condition) where the index is the loop index plus any clarifying symbol by the loop index, the calculation is the next index-value calculation, and the condition is the loop-ending condition. FIG. 36 shows a 1-dimensional monotonic workload symbol in finite state machine view. Table 5, below, shows a two-dimensional version of the monotonic workload-changing mesh.

TABLE 5

NON-NAIVE WORK 2-DIMENSIONAL DISTRIBUTION OF A MONOTONIC WORKLOAD CHANGING PROBLEM

| | X1 | | X2 | |
|---|---|---|---|---|
| Y1 | 1, 64, 2, 63 | 3, 62, 4, 61 | 5, 60, 6, 59 | 7, 58, 8, 57 |
| | 9, 56, 10, 55 | 11, 54, 12, 53 | 13, 52, 14, 51 | 15, 50, 16, 49 |
| Y2 | 17, 48, 18, 47 | 19, 46, 20, 45 | 21, 44, 22, 43 | 23, 42, 24, 41 |
| | 25, 40, 26, 39 | 27, 38, 28, 37 | 29, 36, 30, 35 | 31, 34, 32, 33 |

If a two-dimensional workload is monotonic then that information is given to MPfd with the following symbols. The symbol means that the work (represented as the work within a loop) changes monotonically and that this workload effect applies to vector "A".

Figure 37:
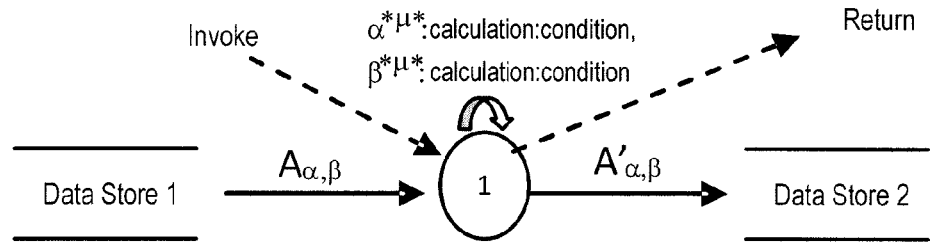
FIG. 37 shows an example of a 2-dimensional monotonic workload symbol, functional decomposition view.
Figure 38:
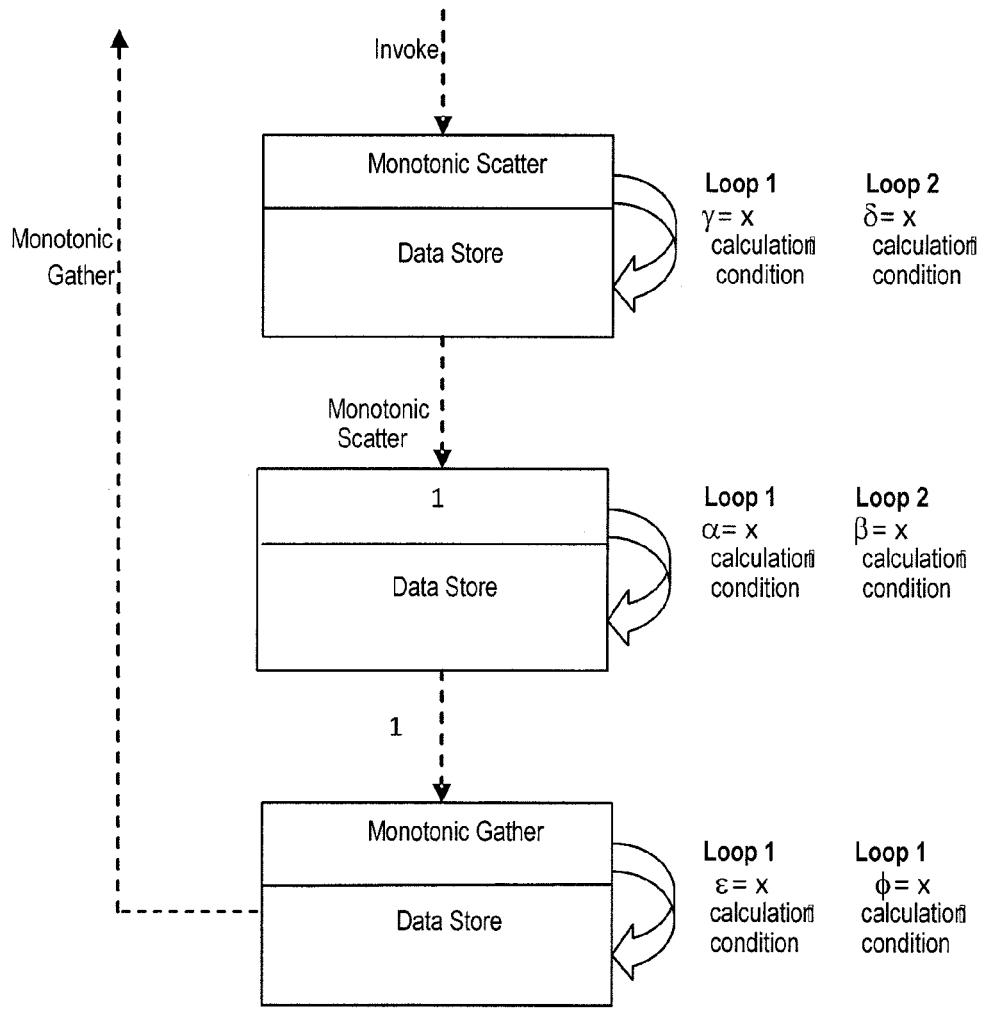
FIG. 38 shows an example of a 2-dimensional monotonic workload symbol, finite state machine view.

FIG. 37 shows a 2-dimensional monotonic workload symbol in functional decomposition view, and FIG. 38 shows a 2-dimensional monotonic workload symbol in finite state machine view.

Table 6, below, shows a three-dimensional version of the monotonic workload-changing mesh.

TABLE 6

NON-NAIVE WORK 2-DIMENSIONAL DISTRIBUTION OF A MONOTONIC WORKLOAD CHANGING PROBLEM

| | X1 | | X2 | |
|---|---|---|---|---|
| Z1 | | | | |
| Y1 | 1, 256, 2, 255 | 3, 254, 4, 253 | 5, 252, 6, 251 | 7, 250, 8, 249 |
| | 9, 248, 10, 247 | 11, 246, 12, 245 | 13, 244, 14, 243 | 15, 242, 16, 241 |
| Y2 | 17, 240, 18, 239 | 19, 238, 20, 237 | 21, 236, 22, 235 | 23, 234, 24, 233 |
| | 25, 232, 26, 231 | 27, 230, 28, 229 | 29, 228, 30, 227 | 31, 226, 32, 225 |
| Z2 | | | | |
| Y1 | 33, 224, 34, 223 | 35, 222, 36, 221 | 37, 220, 38, 219 | 39, 218, 40, 217 |
| | 41, 216, 42, 215 | 43, 214, 44, 213 | 45, 212, 46, 211 | 47, 210, 48, 209 |
| Y2 | 49, 208, 50, 207 | 51, 206, 52, 205 | 53, 204, 54, 203 | 55, 202, 56, 201 |
| | 57, 200, 58, 199 | 59, 198, 60, 197 | 61, 196, 62, 195 | 63, 194, 64, 193 |
| Z3 | | | | |
| Y1 | 65, 192, 66, 191 | 67, 190, 68, 189 | 69, 188, 70, 187 | 71, 186, 72, 185 |
| | 73, 184, 74, 183 | 75, 182, 76, 181 | 77, 180, 78, 179 | 79, 178, 80, 177 |
| Y2 | 81, 176, 82, 175 | 83, 174, 84, 173 | 85, 172, 86, 171 | 87, 170, 88, 169 |
| | 89, 168, 90, 167 | 91, 166, 92, 165 | 93, 164, 94, 163 | 95, 162, 96, 161 |
| Z4 | | | | |
| Y1 | 97, 160, 98, 159 | 99, 158, 100, 157 | 101, 156, 102, 155 | 103, 154, 104, 153 |
| | 105, 152, 106, 151 | 107, 150, 108, 149 | 109, 148, 110, 147 | 111, 146, 112, 145 |
| Y2 | 113, 144, 114, 143 | 115, 142, 116, 141 | 117, 140, 118, 139 | 119, 138, 120, 137 |
| | 121 136, 122, 135 | 123, 134, 124, 133 | 125, 132, 126, 131 | 127, 130, 128, 129 |

Figure 3:
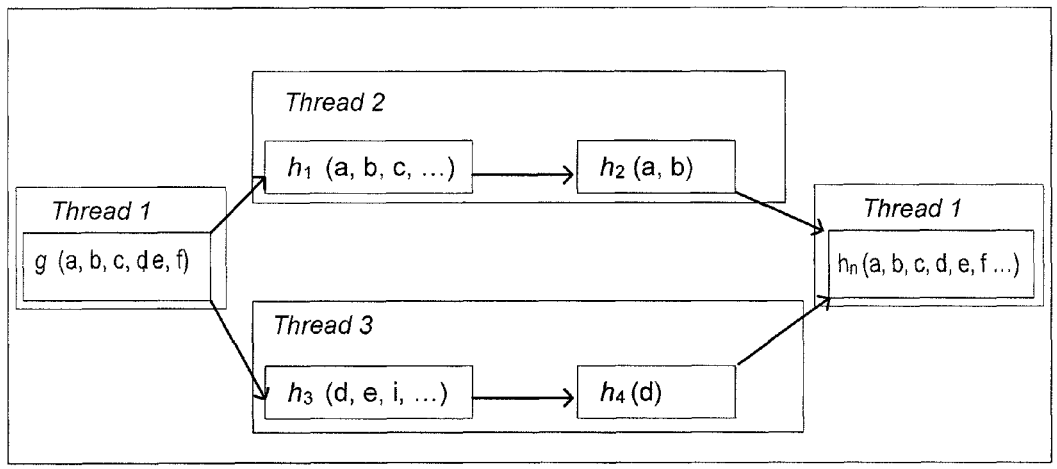
FIG. 3 shows an example of multiple threads from decomposition of function with dissimilar parameters.
Figure 39:
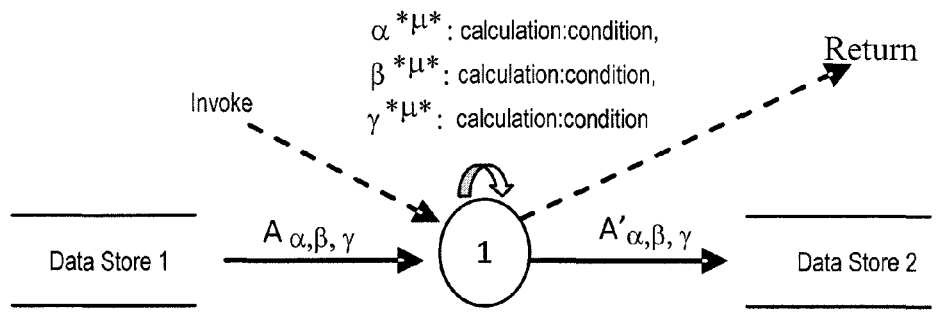
FIG. 39 shows an example of a 3-dimensional monotonic workload symbol, functional decomposition view.
Figure 40:
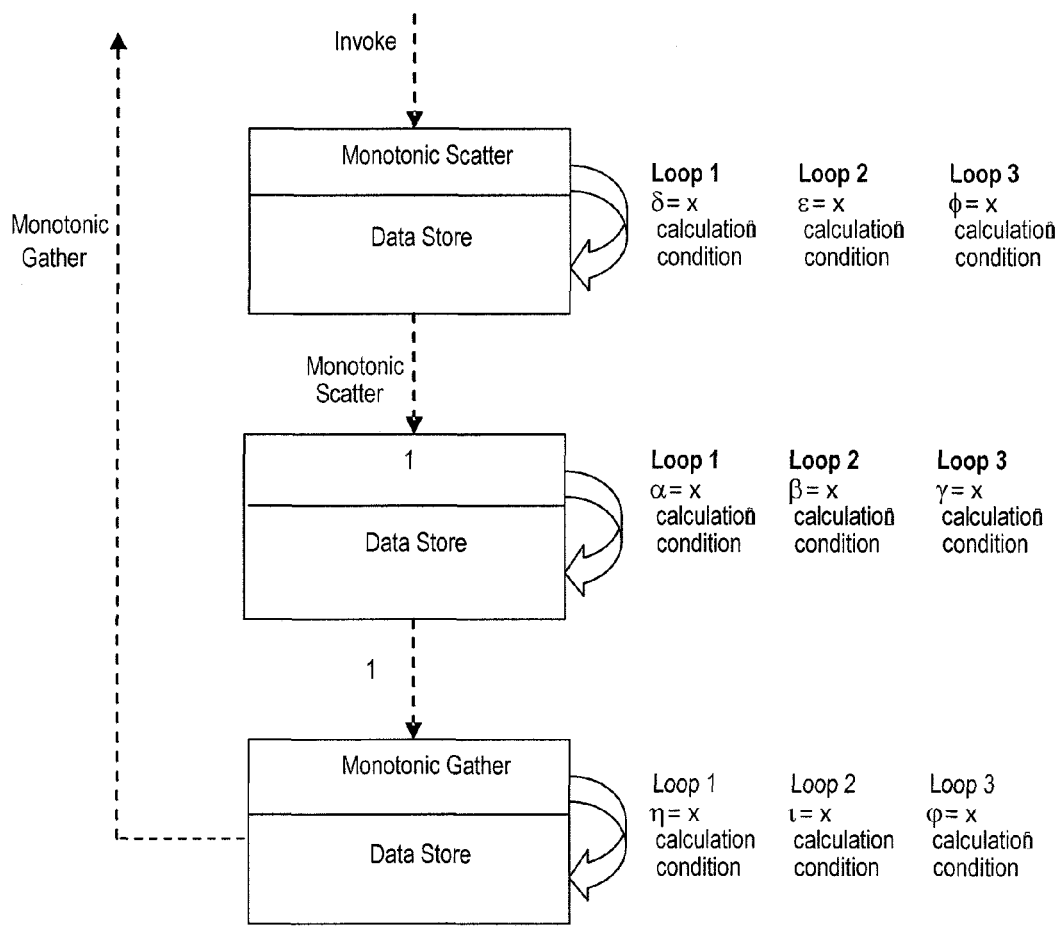
FIG. 40 shows an example of a 3-dimensional monotonic workload symbol, finite state machine view.

FIG. 39 3-dimensional monotonic workload symbol in functional decomposition view, and FIG. 40 shows a 3-dimensional monotonic workload symbol in finite state machine view. If a three-dimensional workload is monotonic then that information is given to MPfd with the symbol shown in FIG. 39. There are three symbols attached to the three loops ($\alpha^{*\mu*}$, $\beta^{*\mu*}$, and $\gamma^{*\mu*}$). These symbols mean that the work (represented as the work within a loop) changes monotonically and that this workload effect applies to vector "A".

Particle Use Model

Concept: Particles are used to define discrete objects that move about a vector or array.

Use: Modeling physical phenomenon, atoms, ray-traces, fluids, etc.

Example Use: Computational fluid dynamics, changing image analysis.

Parallel Issue: Information sharing.

Action: Determine what to cross communicate.

A one-dimensional particle exchange with Cartesian topology generates the following version (shown in Tables 7 and 8) of a left-right exchange.

TABLE 7

INITIAL 1-DIMENSIONAL CONDITION BEFORE LEFT-RIGHT EXCHANGE
(Cartesian Topology)

| | Node # | | | |
|---|---|---|---|---|
| | $Node_1$ | $Node_2$ | $Node_3$ | $Node_4$ |
| Work Elements | 1, 2, 3, 4 | 5, 6, 7, 8, | 9, 10, 11, 12 | 13, 14, 15, 16 |

TABLE 8

1-DIMENSIONAL CONDITION AFTER ONE LEFT-RIGHT EXCHANGE

| | Node # | | | |
|---|---|---|---|---|
| | $Node_1$ | $Node_2$ | $Node_3$ | $Node_4$ |
| Work Elements | 1, 2, 3, 5 | 4, 6, 7, 9, | 8, 10, 11, 13 | 12, 14, 15, 16 |

A one-dimensional particle exchange with a Ring topology generates the following version (shown in Table 9 and 10) of a left-right exchange.

TABLE 9

INITIAL 1-DIMENSIONAL CONDITION BEFORE LEFT-RIGHT EXCHANGE
(Ring Topology)

| | Node # | | | |
|---|---|---|---|---|
| | $Node_1$ | $Node_2$ | $Node_3$ | $Node_4$ |
| Work Elements | 1, 2, 3, 4 | 5, 6, 7, 8 | 9, 10, 11, 12 | 13, 14, 15, 16 |

TABLE 10

1-DIMENSIONAL CONDITION AFTER ONE LEFT-RIGHT EXCHANGE
(Ring Topology)

| | Node # | | | |
|---|---|---|---|---|
| | $Node_1$ | $Node_2$ | $Node_3$ | $Node_4$ |
| Work Elements | 16, 2, 3, 5 | 4, 6, 7, 9 | 8, 10, 11, 13 | 12, 14, 15, 1 |

Note: $Node_4$ edge information wraps around to $node_1$ and $node_1$ wraps around to $node_4$ in the Ring topology version of the left-right exchange.

Figure 41:
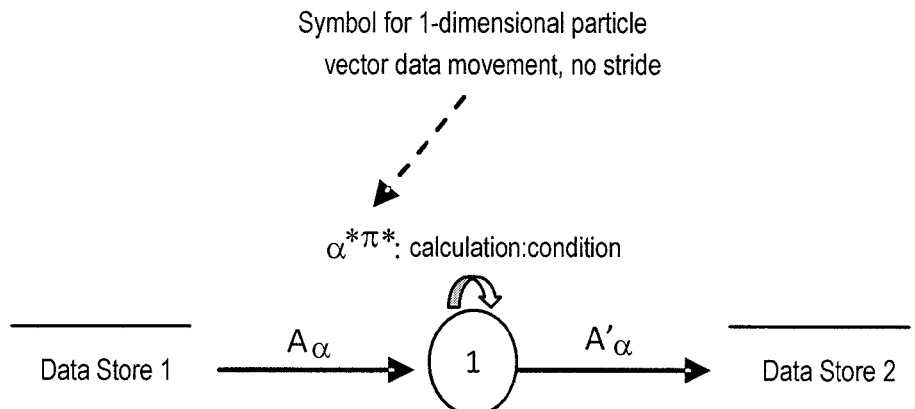
FIG. 41 shows an example of a left-right exchange symbol—no stride, functional decomposition view.
Figure 42:
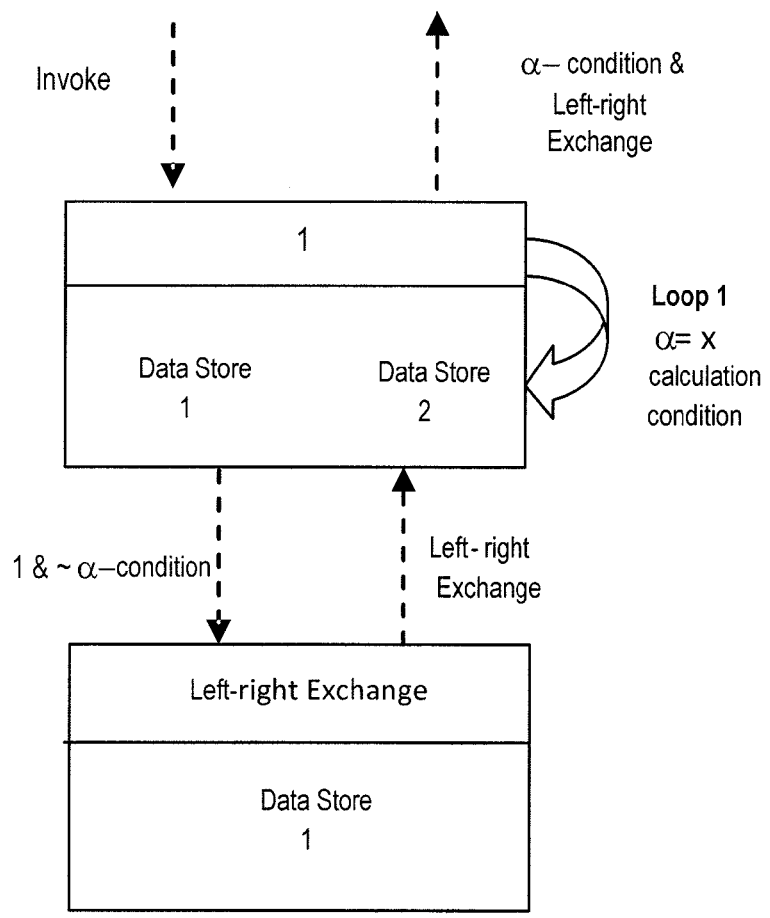
FIG. 42 shows an example of a left-right exchange symbol—no stride, finite state machine view.

FIG. 41 (functional decomposition view) depicts a left-right exchange symbol (*π*) indicating no stride, also shown in the finite state machine view of FIG. 42. If a one-dimensional vector is used to depict particles then the *π* symbol shown in FIG. 41 is used.

Figure 43:
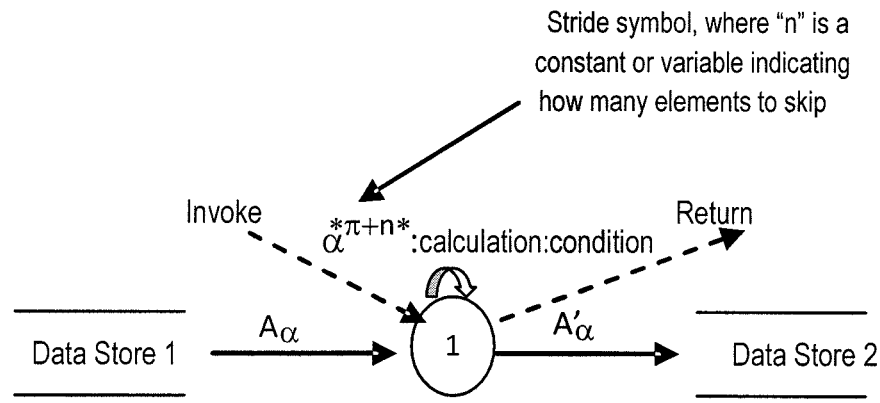
FIG. 43 shows an example of a left-right exchange—with stride, functional decomposition view.
Figure 44:
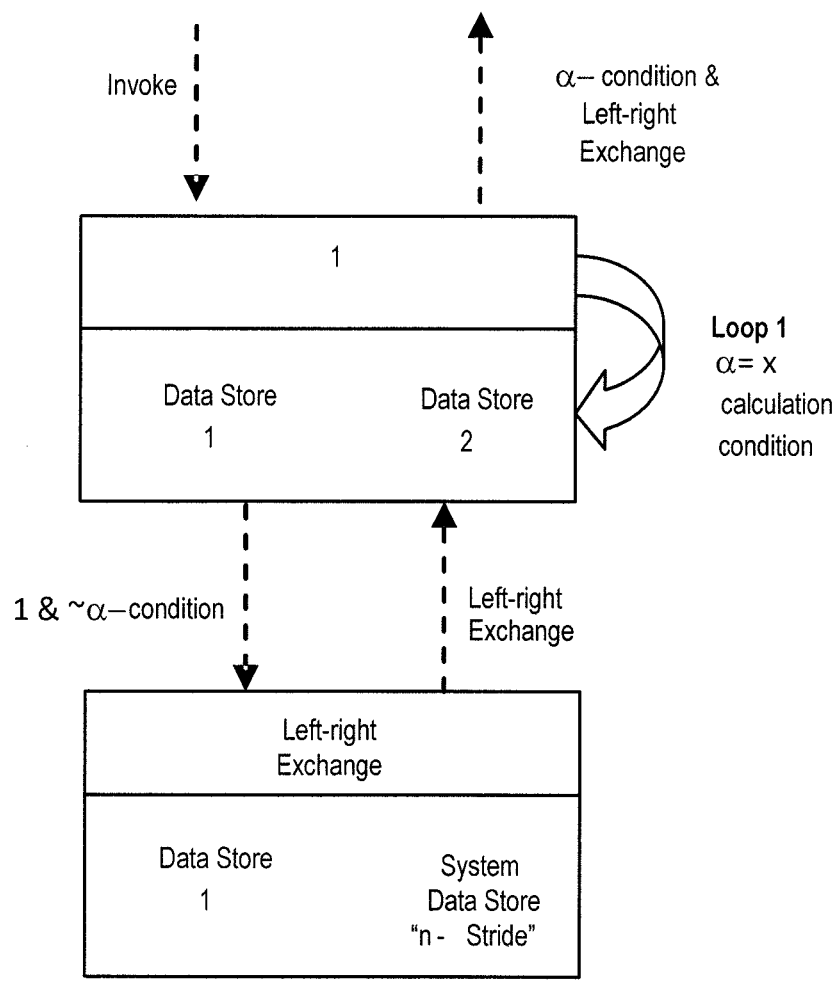
FIG. 44 shows an example of a left-right exchange—with stride, finite state machine view.

If the processing of the vector skips one or more elements (called striding) then less data needs to be exchanged. The index calculation on the loop indicator can be modified to *π+n* to indicate striding. FIG. 43 depicts a left-right exchange—with stride in a functional decomposition view, and FIG. 44 depicts a left-right exchange in finite state machine view.

A two-dimensional particle exchange with Cartesian topology, generates the following version (shown in Table 11 below) of a next-neighbor exchange (edge-number exchange only).

TABLE 11

INITIAL 2-DIMENSIONAL CONDITION BEFORE NEXT-NEIGHBOR EXCHANGE (CARTESIAN TOPOLOGY)

| | X1 | | X2 | |
|---|---|---|---|---|
| Y1 | 1, 2, 3, 4 | 5, 6, 7, 8 | 9, 10, 11, 12 | 13, 14, 15, 16 |
| | 17, 18, 19, 20 | 21, 22, 23, 24 | 25, 26, 27, 28 | 29, 30, 31, 32 |
| Y2 | 33, 34, 35, 36 | 37, 38, 39, 40 | 41, 42, 43, 44 | 45, 46, 47, 48 |
| | 49, 50, 51, 52 | 53, 54, 55, 56 | 57, 58, 59, 60 | 61, 62, 63, 64 |

TABLE 12

2-DIMENSIONAL CONDITION AFTER ONE NEXT-NEIGHBOR EXCHANGE (CARTESIAN TOPOLOGY)

| | X1 | | X2 | |
|---|---|---|---|---|
| Y1 | 1, 2, 3, 4 | 5, 6, 7, 9 | 8, 10, 11, 12 | 13, 14, 15, 16 |
| | 33, 34, 35, 36 | 37, 38, 39, (25, 41, 40) | (24, 41, 40), 42, 43, 44 | 45, 46, 47, 48 |
| Y2 | 17, 18, 19, 20 | 21, 22, 23, (24, 25, 41) | (40, 24, 25), 26, 27, 28 | 29, 30, 31, 32 |
| | 49, 50, 51, 52 | 53, 54, 55, 57 | 56, 58, 59, 60 | 61, 62, 63, 64 |

Note: Parenthesis indicates that the information here is overlaid such that the underlying code treats it as if it were adjacent memory.

A two-dimensional particle exchange with Cylindrical topology generates the following version (shown in Tables 13 and 14) of a next-neighbor exchange (edge-number exchange only).

TABLE 13

INITIAL 2-DIMENSIONAL CONDITION BEFORE NEXT-NEIGHBOR EXCHANGE (CYLINDRICAL TOPOLOGY)

| | X1 | | X2 | |
|---|---|---|---|---|
| Y1 | 1, 2, 3, 4 | 5, 6, 7, 8 | 9, 10, 11, 12 | 13, 14, 15, 16 |
| | 17, 18, 19, 20 | 21, 22, 23, 24 | 25, 26, 27, 28 | 29, 30, 31, 32 |
| Y2 | 33, 34, 35, 36 | 37, 38, 39, 40 | 41, 42, 43, 44 | 45, 46, 47, 48 |
| | 49, 50, 51, 52 | 53, 54, 55, 56 | 57, 58, 59, 60 | 61, 62, 63, 64 |

TABLE 14

2-DIMENSIONAL CONDITION AFTER ONE NEXT-NEIGHBOR EXCHANGE (CYLINDRICAL TOPOLOGY)

| | X1 | | X2 | |
|---|---|---|---|---|
| Y1 | 49, 50, 51, 52 | 53, 54, 55, (9, 56, 57) | (8, 57, 56), 58, 59, 60 | 61, 62, 63, 64 |
| | 33, 34, 35, 36 | 37, 38, 39, (25, 41, 40) | (24, 41, 40), 42, 43, 44 | 45, 46, 47, 48 |
| Y2 | 17, 18, 19, 20 | 21, 22, 23, (24, 25, 41) | (40, 24, 25), 26, 27, 28 | 29, 30, 31, 32 |
| | 1, 2, 3, 4 | 5, 6, 7, (8, 57, 9) | (56, 9, 8), 10, 11, 12 | 13, 14, 15, 16 |

A two-dimensional particle exchange with Toroid topology generates the version of a next-neighbor exchange (edge-number exchange only) shown in Tables 15 and 16 below.

TABLE 15

INITIAL 2-DIMENSIONAL CONDITION BEFORE NEXT-NEIGHBOR EXCHANGE (TOROID TOPOLOGY)

| | X1 | | X2 | |
|---|---|---|---|---|
| Y1 | 1, 2, 3, 4 | 5, 6, 7, 8 | 9, 10, 11, 12 | 13, 14, 15, 16 |
| | 17, 18, 19, 20 | 21, 22, 23, 24 | 25, 26, 27, 28 | 29, 30, 31, 32 |
| Y2 | 33, 34, 35, 36 | 37, 38, 39, 40 | 41, 42, 43, 44 | 45, 46, 47, 48 |
| | 49, 50, 51, 52 | 53, 54, 55, 56 | 57, 58, 59, 60 | 61, 62, 63, 64 |

TABLE 16

2-DIMENSIONAL CONDITION AFTER ONE NEXT-NEIGHBOR EXCHANGE (Toroid Topology)

| | X1 | | X2 | |
|---|---|---|---|---|
| Y1 | (49, 16), 50, 51, 52 | 53, 54, 55, (9, 56, 57) | (8, 57, 56), 58, 59, 60 | 61, 62, 63, (64, 1) |
| | (33, 32), 34, 35, 36 | 37, 38, 39, (25, 41, 40) | (24, 41, 40), 42, 43, 44 | 45, 46, 47, (48, 17) |
| Y2 | (17, 48), 18, 19, 20 | 21, 22, 23, (24, 25, 41) | (40, 24, 25), 26, 27, 28 | 29, 30, 31, (32, 33) |
| | (1, 64), 2, 3, 4 | 5, 6, 7, (8, 57, 9) | (56, 9, 8), 10, 11, 12 | 13, 14, 15, (16, 49) |

Figure 45:
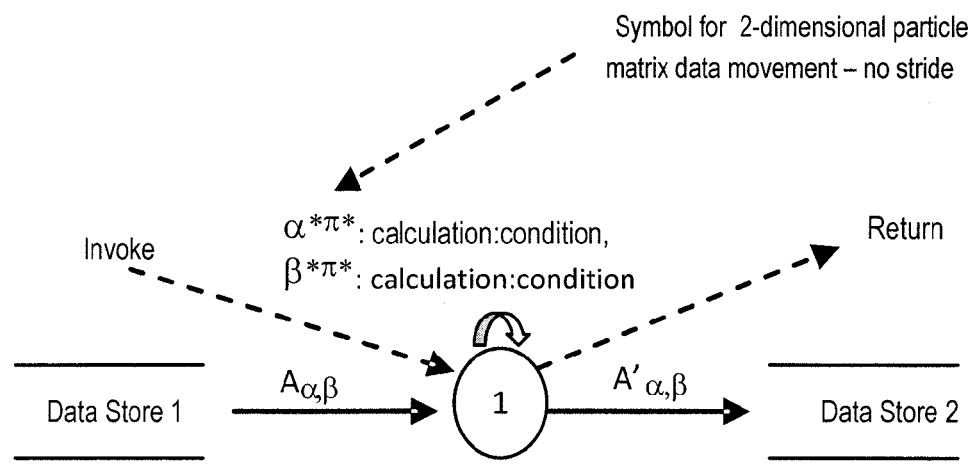
FIG. 45 shows an example of a next-neighbor exchange symbol—no stride, functional decomposition view.
Figure 46:
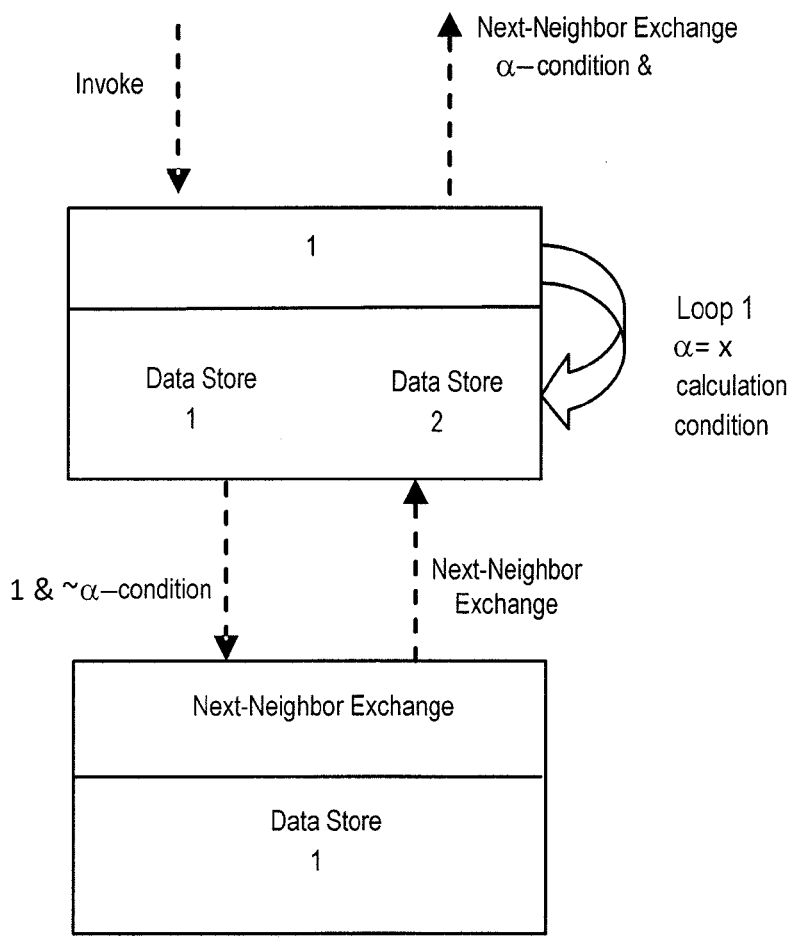
FIG. 46 shows an example of a next-neighbor exchange—no stride, finite state machine view.
Figure 47:
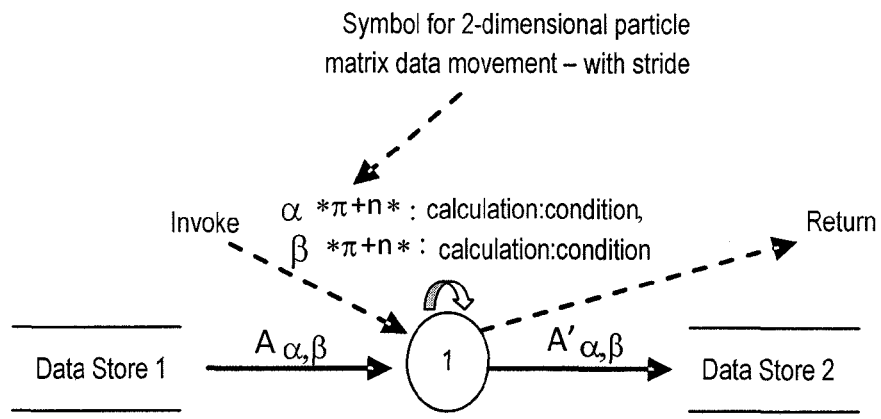
FIG. 47 shows an example of a next-neighbor exchange symbol—with stride, functional decomposition view.
Figure 48:
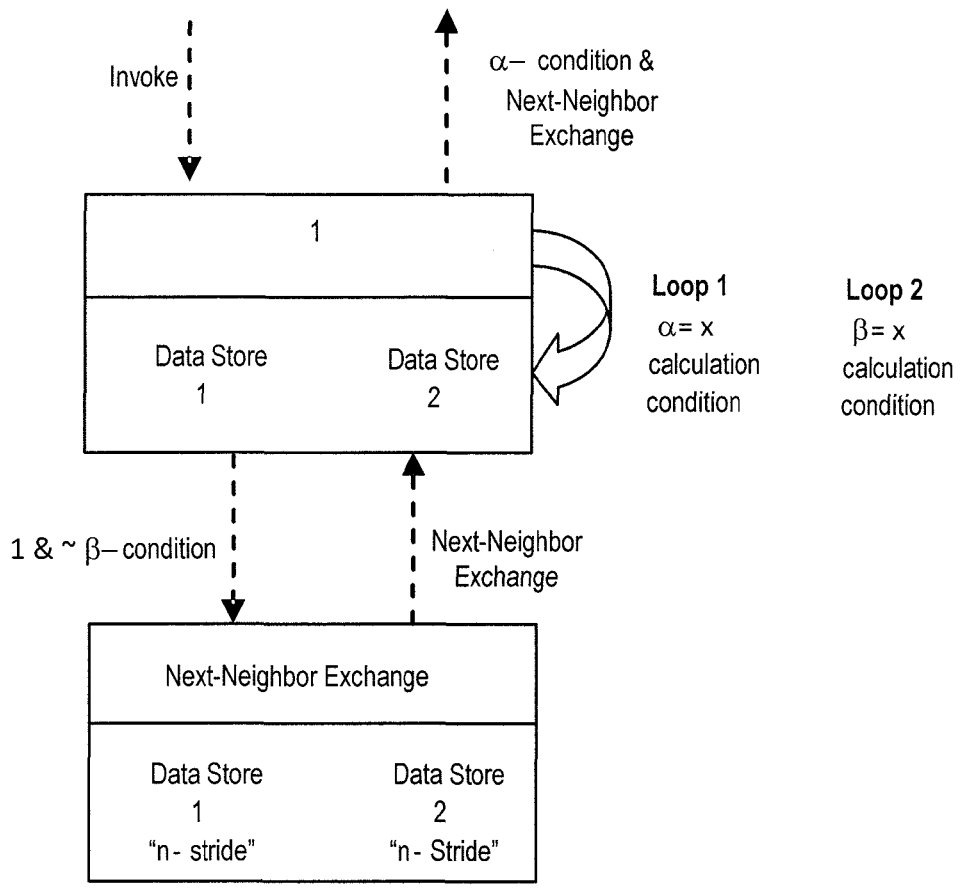
FIG. 48 shows an example of a next-neighbor exchange—with stride, finite state machine view.

FIG. 45 shows a next-neighbor exchange—no stride, in functional decomposition view; FIG. 46 shows a next-neighbor exchange—no stride, in finite state machine view; FIG. 47 shows a next-neighbor exchange symbol—with stride, in functional decomposition view; and FIG. 48 shows a next-neighbor exchange—with stride, in finite state machine view. If a two-dimensional matrix is used to depict particles then the symbol shown in FIGS. 45/47 is used. A new state is automatically added when the system recognizes that a next neighbor exchange is to be used. The data exchange is modified with the "stride" information indicating how much data to skip with each exchange.

A three-dimensional particle exchange with Cartesian topology generates the version of a next-neighbor exchange (edge-number exchange only) shown in Tables 17 and 18, below.

TABLE 17

INITIAL 3-DIMENSIONAL CONDITIONS BEFORE NEXT-NEIGHBOR EXCHANGE (CYLINDRICAL TOPOLOGY)

| | X1 | | X2 | |
|---|---|---|---|---|
| Z1 | | | | |
| Y1 | 1, 2, 3, 4 | 5, 6, 7, 8 | 9, 10, 11, 12 | 13, 14, 15, 16 |
| | 17, 18, 19, 20 | 21, 22, 23, 24 | 25, 26, 27, 28 | 29, 30, 31 32 |
| Y2 | 33, 34, 35, 36 | 37, 38, 39, 40 | 41, 42, 43, 44 | 45, 46, 47, 48 |
| | 49, 50, 51, 52 | 53, 54, 55, 56 | 57, 58, 59, 60 | 61, 62, 63, 64 |
| Z2 | | | | |
| Y1 | 65, 66, 67, 68 | 69, 70, 71, 72 | 73, 74, 75, 76 | 77, 78, 79, 80 |
| | 81, 82, 83, 84 | 85, 86, 87, 88 | 89, 90, 91, 92 | 93, 94, 95, 96 |
| Y2 | 97, 98, 99, 100 | 101, 102, 103, 104 | 105, 106, 107, 108 | 109, 110, 111, 112 |
| | 113, 114, 115, 116 | 117, 118, 119, 120 | 121, 122, 123, 124 | 125, 126, 127, 128 |
| Z3 | | | | |
| Y1 | 129, 130, 131, 132 | 133, 134, 135, 136 | 137, 138, 139, 140 | 141, 142, 143, 144 |
| | 145, 146, 147, 148 | 149, 150, 151, 152 | 153, 154, 155, 156 | 157, 158, 159, 160 |
| Y2 | 161, 162, 163, 164 | 165, 166, 167, 168 | 169, 170, 171, 172 | 173, 174, 175, 176 |
| | 177, 178, 179, 180 | 181, 182, 183, 184 | 185, 186, 187, 188 | 189, 190, 191, 192 |
| Z4 | | | | |
| Y1 | 193, 194, 195, 196 | 197, 198, 199, 200 | 201, 202, 203, 204 | 205, 206, 207, 208 |
| | 209, 210, 211, 212 | 213, 214, 215, 216 | 217, 218, 219, 220 | 221, 222, 223, 224 |
| Y2 | 225, 226, 227, 228 | 229, 230, 231, 232 | 233, 234, 235, 236 | 237, 238, 239, 240 |
| | 241, 242, 243, 244 | 245, 246, 247, 248 | 249, 250, 251, 252 | 253, 254, 255, 256 |

TABLE 18

DIMENSIONAL CONDITION AFTER ONE NEXT-NEIGHBOR EXCHANGE (Cartesian Topology)

| | X1 | | X2 | |
|---|---|---|---|---|
| Z1 | | | | |
| Y1 | 65, 66, 67, 68 | 69, 70, 71, (9, 72) | (8, 73), (10, 74), (11, 75), (12, 76) | (13, 77), (14, 78), (15, 79), (16, 80) |
| | 81, 82, 83, 84 | 85, 86, 87, (25, 40, 41, 88) | (24, 40, 41, 89), (42, 90), (43, 91), (44, 92) | (45, 93), (46, 94), 47, 95), (48, 96) |

TABLE 18-continued

DIMENSIONAL CONDITION AFTER ONE NEXT-NEIGHBOR EXCHANGE
(Cartesian Topology)

| | X1 | | X2 | |
|---|---|---|---|---|
| Y2 | (17, 97), | (21, 101), | (24, 25, 40, 105), | (29, 109), |
| | (18, 98), | (22, 102), | (26, 106), | (30, 110), |
| | (19, 99), | (23, 103), | (27, 107), | (31, 111), |
| | (20, 100) | (24, 25, 41, 104) | (28, 108) | (32, 112) |
| | 113, | 117, | (56, 121), | 125, |
| | 114, | 118, | 122, | 126, |
| | 115, | 119, | 123, | 127, |
| | 116 | (57, 120) | 124 | 128 |
| Z2 | | | | |
| Y1 | (65, 1, 129), | (69, 5, 133), | (72, 9, 137), | (77, 13, 141), |
| | (66, 2, 130), | (70, 6, 134), | (10, 74, 138), | (78, 14, 142), |
| | (67, 3, 131), | (71, 7, 135), | (75, 11, 139), | (79, 15, 143), |
| | (68, 4, 132) | (73, 8, 136) | (76, 12, 140) | (80, 16, 144) |
| | (97, 17, 129)(98, 18, 130), (99, 19, 131), | (101, 21, 133), (102, 22, 134), (103, 23, 135), | (104, 105, 88, 25, 153), (106, 26, 154), (107, 27, 155), | (109, 29, 157), (110, 30, 158), (111, 31, 159), |
| | (100, 20, 132) | (104, 89, 105, 24, 136) | (108, 28, 156) | (112, 32, 160) |
| Y2 | (81, 33, 161), | (85, 37, 165), | (89, 104, 88, 41, 169), | (93, 45, 173), |
| | (82, 34, 162), | (86, 38, 166), | (90, 42, 170), | (94, 46, 174), |
| | (83, 35, 163), | (87, 39, 167), | (91, 43, 171), | (95, 47, 175), |
| | (84, 36, 164) | (88, 40, 168, 89, 105) | (92, 44, 172) | (96, 48, 176) |
| | (113, 49, 177), | (117, 53, 181), | (120, 57, 185), | (125, 61, 189), |
| | (114, 50, 178), | (118, 54, 182), | (122, 58, 186), | (126, 62, 190), |
| | (115, 51, 179), | (119, 55, 183), | (123, 59, 187), | (127, 191), |
| | (116, 52, 180) | (121, 56, 184) | (124, 60, 188) | (128, 64, 192) |
| Z3 | | | | |
| Y1 | (129, 65, 193), | (133, 69, 197), | (136, 73, 201), | (141, 77, 205), |
| | (130, 66, 194), | (134, 70, 198), | (138, 74, 202), | (142, 78, 206), |
| | (131, 67, 195), | (135, 71, 199), | (139, 75, 203), | (143, 79, 207), |
| | (132, 68, 196) | (137, 72, 200) | (140, 76, 204) | (144, 80, 208) |
| | (161, 81, 209), | (165, 85, 213), | (169, 152, 168, 89, 217), | (173, 93, 221), |
| | (162, 82, 210), | (166, 86, 214), | (170, 90, 218), | (174, 94, 222), |
| | (163, 83, 211), | (167, 87, 215), | (171, 91, 219), | (175, 95, 223), |
| | (164, 84, 212) | (168, 153, 169, 88, 216) | (172, 92, 220) | (176, 96, 223) |
| Y2 | (145, 97, 225), | (149, 101, 229), | (153, 152, 168, 105, 233), | (157, 109, 237), |
| | (146, 98, 226), | (150, 102, 230), | (154, 106, 234), | (158, 110, 238), |
| | (147, 99, 227), | (151, 103, 231), | (155, 107, 235), | (159, 111, 239), |
| | (148, 100, 228) | (152, 104, 232, 153, 169) | (156, 108, 236) | (160, 112, 240) |
| | (177, 113, 241), | (181, 117, 245), | (184, 121, 249), | (189, 125, 252), |
| | (178, 114, 242), | (182, 118, 246), | (186, 122, 249), | (190, 126, 253), |
| | (179, 115, 243), | (183, 119, 247), | (187, 123, 250), | (191, 127, 254), |
| | (180, 116, 244) | (185, 120, 248) | (188, 124, 251) | (192, 128, 255) |
| Z4 | | | | |
| Y1 | (193, 129), | (197, 133), | (200, 137), | (205, 141), |
| | (194, 130), | (198, 134), | (202, 138), | (206, 142), |
| | (195, 131), | (199, 135), | (203, 139), | (207, 143), |
| | (196, 132) | (201, 136) | (204, 140) | (208, 144) |
| | (225, 145), | (229, 149), | (233, 232, 216, 153), | (237, 157), |
| | (226, 146), | (230, 150), | (234, 154), | (238, 158), |
| | (227, 147), | (231, 151), | (235, 155), | (239, 159), |
| | (228, 148) | (232, 217, 233, 152) | (236, 156) | (240, 160) |
| Y2 | (209161), | (213, 165), | (217, 232, 216, 169), | (221, 173), |
| | (210, 162), | (214, 166), | (218, 170), | (222, 174), |
| | (211, 163), | (215, 167), | (219, 171), | (223, 175), |
| | (212, 164) | (216, 168, 217, 233) | (220, 172) | (224, 176) |
| | (241, 177), | (245, 181), | (248, 185), | (253, 189), |
| | (242, 178), | (246, 182), | (250, 186), | (254, 190), |
| | (243, 179), | (247, 183), | (251, 187), | (255, 191), |
| | (244, 180) | (249, 184) | (252, 188) | (256, 192) |

Figure 49:
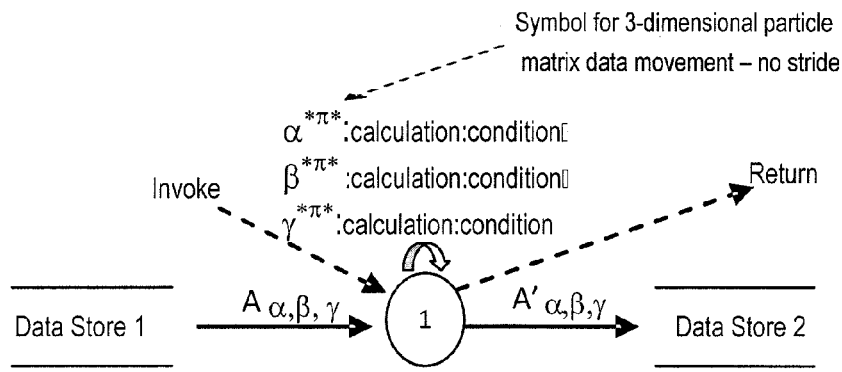
FIG. 49 shows an example of a 3-dimensional next-neighbor exchange symbol—no stride, functional decomposition view.
Figure 50:
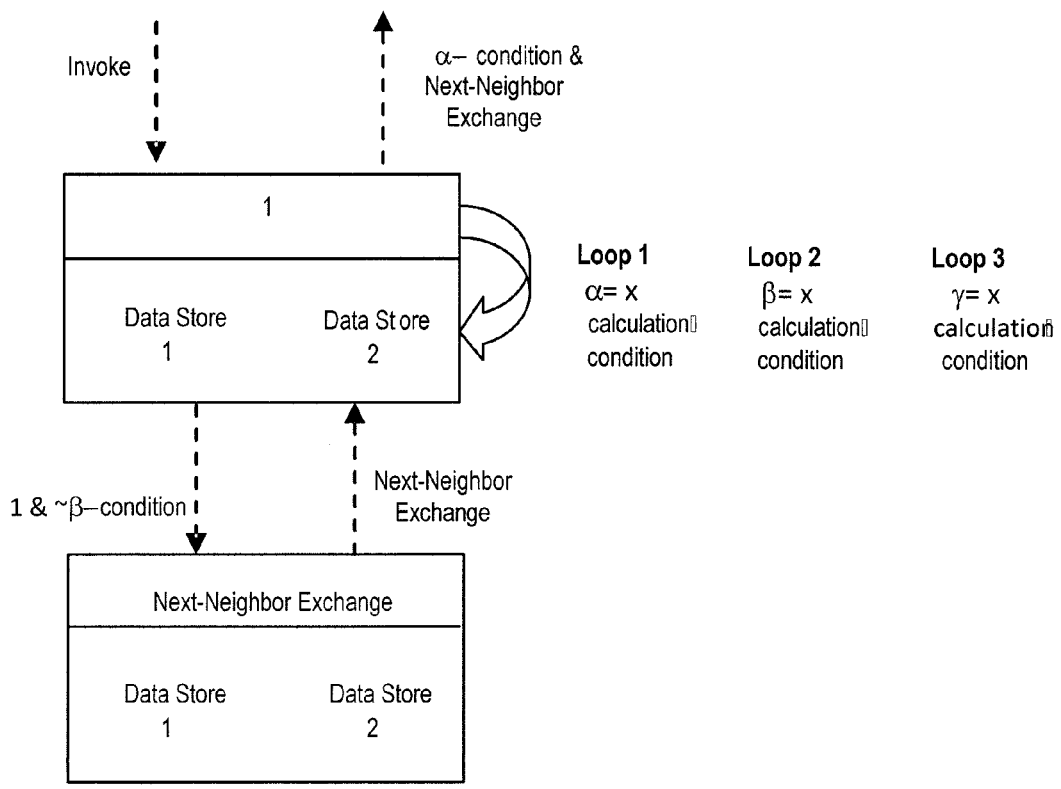
FIG. 50 shows an example of a 3-dimensional next-neighbor exchange—no stride, finite state machine view.
Figure 51:
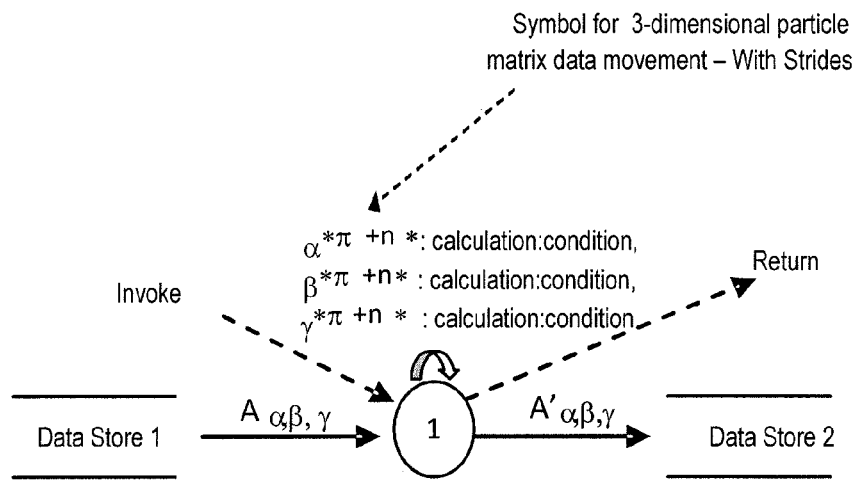
FIG. 51 shows an example of a 3-dimensional next-neighbor exchange symbol—with stride, functional decomposition view.
Figure 52:
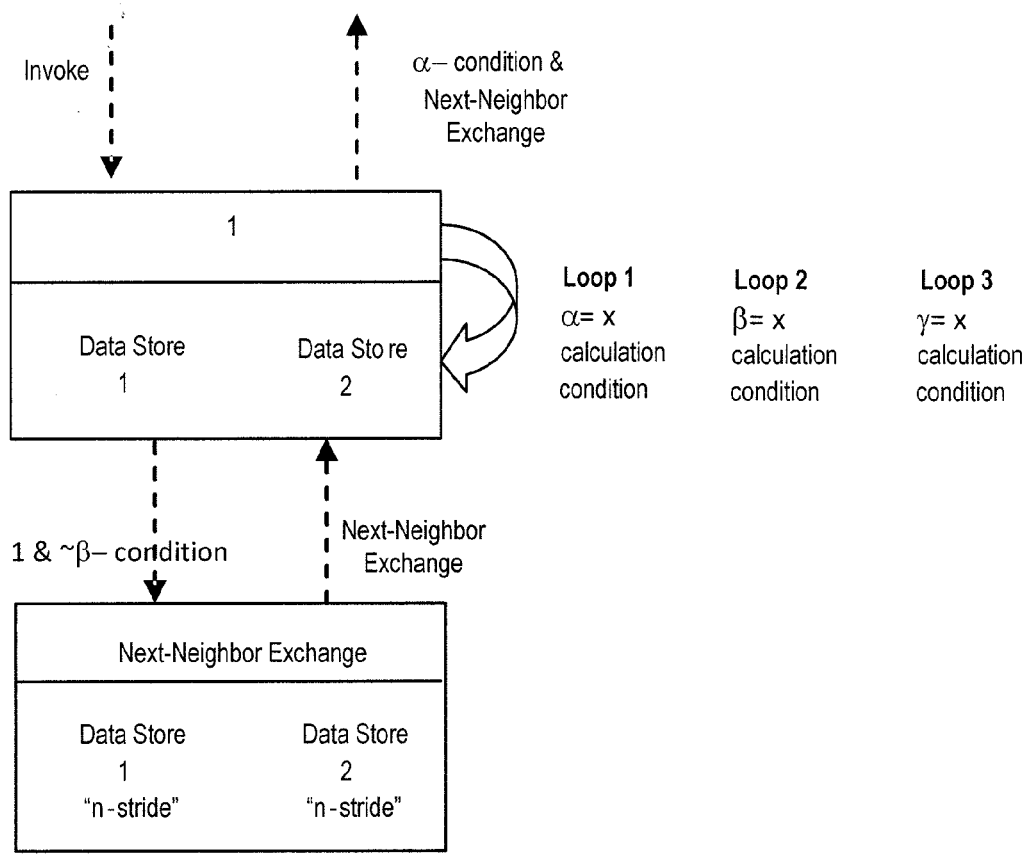
FIG. 52 shows an example of a 3-dimensional next-neighbor exchange—with stride, finite state machine view.

FIG. 49 shows a 3-dimensional next-neighbor exchange symbol [* *] indicating no stride, in functional decomposition view; FIG. 50 shows a 3-dimensional next-neighbor exchange—no stride, in finite state machine view; FIG. 51 shows a 3-dimensional next-neighbor exchange—with stride, in functional decomposition view; and FIG. 52 shows a 3-dimensional next-neighbor exchange—with stride, in finite state machine view. If a three-dimensional matrix is used to depict particles, then the symbol shown in FIG. 49 is used.

Figure 53:
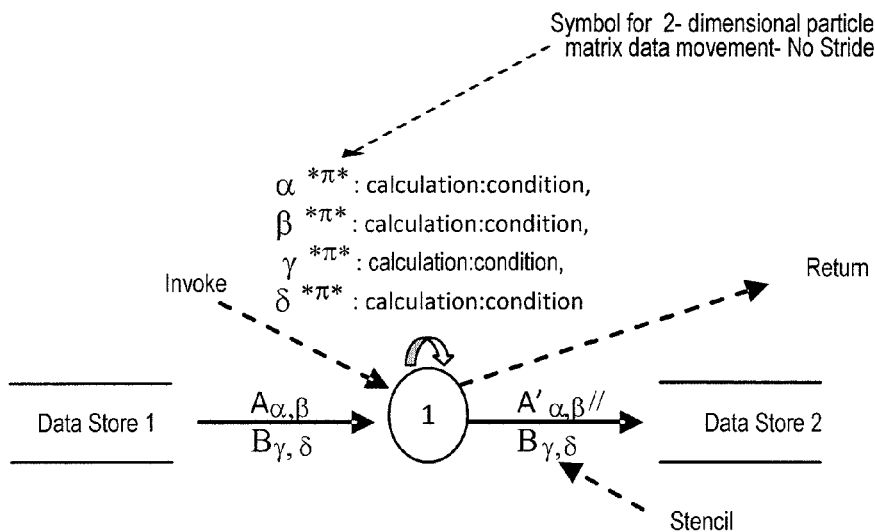
FIG. 53 shows an example of a 2-dimensional matrix with 2-dimensional stencil for 2-d next-n-neighbor exchange symbol—no stride, functional decomposition view.
Figure 54:
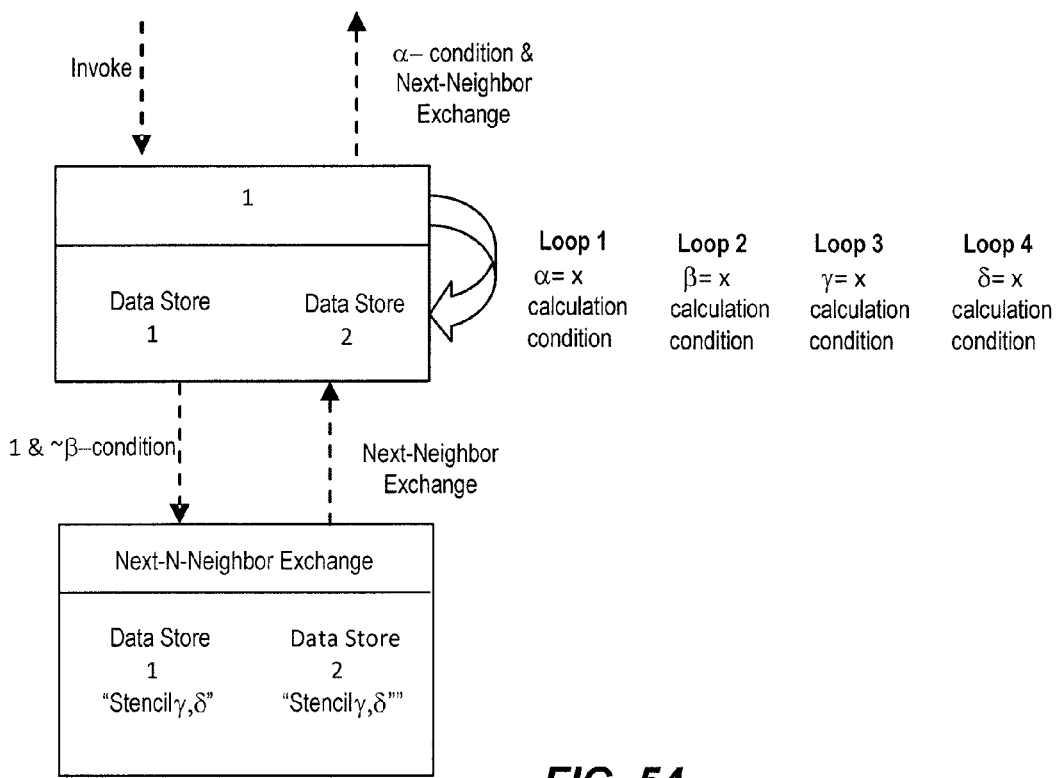
FIG. 54 shows an example of a 2-dimensional matrix with 2-dimensional stencil for 2-d next-n-neighbor exchange—no stride, finite state machine view.
Figure 55:
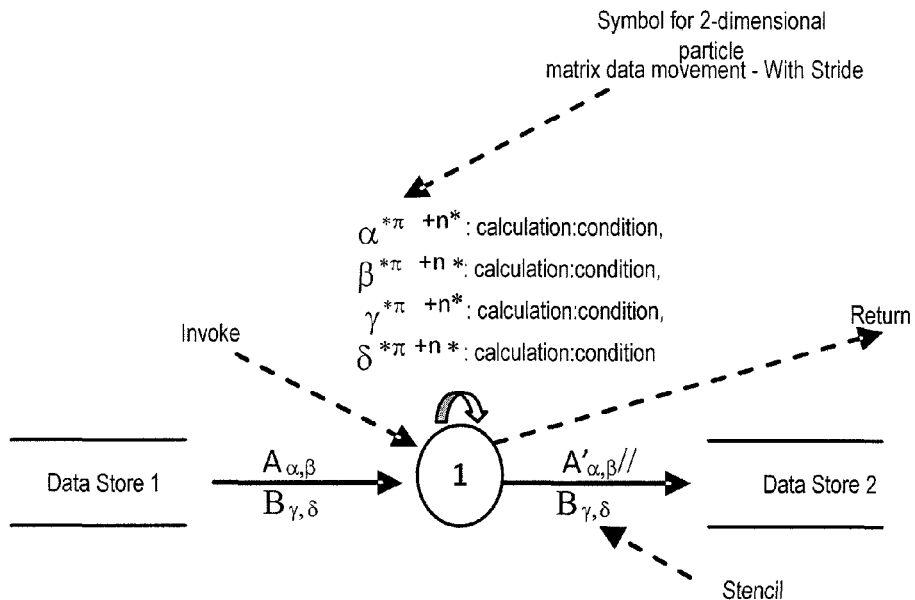
FIG. 55 shows an example of a 2-dimensional matrix with 2-dimensional stencil for 2-d next-n-neighbor exchange symbol—with stride, functional decomposition view.

FIG. 53 shows a 2-dimensional matrix with 2-dimensional stencil for 2-d next-n-neighbor exchange symbol—no stride, in functional decomposition view; FIG. 54 shows a 2-dimensional matrix with 2-dimensional stencil for 2-d next-n-neighbor exchange—no stride, in finite state machine view; and FIG. 55 shows a 2-dimensional matrix with 2-dimensional stencil for 2-d next-n-neighbor exchange symbol—with stride, in functional decomposition view. The next-neighbor exchange can be extended to a next-n-neighbor exchange. Frequently, the depth of the exchange is a function of some size of the stencil that is applied to it. The exchange will consist of using the number of elements along the dimension of the exchange found in the stencil. If the number of elements is greater than the discretization size then the data must be shared across multiple nodes. Since the stencil is itself a vector or matrix, the symbol for a two-dimensional matrix with a two-dimensional stencil (shown in FIG. 53) can be used to generate a next-n-neighbor exchange.

Figure 56:
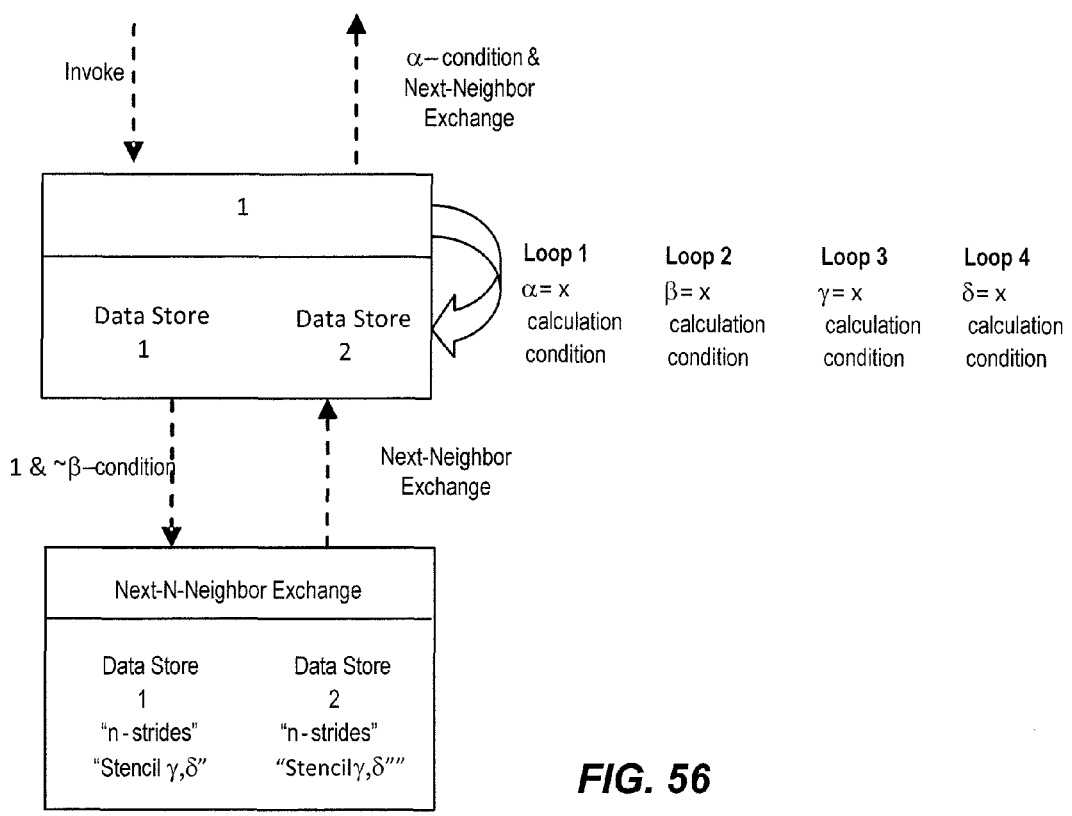
FIG. 56 shows an example of a 2-dimensional matrix with 2-dimensional stencil for 2-d next-n-neighbor exchange—with stride, finite state machine view.

FIG. 56 shows a 2-dimenssional matrix with 2-dimensional stencil for 2-d next-n-neighbor exchange—with stride, in finite state machine view. Since B cannot change (depicted by the lack of an accent mark) and has the same number of dimensions as A', it is assumed to be a stencil. Note that the stencil must be smaller than the processed vector or matrix in every dimension; otherwise, it is considered a non-stenciled matrix operation, and the next-n-matrix does not apply.

Field Use Model

Concept: A field affects everything at once so if the field is distributed over multiple nodes then everything must communicate with everything.

Use: Modeling physical phenomenon.

Example Use: Gravity modeling.

Parallel Issue: Information exchange.

Action: Determine what to cross communicate.

Action Example Perform an all-to-all exchange of data.

Figure 57:
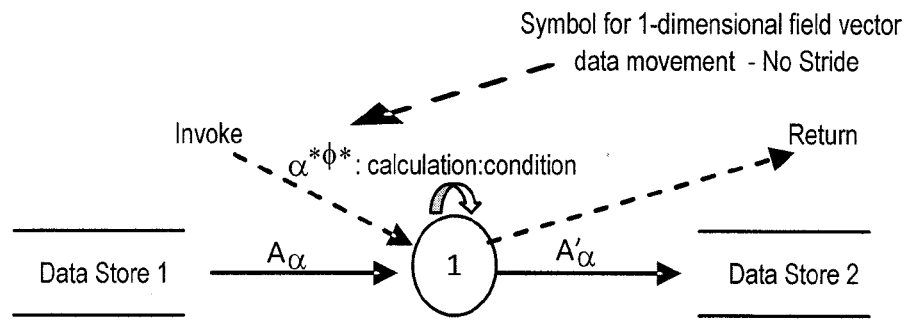
FIG. 57 shows an example of a 1-dimensional all-to-all exchange symbol—no stride, functional decomposition view.
Figure 58:
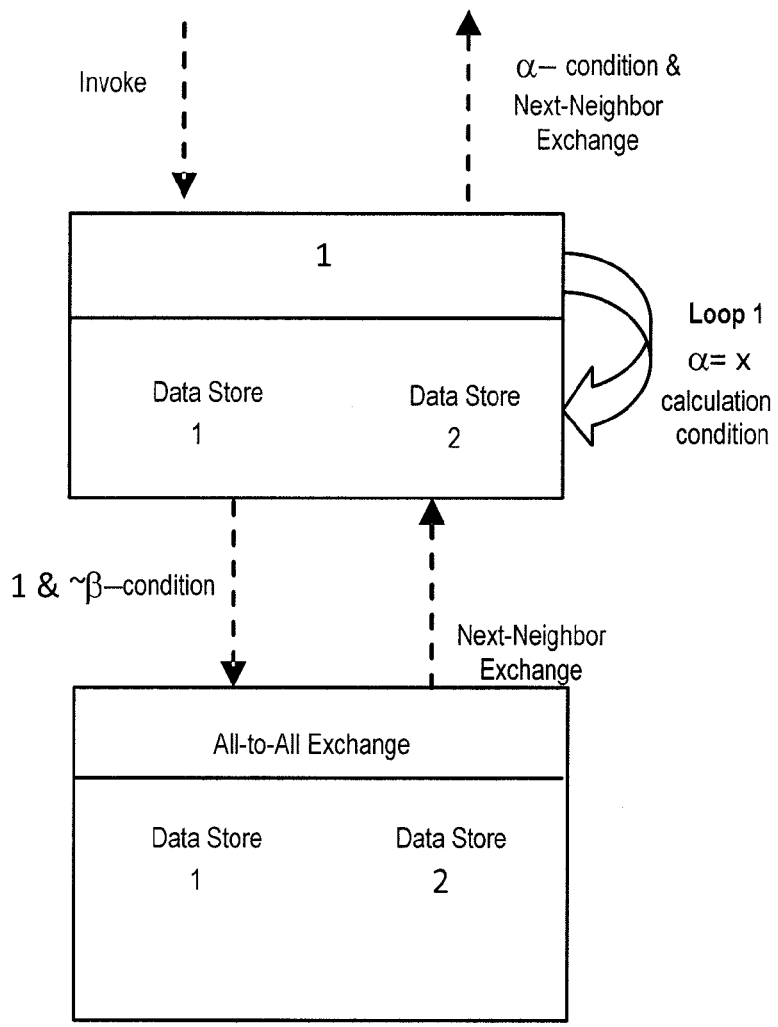
FIG. 58 shows an example of a 1-dimensional all-to-all exchange—no stride, finite state machine view.
Figure 59:
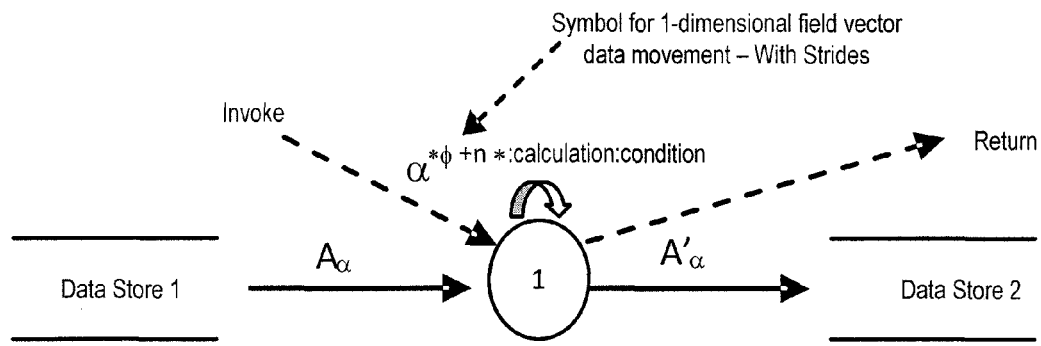
FIG. 59 shows an example of a 1-dimensional all-to-all exchange symbol—with stride, functional decomposition view.
Figure 60:
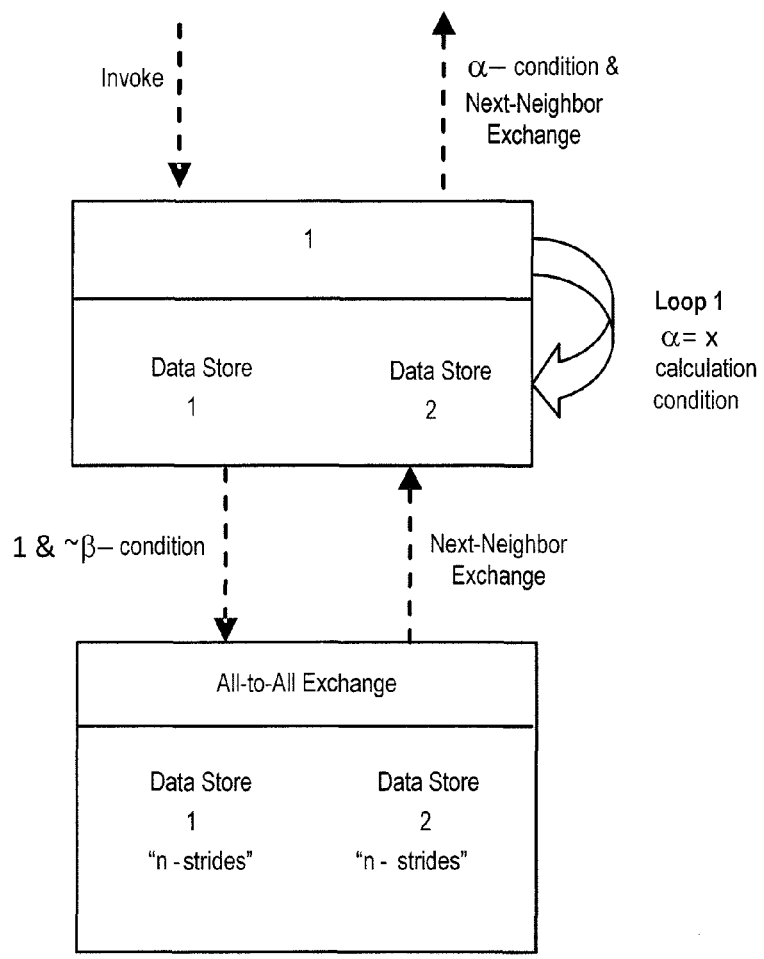
FIG. 60 shows an example of a 1-dimensional all-to-all exchange—with stride, finite state machine view.

FIG. 57 shows a 1-dimensional all-to-all exchange symbol—no stride, in functional decomposition view; FIG. 58 shows a 1-dimensional all-to-all exchange—no stride, in finite state machine view; FIG. 59 shows a 1-dimensional all-to-all exchange symbol—with stride, in functional decomposition view; FIG. 60 shows a 1-dimensional all-to-all exchange—with stride, in finite state machine view; and If a one-dimensional vector is used to depict a field then the symbol shown in FIG. 57 is used.

Figure 61:
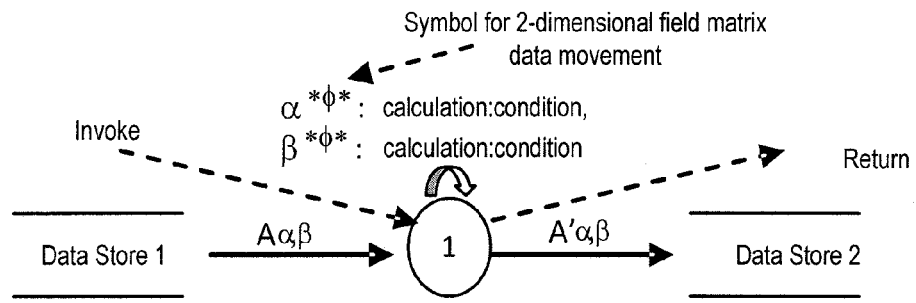
FIG. 61 shows an example of a 2-dimensional all-to-all exchange symbol—no stride, functional decomposition view.
Figure 62:
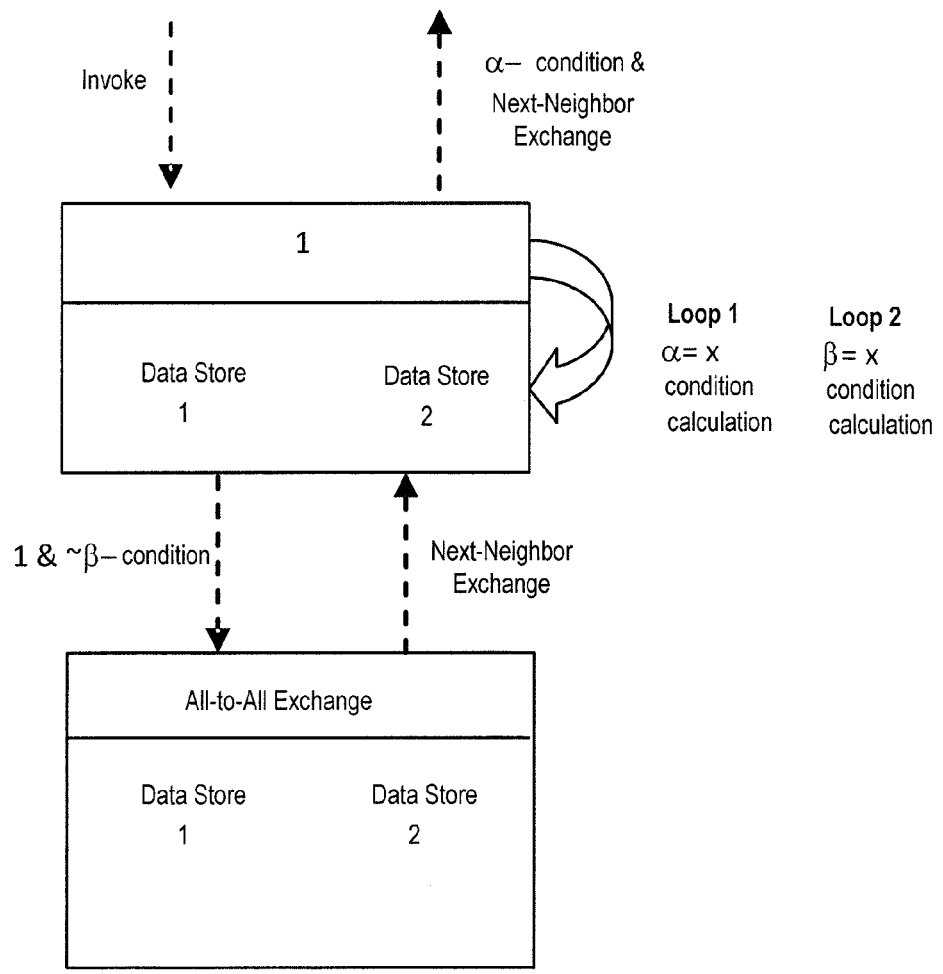
FIG. 62 shows an example of a 2-dimensional all-to-all exchange—no stride, finite state machine view.
Figure 63:
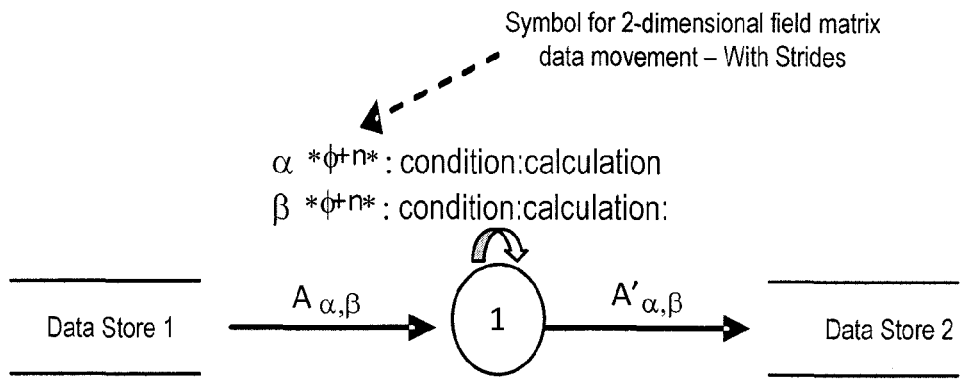
FIG. 63 shows an example of a 2-dimensional all-to-all exchange symbol—with stride, functional decomposition view.
Figure 64:
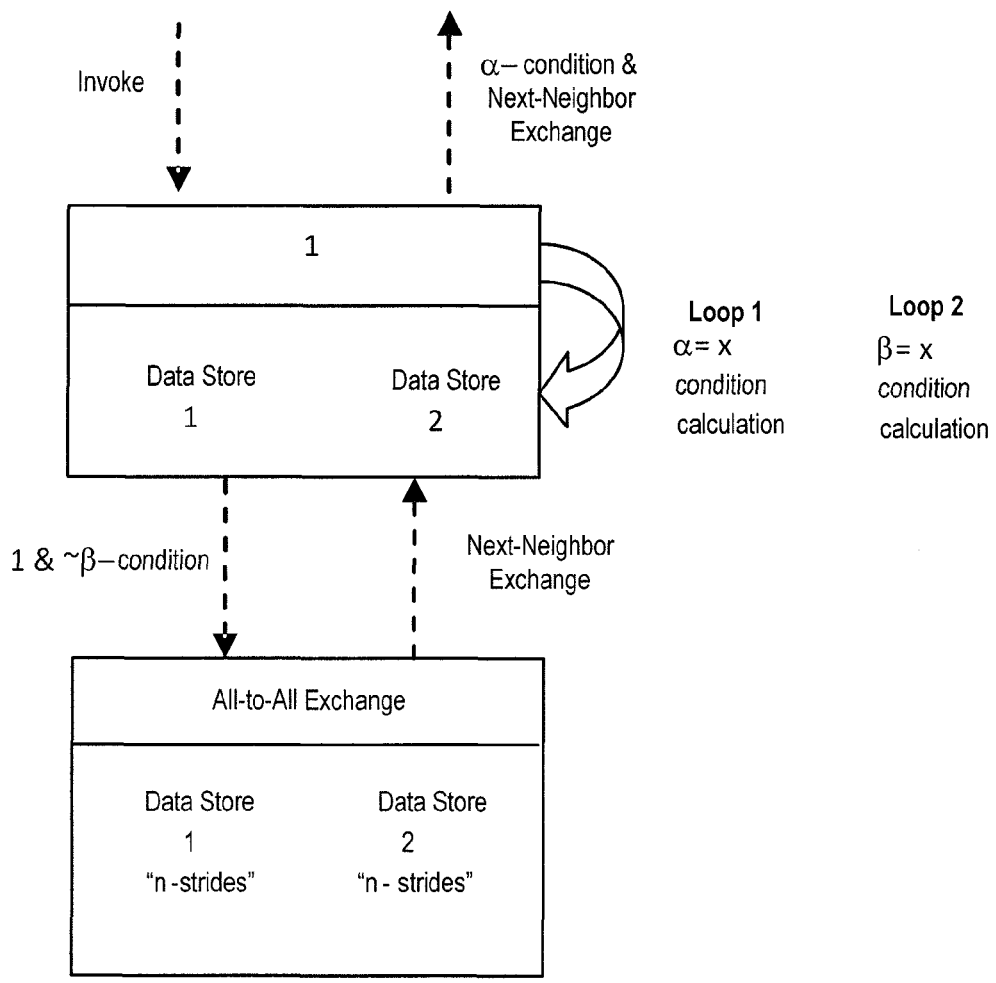
FIG. 64 shows an example of a 2-dimensional all-to-all—with stride, finite state machine view.

FIG. 61 shows a 2-dimensional all-to-all exchange symbol—no stride, in functional decomposition view; FIG. 62 shows a 2-dimensional all-to-all exchange—no stride, in finite state machine view; FIG. 63 shows a 2-dimensional all-to-all exchange symbol—with stride, in functional decomposition view figure; and FIG. 64 shows a 2-dimensional all-to-all—with stride, IN finite state machine view. If a two-dimensional matrix is used to depict fields then the symbol shown in FIG. 61 is used.

Figure 65:
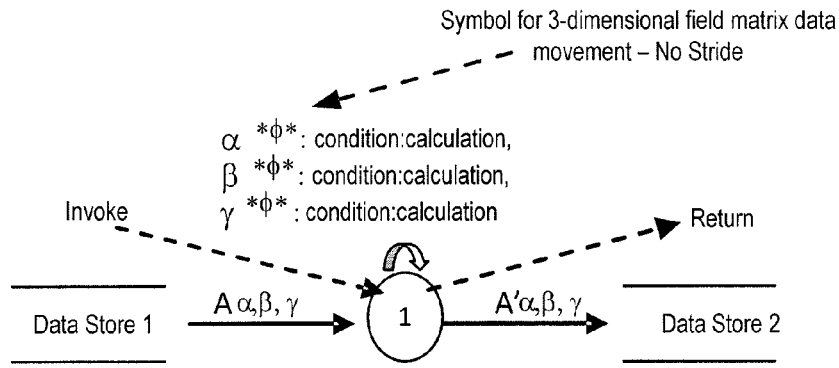
FIG. 65 shows an example of a 3-dimensional all-to-all exchange symbol—no stride, functional decomposition view.
Figure 66:
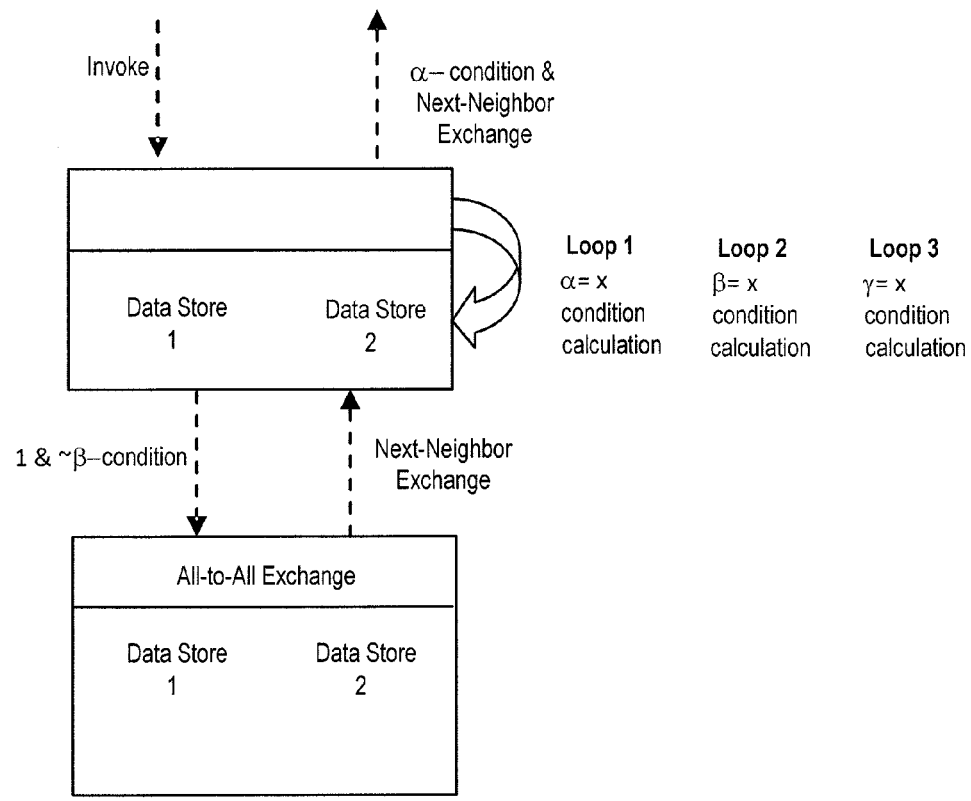
FIG. 66 shows an example of a 3-dimensional all-to-all exchange—no stride, finite state machine view.
Figure 67:
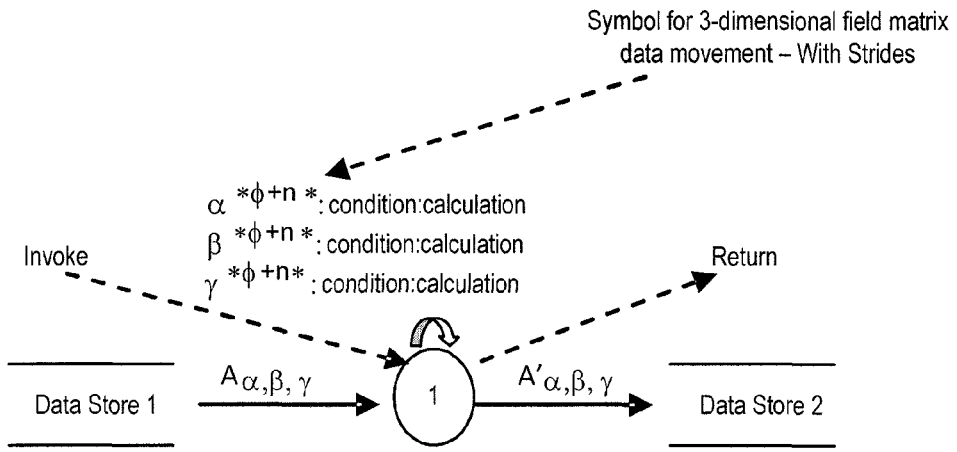
FIG. 67 shows an example of a 3-dimensional all-to-all exchange symbol—with stride, functional decomposition view.
Figure 68:
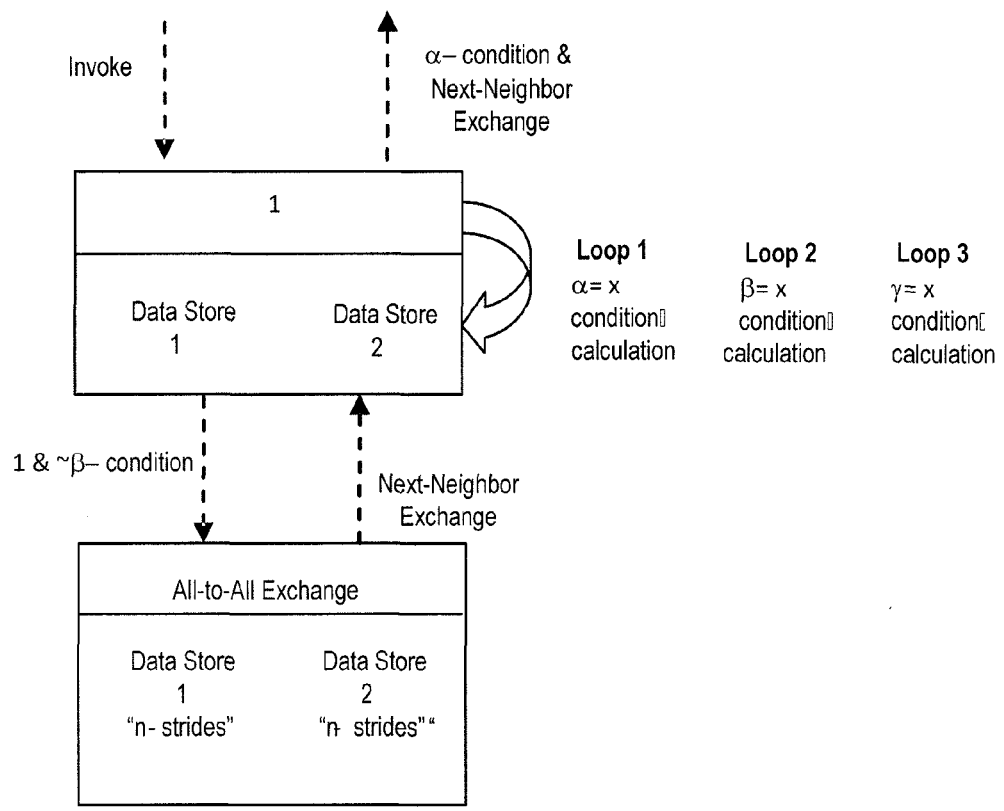
FIG. 68 shows an example of a 3-dimensional all-to-all exchange—with stride, finite state machine view.
Figure 69:
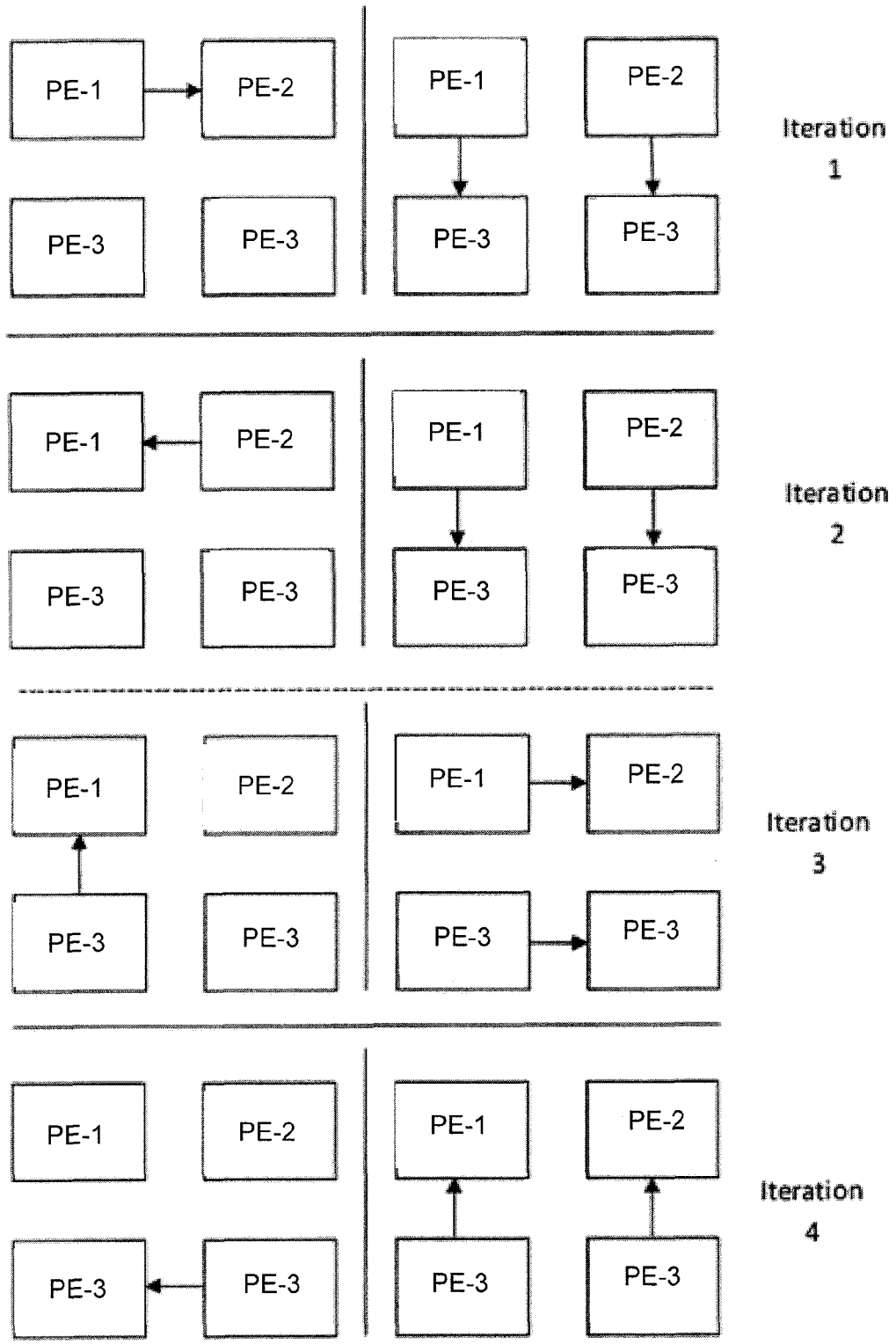
FIG. 69 is a diagram of a traditional all-to-all communication on a parallel computer system.

FIG. 65 shows a 3-dimensional all-to-all exchange symbol—no stride, in functional decomposition view; FIG. 66 shows a 3-dimensional all-to-all exchange—no stride, in finite state machine view; FIG. 67 shows a 3-dimensional all-to-all exchange symbol—with stride, in functional decomposition view; and FIG. 68 shows a 3-dimensional all-to-all exchange—with stride, in finite state machine view. If a three-dimensional matrix is used to depict fields then the symbol shown in FIG. 65 is used.

All-to-all Description

Parallel Processing System

Figure 71:
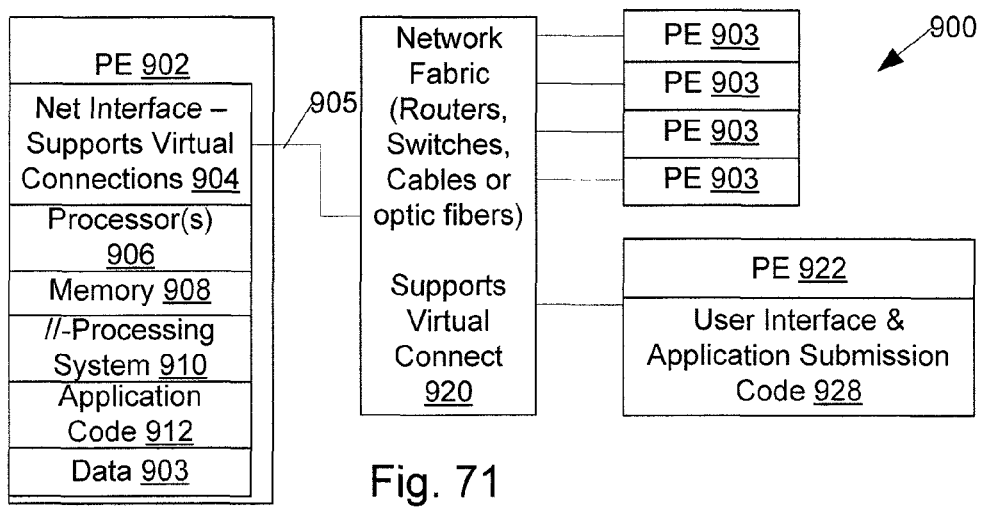
FIG. 71 is a system diagram showing an exemplary computing environment in which the present system may operate.

A network-based parallel-processing system is illustrated in FIG. 71, this system has two or more processing units 902, 903, 922 (PE). Each of the processing units has a network interface 904 that supports virtual connections, and in some embodiments may support frequency-division multiplexing, over a connection 905 to a network fabric 920 that supports virtual connectivity between processing units 902, 903, 922. Network fabric 220 includes physical connectivity elements such as cables or optical fibers, including connection 205, that couple it to each PE 902, 903, 922, and may also include one or more switches or routers as known in the art of computer networks.

Within each processing element 902, 903, 922, the network interface 904 is coupled to at least one processor 906, and, since high-speed communications typically involve direct-memory access, to a memory system 908. The memory system 908 is configured with sufficient portions of a parallel-processing operating system 910 to permit the processing element to process tasks designated for execution on that processing element, application code 912 sufficient to process at least one task designated for execution on that processing element, and is adapted to storing data 913 associated with both the operating system 910 and application code 912. At least one processing unit 922 is a portal processing element, the portal processing element is further configured with user interface and application program submission code 928 that permits assignment of tasks to other processing units 902, 903 of the system; and in embodiments, may or may not participate in processing tasks as well.

Howard all-to-all Exchange

Identifying when to use various communication models between processing units and tasks running on those processing units is traditionally critical in decreasing the number of communication steps required to execute a program on a parallel computer. However, when the maximum number of virtual connections between a given processing element 922 and other processing units of the system operating on tasks of the same application can be made to be equal or exceed the number of processing units involved as discussed above (called a Howard all-to-all exchange), then the number of communication steps is always one. A communication of this type is illustrated in FIG. 70, where each processing element 903 is able to communicate with every other processing element.

As long as the number of virtual channels equals or exceeds the number of communications that need to be exchanged, then it takes only one communication step from the software point of view, and messages need not be forwarded from through processing units to other processing units. Thus, it is better to use the virtual channel all-to-all exchange than other, existing, communication models. Since a primary reason for much of the complexity found in performing parallel processing is eliminated, parallel processing is more easily automated.

Figure 70:
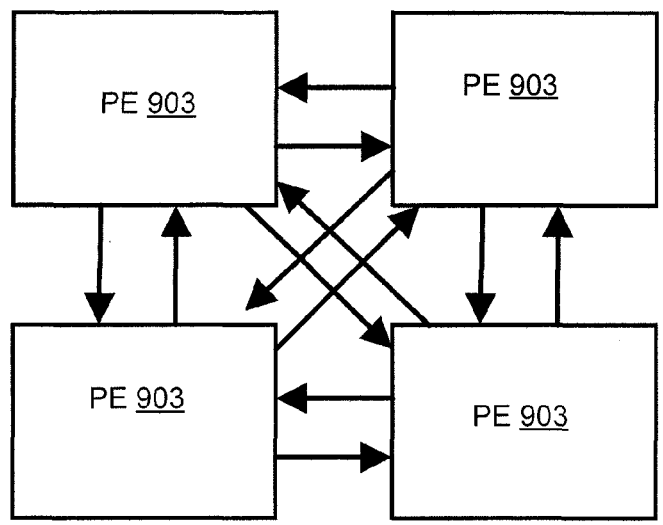
FIG. 70 illustrates a Howard all-to-all exchange, where a number of virtual channels are provided equal to the number of processors minus one.
Figure 72:
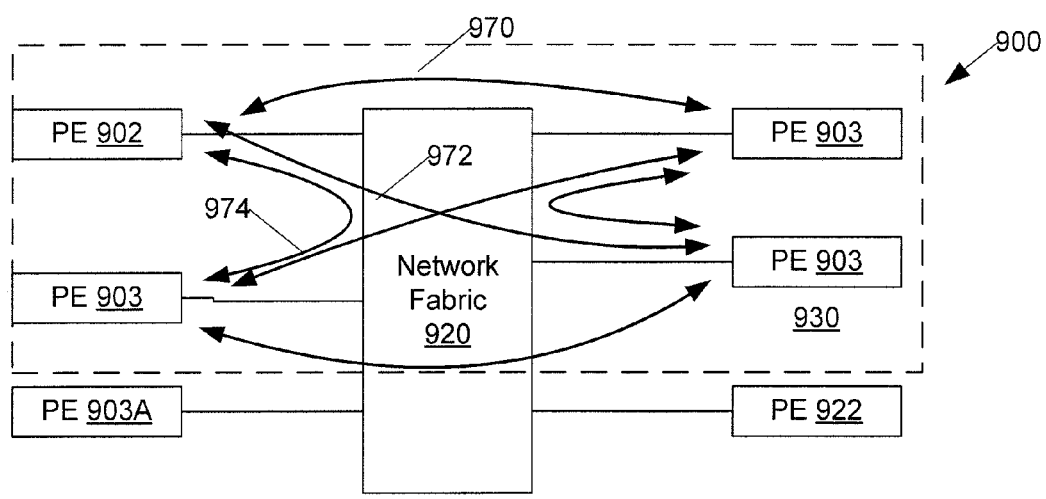
FIG. 72 is a system block diagram annotated to show the exchanges of a Howard all-to-all exchange among processing units executing a program.

The communication of FIG. 70 operates on the hardware of FIG. 71 as illustrated in FIG. 72, where communicating processing units 902, 903 participate in a Howard all-to-all exchange through virtual channels because they are the processing units 930 executing a program, but processing units 903A and 922—which are not executing tasks associated with that particular application program running on the system 900, are excluded from the all-to-all exchange.

The network interfaces 904 participating in the all-to-all exchange participate in verifying each transmission of the exchange with industry-standard techniques (loop-back verification, checksums, cyclic-redundancy checks, hash functions, error-correcting codes, etc.), including acknowledgment packets and retries when an error occurs.

In an embodiment, the network interface 904 of each processing element 902, 903, is coupled to at least one port of a network switch in the network fabric 920. Network fabric 920 may contain one or more such switches, as necessary, and as required by the system size. With high performance switches, this may enable the full bandwidth of the link between network interface 904 and the switch to be utilized for virtual channels 970, 972, 974 (FIG. 72) to other processing units FIG. 73 is a table illustrating data transfer intent in a first column 950, traditional communications operations in another column 952, and applicability of the Howard All-to-all exchange and gather-scatter operations in a third column 954.

Dataset Volume Reduction

Next, data that is to be sent during an all-to-all exchange is reviewed by each participating processing element to determine that portion of a full dataset that is of interest to each destination processing element. In an embodiment, this is done by the processing element, such as processing element 902, having updated data. In an alternative embodiment, the processing element having updated data breaks the exchange into two parts, a first part in which it asks each destination processing element, such as processing units 903, which portions of each updated data array it requires to enable further processing of its assigned task; each destination processing element then replies with its requirement. The processing element, such as element 902, in possession of updated data then transmits only those portions required by each destination processing element to that particular processing element.

The amount of data that is sent in each exchange of an all-to-all exchange is therefore reduced to the amount required by each specific task running on each processing element.

Automatic Determination of Howard all-to-all Exchanges

In the related application PARALLELISM FROM FUNCTIONAL DECOMPOSITION, a program design is entered as a functional description into a particular database, and decomposed to automatically provide a program structure. Individual portions, or tasks, of the program may then be coded to give a complete parallel-enabled program. In particular, FIGS. 41-68 of that application and associated text describe recognition from program structure of each communication type used by the program, and which are copied herein. Many of the communications referenced in text of that application with respect to FIGS. 41-68, including left-right exchanges, next-neighbor, and, of course, all-to-all exchanges, are performed by the system herein described with reference to FIGS. 69-73 using the Howard all-to-all exchange.

Effect of Howard all-to-all Exchange

Increasing the number of communication end-points without increasing the data transmission time is very important. The following tests were performed to verify the effect using the same 10-GigE communication channels.

1) Compare non-VLAN and VLAN single channel performance
2) Create multiple VLANs each with at least one IP address. This allows a single communication wire to decrease its bandwidth as a function of the number simultaneous VLANs.
3) Transmit different data across different VLANs starting from one transmission port and ending at multiple receiving ports.
4) Decrease the data size as transmitted to the receiving ports as a function of the number of receiving ports.
5) Perform ten transmissions of each dataset size and average the results.

TABLE 1

| Type | Dataset Size (MB) | Transmission Time in Milliseconds | | | | | | | | | | |
|---|---|---|---|---|---|---|---|---|---|---|---|---|
| | | Trial 1 | Trial 2 | Trial 3 | Trial 4 | Trial 5 | Trial 6 | Trial 7 | Trial 8 | Trial 9 | Trial 10 | Average |
| Non-VLAN 1 Receiver | 10 | 14 | 14 | 13 | 16 | 11 | 10 | 10 | 10 | 11 | 7 | 11.6 |
| | 20 | 22 | 25 | 19 | 23 | 24 | 22 | 22 | 23 | 23 | 26 | 22.9 |
| | 100 | 90 | 93 | 94 | 97 | 93 | 95 | 94 | 94 | 94 | 90 | 93.4 |
| | 1000 | 853 | 868 | 870 | 864 | 871 | 869 | 866 | 866 | 868 | 869 | 866.4 |
| VLAN 1 Receiver | 10 | 12 | 13 | 11 | 10 | 10 | 10 | 10 | 13 | 13 | 13 | 11.5 |
| | 20 | 21 | 24 | 23 | 22 | 22 | 18 | 26 | 19 | 20 | 23 | 21.8 |
| | 100 | 88 | 90 | 93 | 90 | 98 | 89 | 90 | 91 | 91 | 93 | 91.3 |
| | 1000 | 852 | 869 | 1074 | 1083 | 1413 | 1608 | 1316 | 1383 | 1079 | 1390 | 1206.7 |

As Table 1 above shows, with the exception of the 1-GB dataset, the timings of all other dataset sizes are similar for both the VLAN and non-VLAN data transmissions.

TABLE 2

SINGLE TRANSMITTER MULTIPLE VLAN RECEIVERS

| Type | Dataset Size (MB) | Transmission Time in Milliseconds | | | | | | | | | | |
|---|---|---|---|---|---|---|---|---|---|---|---|---|
| | | Trial 1 | Trial 2 | Trial 3 | Trial 4 | Trial 5 | Trial 6 | Trial 7 | Trial 8 | Trial 9 | Trial 10 | Average |
| VLAN 2 Receivers | 10 | 10 | 10 | 9 | 10 | 10 | 10 | 9 | 9 | 9 | 10 | 9.6 |
| | 20 | 18 | 18 | 18 | 18 | 18 | 18 | 18 | 18 | 18 | 18 | 18 |
| | 100 | 86 | 87 | 87 | 87 | 86 | 87 | 87 | 87 | 87 | 87 | 86.8 |
| | 1000 | 850 | 862 | 853 | 861 | 856 | 853 | 857 | 855 | 856 | 853 | 855.6 |
| VLAN 3 Receivers | 10 | 10 | 9 | 9 | 9 | 9 | 9 | 9 | 9 | 10 | 9 | 9.2 |
| | 20 | 18 | 18 | 18 | 18 | 18 | 18 | 18 | 19 | 19 | 19 | 18.3 |
| | 100 | 87 | 87 | 94 | 88 | 87 | 92 | 93 | 88 | 88 | 87 | 89.1 |
| | 1000 | 854 | 852 | 850 | 850 | 1007 | 856 | 859 | 1051 | 851 | 851 | 888.1 |

TABLE 2-continued

SINGLE TRANSMITTER MULTIPLE VLAN RECEIVERS

| | | Transmission Time in Milliseconds | | | | | | | | | | |
|---|---|---|---|---|---|---|---|---|---|---|---|---|
| Type | Dataset Size (MB) | Trial 1 | Trial 2 | Trial 3 | Trial 4 | Trial 5 | Trial 6 | Trial 7 | Trial 8 | Trial 9 | Trial 10 | Average |
| VLAN 4 Receivers | 10 | 9 | 9 | 9 | 9 | 9 | 9 | 9 | 9 | 9 | 9 | 9 |
| | 20 | 19 | 19 | 18 | 17 | 17 | 17 | 18 | 17 | 17 | 18 | 17.7 |
| | 100 | 85 | 87 | 86 | 86 | 86 | 86 | 86 | 87 | 86 | 87 | 86.2 |
| | 1000 | 1081 | 886 | 1039 | 932 | 859 | 975 | 848 | 888 | 983 | 933 | 942.4 |

As can be seen in Table 2, with the exception of the 1 GB (1000 MB) dataset size, all of the timings for multiple receivers are the same for a given initial dataset size, regardless of the number of receivers. This is as predicted.

Modified Decomposition

Figure 74:
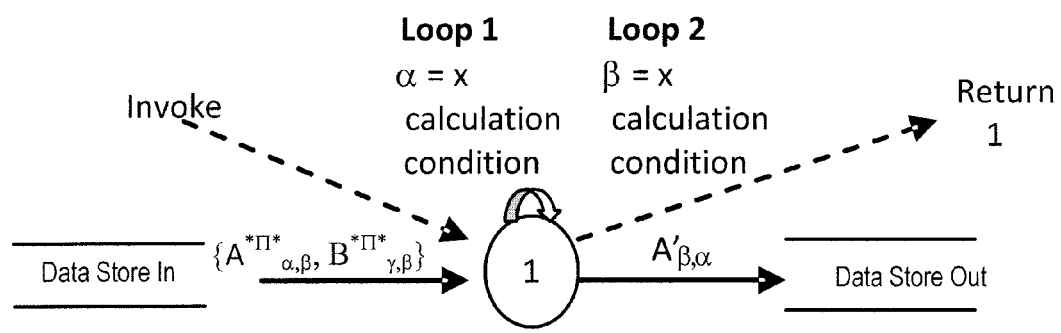
FIG. 74 an example of a decomposition of a loop extracted to standard form with an added parameter for indicating communications intent.

FIG. 28 illustrates the decomposition of a loop using an earlier version of Applicant's system. FIG. 74 illustrates a loop decomposed using an added symbol to the matrix label, an associated variable/vector/matrix indicating object-like intent.

Optimizing Parallelism

Many algorithms that have been parallelized produce substantially less throughput than N (the number of processing units) times the throughput provided by a single processing element. This is in part because of the overhead, including input-output, communications between processors, and coordination between processors.

Consider tasks running on a parallel processing computer where each task must transmit a large number of datasets in the course of processing their data. It has been thought that increasing the bandwidth of the system would decrease the time spent in communication. However, many of these problems show little decrease in communication time, even when communication channels have greatly increased their bandwidth. We consider a new model that decreases the total communication wall-clock time. Rather than increasing the communication channel bandwidth further, decreasing the communication channel bandwidth in the correct way can greatly decrease the overall communication time. All parallel processing communication models will be shown to be inefficient compared to the Howard all-to-all cross-communication model based upon this effect.

Transmission Wall-Clock Overhead

Splitting up a dataset creates overhead in many algorithms. A split dataset often requires transmitting the pieces to multiple processing units. Determining the time required for transmitting data requires considering transmission rate and physical latency. The transmission wall-clock time and latency wall-clock time can be masked, as shown in the following thought experiment.

Thought Experiment

Given a pipe containing some amount of a viscous fluid, there are only three conditions possible for the fluid in the pipe: less fluid than the pipe's capacity, exactly as much fluid as pipe capacity, and more fluid than pipe capacity. A force in the pipe that causes the fluid to move through the pipe, increasing the density of fluid is analogous to increasing the frequency of an electrical communication channel while increasing the pressure on the fluid (which decreases how long it takes to move the first bit of fluid to the other end of the pipe) is analogous to the physical latency of a communication channel.

The amount of wall-clock time it takes to move all of the fluid is given by:

$$o = f_t(d) + L_t$$

where "o"=the total wall-clock time required to move all of the data through and out of the pipe, $f_t(d)$=a function that calculates the wall-clock time used to move the fluid through the pipe minus the wall-clock time required to move the first bit of fluid to but not through the end of the pipe, and $L_t$=the wall-clock time required to move the first bit of fluid to but not through the end of the pipe.

If there is less fluid than pipe capacity then the total will-clock time is dominated by $L_t$; that is, $f_t(d) < L_t$. If there is enough fluid to fill the pipe then the $f_t(d) = L_t$. If there is more fluid than pipe capacity then $f_t(d) > L_t$.

Given multiple pipes of the capacity of the initial, single pipe, originating from the same source but terminating at different locations, the fluid is split among the pipes. Doubling the number of pipes has different effects on the fluid in the pipes. If the pipe is mainly empty then $L_t$ dominates, which means very little effect on "o". This same effect would take place if we doubled the density of the fluid or doubled the cross-sectional area of the pipe: that is, very little change in how long it takes to move the fluid through the pipe. Doubling the number of pipes, however, has a profound effect when there is enough fluid to fill one pipe. The performance increases by one-fourth. It increases only by one-fourth because with one pipe $f_t(d) = ½$ of the time and $L_t = ½$ of the time and $L_t$ is unaffected by the change. Thus $f_t(d)$ changes to one-fourth rather than one-half of the time, meaning the new time is three-fourths of the original time. The more fluid there is beyond that required to fill the pipe, the closer it comes to doubling the performance of the pipes when doubling the number of pipes.

Data Communication

The thought experiment can easily be applied to electrical data communication systems. The techniques that can be used to mask the physical latency wall-clock time, mask the data transmission wall-clock time, or both, differ for each of the three conditions. If the data is less than the channel capacity then physical latency dominates the wall-clock time; otherwise, the frequency dominates.

$f_t(d) < L_t$; Latency Dominated Model

For the case where the data is less than the channel capacity (latency bound), the wall-clock time represented by the movement of the data is only a percentage of the total wall-clock data transmission time "o". For example, if $f_t(d)$ represents one % of "o" then decreasing the channel capacity to one-half of its frequency represents only a one % increase in total wall-clock time. One processing element transmitting different data to multiple different processing elements safely can be performed in only one of three ways:

a) The data is transmitted first to one processing element followed by the next (standard serial method),
 b) The data is multicast simultaneously to all processing elements (parallel method), c) The physical-channel capacity is divided into multiple bandwidth-limited channels are used to simultaneously transmit to all processing elements.

It is now possible to show the effects of each of the above data-transmission methods. The wall-clock time for method "a" is given by:

EQUATION 3
WORST CASE SERIAL WALL CLOCK TIME $$o = n\left(f_t\left(\frac{d}{n}\right) + L_t + V_t\left(\frac{d}{n}\right)\right)$$

where $n$ = the number of pairs of processing elements + 1 in communication and $V_t(d)$ = the time required to verify the transmission

Note: worst case $V_t(d) = f_t(d) + L_t$

A complete transmission must end before the next one can begin; thus, the total wall-clock time multiplies the communication time by the number of pair-wise communications. The wall-clock time for method "b" is given by:
Worst Case Multicast Wall Clock Time $$o = f_t(d) + L_t + nV_t(d) \quad \text{EQUATION 4}$$

Multicast is usually portrayed as the fastest single-to-multiple processing element communication method. Notice that in a multicast, the full dataset is transmitted to all processing elements. A standard multicast is unsafe because the proper receipt of the data is not guaranteed unless a verification step is included. The wall-clock time for method "c" is given by:

EQUATION 5
WORST CASE HOWARD ALL-TO-ALL WALL CLOCK TIME $$o = f_t\left(\frac{d}{n}\right) + L_t + V_t\left(\frac{d}{n}\right);$$

Method "a", the standard method, multiplies the complete transmission wall-clock time by the number of processing-element pairs. Since data transmission is performed in a pair-wise fashion, each transmission can be verified with industry-standard techniques (loop-back verification, checksums, cyclic-redundancy checks, hash functions, error-correcting codes, etc), making this a safe transmission. However, method "a" can be very costly in terms of wall-clock time.

The wall-clock time for method "b" grows primarily as a function of the verification and the fact that the full dataset is transmitted to all other processing elements. This is much better than what occurs with method "a" but still does not give the best possible wall-clock time.

The wall-clock time for method "c" grows as a function of decreasing channel capacity, which can be balanced by simultaneously decreasing dataset size, through the use of virtual connections each carrying only the necessary data as with the Howard All-to-all exchange. That is, the wall-clock time can remain the same regardless of the number of processing elements in communication. The dataset size can be the size required by the algorithm, without the redundancy found with multicast. In addition, method "c" is performed in a pair-wise fashion and is considered a safe data transmission.

$f_t(d) = L_t$

If the data fills the communication channel to capacity then the signal propagation wall-clock time is equal to the latency wall-clock time. If the dataset is split for transmission to multiple processing elements, then the $f_t(d) < L_t$ rules apply. As long as the all communication channels are split evenly, the dataset size that occurs after the first split defines "d" for this case. Thus, if the first split is into four sections then the time it takes to transmit to eight sections is the same as the baseline four-section split.

$f_t(d) > L_t$ (Data Bound Model)

If the amount of data is greater than three times latency then the problem is considered is data bound. In data-bound problems, $f_t(d)$ dominates the wall-clock time. However, if the dataset is separable then there is always some number of processing elements across which the data can be split that will decrease the problem to a latency-bound problem, whose wall-clock time which is then manageable using the latency-bound model. Like the full-capacity model, selecting the baseline used to convert the data-bound problem to a latency-bound problem is important.

Reduction of Cross-Communication Models

The ability to safely communicate with multiple endpoints without incurring any additional data transfer costs means that many of the traditional communication models can be collapsed into a single model: the all-to-all exchange. Traditionally, the all-to-all communication exchange uses the binomial-tree multicast model illustrated in FIG. 69 and as discussed above Each processing element performs an iteration of the exchange. If "n" is the total number of processing elements then it takes "n log$_2$n" communication steps to complete. As can be seen, each communication step consists of a pair of processing elements in communication. Other communication models take fewer communication steps; for example, a true multicast all-to-all exchange takes "n" communication steps, a 2-D next-neighbor exchanges take eight communication steps, left-right up-down exchanges take four communication steps, and left-right exchange takes two communication steps. Identifying when to use various communication models is traditionally critical in decreasing the number of communication steps. However, when $f_t(d)$ can be made to be less than $L_t$ as discussed above (called a Howard all-to-all exchange), then the number of communication steps is always one.

Automated Latency Management

In addition to extracting potential parallelism by decomposing the program structure as heretofore described, and using the Howard all-to-all exchange where all-to-all, left-right (with and without stride), and next-neighbors (with and without stride) exchanges are found in program structure, it is desirable to determine how much physical latency is in the system, and to determine how much parallelism can be exploited before reaching diminishing returns.

In an embodiment, a parallelizable loop is identified by program decomposition as heretofore described. A latency is determined, T(1), for execution of this loop by a single processing unit. A second latency, T(2) is determined for execution of the same loop parallelized into two simultaneously-executing processing units, with one virtual channel used to communicate between the processing units. A third latency, T(3) is determined for execution of this loop by four simultaneously executing processing units, with three virtual channels utilized for communications between each processing unit and the remaining processing units executing the loop, in a manner resembling the virtual channels of 970, 972, 974 of FIG. 72. In an embodiment, the communications time component of the latency is estimated by interpolation into a two-dimensional table giving communications time for particular predetermined sizes of the data to be communicated versus number of connections at each processor performing the all-to-all exchange. The interpolated performance is used to determine the estimate.

An equation is then automatically derived for T(n), the wall-clock latency time of loop execution when the loop is divided among n processors, from latencies T(1), T(2), and T(3).

The equation T(n) is derived from Equation 5 above for latencies T(1), T(2), and T(3), the parameters Lt, Vt being fitted to T(1), T(2), and T(3).

$$: T(n) = o = f_t\left(\frac{d}{n}\right) + L_t + V_t\left(\frac{d}{n}\right) \qquad \text{EQUATION 6}$$

Where $f_t$ is a function describing the time it takes to move the dataset (derived from the table interpolation as described above), $L_t$ is the computation time, and $V_t$ is a function describing time for verification of the data movement.

Since, for some parallelizable processes there can be a point where execution time increases with increasing number of processors, the equation T(n) is then evaluated to determine a minimum T(n), and a number of processors a are assigned to perform tasks associated with executing the loop that is either associated with the n of the minimum T(n) or the maximum number of available processors, whichever is less.

In an embodiment, equations T(n)(m) are derived for each of m loops, each loop derived from functional decomposition as heretofore described, where each of the m loops is capable of being executed simultaneously.

The equations T(n)(m) are then evaluated to determine a minimum T(n) for each of the m loops, and a number of processors a(m) are assigned to perform tasks associated with executing each loop that is within the size of the system and optimizes performance.

Combinations

The system and method herein described may be executed with various combinations of communications types assigned to particular processors and tasks, and may execute of various combinations of hardware. Among anticipated systems and methods are the following:

A method designated A of communication in a multiple processor computing system, the system including multiple processing units, each processing unit including at least one processor, a memory, and a network interface, the network interface adapted to support virtual connections between the processing units, the memory configured to contain at least a portion of a parallel processing application program and at least a portion of a parallel processing operating system, and a network fabric coupled to each processing unit. The method operating on the system includes identifying a need for communication by the parallel processing application program executing on a first processing unit with a second multiple of the processing units, creating a virtual connection between the first processing unit with each processing unit of the second multiple of processing units, and transferring data between the first processing unit and each processing unit of the second multiple of processing units.

A method designated AA including the method designated A further including automatically determining a number of processing units to assign to a task associated with the communication.

A method designated AB including the method designated A wherein the identifying a need for communication is performed by a computer performing functional decomposition of a software design to generate a computer-executable finite state machine, the performing functional decomposition including decomposing functions in the software design into data transformations and control transformations repetitively until each of the decomposed data transformations consists of a respective linear code block; wherein the data transformations accept and generate data, and the control transformations evaluate conditions and send and receive control indications to and from associated instances of the data transformations; converting the software design to a graphical diagram including a plurality of graphical symbols interconnected to hierarchically represent the data transformations and the control transformations in the software design.

A method designated AC including the method designated AB further including automatically determining a number of processing units to assign to a task associated with the communication.

A method designated AD wherein the step of automatically determining a number of processing units to assign to a task comprises determining a first and a second dataset size for the communication associated with a first and a second number of processors, and using a table interpolation to determine a first and a second communications time, the first communications time associated with the first dataset size and first number of processors, and the second communications time associated with the second dataset size and the second number of processors.

A method designated AE wherein the step of identifying a need for communication is performed by performing functional decomposition of a software design to generate a computer-executable finite state machine, the performing functional decomposition performed by a computer and including decomposing functions in the software design into data transformations and control transformations repetitively until each of the decomposed data transformations consists of a respective linear code block; wherein the data transformations accept and generate data, and the control transformations evaluate conditions and send and receive control indications to and from associated instances of the data transformations; configuring an automatically-determined number of the plurality of processing units to execute a task of the functionally-decomposed software design and executing the communication on an automatically-determined number of processing units of the plurality of processing units executing the task associated with the communication.

A method designated AF including the method designated A, AA, AB, AC, AD, or AE wherein automatically determining a number of processing units to execute a task comprises determining a first and a second dataset size for the communication associated with a first and a second number of processors, and using a table interpolation to determine a first and a second communications time, the first communications time associated with the first dataset size and first number of processors, and the second communications time associated with the second dataset size and the second number of processors.

A method designated AG including the method designated A, AA, AB, AC, AD, AE, or AF, wherein, for at least some of the communications, an all-to-all communication is performed over the virtual connection between the first processing unit and each processing unit of the second plurality of processing units, the first processing unit and second plurality of processing units comprising the processing units executing the task.

A multiple processor computing system designated B, the system including multiple processing units, each processing unit including at least one processor, a memory, and a network interface, the network interface adapted to support virtual connections, the memory configured to contain at least a portion of a parallel processing application program and at least a portion of a parallel processing operating system, and a network fabric coupled to each processing unit. The network fabric is a fabric adapted to support virtual connections between units of the plurality of processing units. The memory of the processing units is configured to contain machine readable code for creating a virtual connection between the first processing unit with each processing unit of the second plurality of processing units, and machine readable instructions in the memory of the processing units for performing an all-to-all communication over the virtual connection between the first processing unit and each processing unit of the second plurality of processing units, the all-to-all communication comprising transferring data between the first processing unit and each processing unit of the second plurality of processing units; wherein the system is configured to automatically determine a number of processing units to assign to a task associated with the communication, the units assigned to the task comprising the first processing unit and the second plurality of processing units; and wherein the number of processing units assigned to the task is less than a total number of processing units of the system.

A system designated BA including the system designated B, wherein the system is configured to automatically determine a number of processing units to assign to a task by executing machine readable code comprising code for determining a first and a second dataset size for the communication associated with a first and a second number of processors, and using a table interpolation to determine a first and a second communications time, the first communications time associated with the first dataset size and first number of processors, and the second communications time associated with the second dataset size and the second number of processors.

Certain changes may be made in the above methods and systems without departing from the scope of that which is described herein. It is to be noted that all matter contained in the above description or shown in the accompanying drawings is to be interpreted as illustrative and not in a limiting sense. The elements and steps shown in the present drawings may be modified in accordance with the methods described herein, and the steps shown therein may be sequenced in other configurations without departing from the spirit of the system thus described. The following claims are intended to cover all generic and specific features described herein, as well as all statements of the scope of the present method, system and structure, which, as a matter of language, might be said to fall therebetween.

What is claimed is:

1. A method of communication in a multiple processor computing system, the system comprising:
    a plurality of processing units, each processing unit including at least one processor, a memory, and a network interface, the network interface adapted to support virtual connections, the memory configured to contain at least a portion of a parallel processing application program and at least a portion of a parallel processing operating system, and
    a network fabric coupled to each processing unit;
    the method comprising:
    identifying a need for communication by the parallel processing application program executing on a first processing unit of the plurality of processing units with a second plurality of the plurality of processing units,
    creating a virtual connection between the first processing unit with each processing unit of the second plurality of processing units,
    transferring data between the first processing unit and each processing unit of the second plurality of processing units;
    wherein the step of identifying a need for communication is performed by performing functional decomposition of a software design to generate a computer-executable finite state machine, the performing functional decomposition performed by a computer and comprising:
    decomposing functions in the software design into data transformations and control transformations repetitively until each of the decomposed data transformations consists of a respective linear code block;
    wherein the data transformations accept and generate data, and the control transformations evaluate conditions and send and receive control indications to and from associated instances of the data transformations;
    wherein the step of automatically determining a number of processing units to assign to a task comprises determining a first and a second dataset size for the communication associated with a first and a second number of processors, and using a table interpolation to determine a first and a second communications time, the first communications time associated with the first dataset size and first number of processors, and the second communications time associated with the second dataset size and the second number of processors.

2. A method of communication in a multiple processor computing system, the system comprising:
    a plurality of processing units, each processing unit including at least one processor, a memory, and a network interface, the network interface adapted to support virtual connections, the memory configured to contain at least a portion of a parallel processing application program and at least a portion of a parallel processing operating system, and
    a network fabric coupled to each processing unit;
    the method comprising:
    identifying a need for communication by the parallel processing application program executing on a first processing unit of the plurality of processing units with a second plurality of the plurality of processing units,
    creating a virtual connection between the first processing unit with each processing unit of the second plurality of processing units,
    transferring data between the first processing unit and each processing unit of the second plurality of processing units;
    wherein the step of identifying a need for communication is performed by performing functional decomposition of a software design to generate a computer-executable finite state machine, the performing functional decomposition performed by a computer and comprising:
    decomposing functions in the software design into data transformations and control transformations repetitively until each of the decomposed data transformations consists of a respective linear code block; wherein the data transformations accept and generate data, and the control transformations evaluate conditions and send and receive control indications to and from associated instances of the data transformations;
    configuring an automatically-determined number of the plurality of processing units to execute a task of the functionally-decomposed software design and executing the communication on an automatically-determined number of processing units of the plurality of processing units executing the task associated with the communication;

wherein automatically determining a number of processing units to execute a task comprises determining a first and a second dataset size for the communication associated with a first and a second number of processors, and using a table interpolation to determine a first and a second communications time, the first communications time associated with the first dataset size and first number of processors, and the second communications time associated with the second dataset size and the second number of processors.

3. A multiple processor computing system, the system comprising:

a plurality of processing units, each processing unit including at least one processor, a memory, and a network interface, the network interface adapted to support virtual connections, the memory configured to contain at least a portion of a parallel processing application program and at least a portion of a parallel processing operating system, and a network fabric coupled to each processing unit;

the network fabric adapted to support virtual connections between units of the plurality of processing the memory of the processing units comprising machine readable code for creating a virtual connection between the first processing unit with each processing unit of the second plurality of processing units, the system further comprising machine readable instructions in the memory of the processing units for performing an all-to-all communication over the virtual connection between the first processing unit and each processing unit of the second plurality of processing units, the all-to-all communication comprising transferring data between the first processing unit and each processing unit of the second plurality of processing units;

wherein the system is configured to automatically determine a number of processing units to assign to a task associated with the communication, the units assigned to the task comprising the first processing unit and the second plurality of processing units; and wherein the number of processing units assigned to the task is less than a total number of processing units of the system; and wherein the system is configured to automatically determine a number of processing units to assign to a task by executing machine readable code comprising code for determining a first and a second dataset size for the communication associated with a first and a second number of processors, and using a table interpolation to determine a first and a second communications time, the first communications time associated with the first dataset size and first number of processors, and the second communications time associated with the second dataset size and the second number of processors.

* * * * *